US011061326B2

(12) United States Patent
Kawaue et al.

(10) Patent No.: US 11,061,326 B2
(45) Date of Patent: Jul. 13, 2021

(54) CHEMICAL AMPLIFICATION TYPE POSITIVE PHOTOSENSITIVE RESIN COMPOSITION, A PHOTOSENSITIVE DRY FILM, A METHOD FOR PRODUCING A PHOTOSENSITIVE DRY FILM, A METHOD FOR PRODUCING A PATTERNED RESIST FILM, A METHOD OF MANUFACTURING A TEMPLATE WITH A SUBSTRATE, AND A METHOD OF MANUFACTURING A PLATED SHAPED PRODUCT, AND A MERCAPTO COMPOUND

(71) Applicant: TOKYO OHKA KOGYO CO., LTD., Kawasaki (JP)

(72) Inventors: Akiya Kawaue, Kawasaki (JP); Yasushi Kuroiwa, Kawasaki (JP); Shota Katayama, Kawasaki (JP); Kazuaki Ebisawa, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 167 days.

(21) Appl. No.: 16/136,786

(22) Filed: Sep. 20, 2018

(65) Prior Publication Data

US 2019/0101825 A1 Apr. 4, 2019

(30) Foreign Application Priority Data

Sep. 29, 2017 (JP) ............................ JP2017-191919
Sep. 29, 2017 (JP) ............................ JP2017-191920
Sep. 29, 2017 (JP) ............................ JP2017-191921

(51) Int. Cl.
*G03F 7/004* (2006.01)
*C08G 75/04* (2016.01)
(Continued)

(52) U.S. Cl.
CPC ........... *G03F 7/0045* (2013.01); *C08G 75/04* (2013.01); *C08G 75/14* (2013.01); *G03F 7/0392* (2013.01);
(Continued)

(58) Field of Classification Search
CPC ..................................................... G03F 7/0045
See application file for complete search history.

(56) References Cited

U.S. PATENT DOCUMENTS

2008/0085464 A1 * 4/2008 Shibuya ................ G03F 7/0397 430/270.1

FOREIGN PATENT DOCUMENTS

JP H09-176112 7/1997
JP H11-052562 2/1999
JP 2004250377 A * 9/2004

OTHER PUBLICATIONS

English translation of JP2004250377. (Year: 2004).*

* cited by examiner

*Primary Examiner* — Cynthia H Kelly
*Assistant Examiner* — Anna Malloy
(74) *Attorney, Agent, or Firm* — Knobbe Martens Olson & Bear LLP

(57) ABSTRACT

A chemically amplified positive-type photosensitive resin composition capable of suppressing the occurrence of "footing" in which the width of the bottom (the side proximal to the surface of a support) becomes narrower than the top (the side proximal to the surface of a resist layer) in the nonresist portion when a resist pattern serving as a template for a plated article is formed on a metal surface of a substrate having a metal surface using the composition. A mercapto compound having the formula (C) shown below is added to the composition and includes an acid generator which gen-
(Continued)

erates acid upon exposure to an irradiated active ray or radiation and a resin the solubility of which in alkali increases under the action of acid:
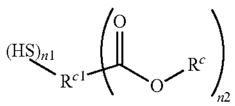
(C)
wherein n1, n2, $R^{c1}$, and $R^{c}$ are defined in claim 1.
12 Claims, 1 Drawing Sheet
(51) Int. Cl.
| | |
|---|---|
| ***G03F 7/20*** | (2006.01) |
| ***G03F 7/039*** | (2006.01) |
| ***G03F 7/085*** | (2006.01) |
| ***C08G 75/14*** | (2006.01) |
(52) U.S. Cl.
CPC ........... *G03F 7/0397* (2013.01); *G03F 7/085* (2013.01); *G03F 7/2039* (2013.01)

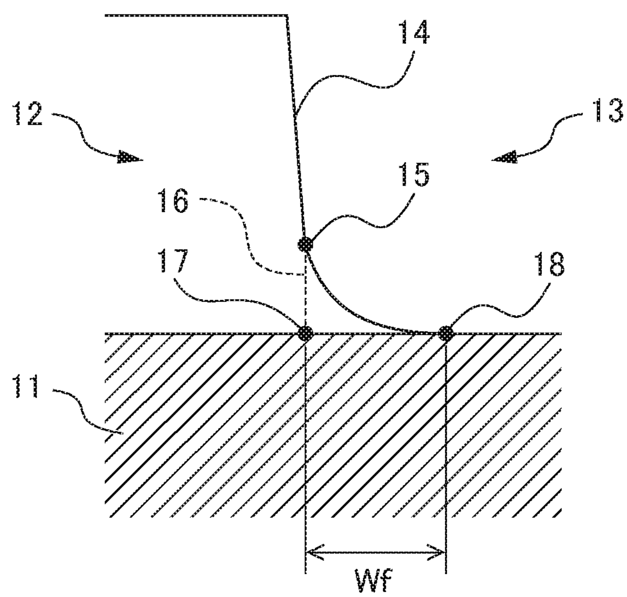
14
12
13
15
16
17
18
11
Wf

CHEMICAL AMPLIFICATION TYPE POSITIVE PHOTOSENSITIVE RESIN COMPOSITION, A PHOTOSENSITIVE DRY FILM, A METHOD FOR PRODUCING A PHOTOSENSITIVE DRY FILM, A METHOD FOR PRODUCING A PATTERNED RESIST FILM, A METHOD OF MANUFACTURING A TEMPLATE WITH A SUBSTRATE, AND A METHOD OF MANUFACTURING A PLATED SHAPED PRODUCT, AND A MERCAPTO COMPOUND

RELATED APPLICATIONS

This application claims priority to Japanese Patent Application Nos. 2017-191919, 2017-191920 and 2017-191921, all filed Sep. 29, 2017, the entire contents of which are incorporated herein by reference.

BACKGROUND OF THE INVENTION

Field of the Invention

The present invention relates to a chemically amplified positive-type photosensitive resin composition, a photosensitive dry film having a photosensitive resin layer formed by the chemically amplified positive-type photosensitive resin composition, a method of manufacturing the photosensitive dry film, a method of manufacturing a patterned resist film using the above-mentioned chemically amplified positive-type photosensitive resin composition, a method of manufacturing a substrate with a template using the above-mentioned chemically amplified positive-type photosensitive resin composition, and a method of manufacturing a plated article using the substrate with a template.

Related Art

Photofabrication is now the mainstream of a microfabrication technique. Photofabrication is a generic term describing the technology used for manufacturing a wide variety of precision components such as semiconductor packages. The manufacturing is carried out by applying a photoresist composition to the surface of a processing target to form a photoresist layer, patterning this photoresist layer using photolithographic techniques, and then conducting chemical etching, electrolytic etching, or electroforming based mainly on electroplating, using the patterned photoresist layer (photoresist pattern) as a mask.

In recent years, high density packaging technologies have progressed in semiconductor packages along with downsizing electronics devices, and the increase in package density has been developed on the basis of mounting multi-pin thin film in packages, miniaturizing of package size, two-dimensional packaging technologies in flip-tip systems or three-dimensional packaging technologies. In these types of high density packaging techniques, connection terminals, for example, protruding electrodes (mounting terminals) known as bumps that protrude above the package or metal posts that extend from peripheral terminals on the wafer and connect rewiring with the mounting terminals, are disposed on the surface of the substrate with high precision.

In the photofabrication as described above, a photoresist composition is used, and chemically amplified photoresist compositions containing an acid generator have been known as such a photoresist composition (see Patent Documents 1, 2 and the like.). According to the chemically amplified photoresist composition, an acid is generated from the acid generator upon irradiation with radiation (exposure) and diffusion of the acid is promoted through heat treatment, to cause an acid catalytic reaction with a base resin and the like in the composition resulting in a change to the alkali-solubility of the same.

Such chemically amplified positive-type photoresist compositions are used, for example, in formation of plated articles such as bumps and metal posts by a plating step. Specifically, a photoresist layer having a desired film thickness is formed on a support such as a metal substrate using a chemically amplified photoresist composition, and the photoresist layer is exposed through a predetermined mask pattern and is developed. Thereby, a photoresist pattern used as a template in which portions for forming bumps or metal posts have been selectively removed (stripped) is formed. Then, bumps or metal posts can be formed by embedding a conductor such as copper into the removed portions (nonresist portions) using plating, and then removing the surrounding photoresist pattern.

Patent Document 1: Japanese Unexamined Patent Application, Publication No. H09-176112

Patent Document 2: Japanese Unexamined Patent Application, Publication No. H11-52562

SUMMARY OF THE INVENTION

In formation of connection terminals such as bumps or metal posts by plating step mentioned above, with respect to the nonresist portion of the resist pattern as a template, width of the bottom (surface side of the support) is desired to be larger than width of the top (front surface side of the resist layer). Thus, the contact area between the bottom surface of the connection terminals such as bumps or metal posts and the support is increased, and thereby adhesiveness between the connection terminals and the support is improved.

However, in a case where a resist pattern serving as a template for forming a bump, a metal post, and the like, is formed on a metal substrate with a conventionally known chemically amplified positive-type photoresist composition as disclosed in Patent Documents 1, 2 and the like, a phenomenon called “footing” tends to occur in which the width of the bottom becomes narrower than that of the top in a nonresist portion due to protrusion of a resist portion toward the nonresist portion at the contacting surface between the substrate surface and the resist pattern. For this reason, in a case where a conventionally known chemically amplified positive-type photoresist composition as disclosed in Patent Documents 1, 2 and the like is used, it is difficult to form a resist pattern having a nonresist portion in which the width of the bottom is wider than that of the top on a metal substrate.

The present invention has been made in view of the above problem. An object of the present invention is to provide a chemically amplified positive-type photosensitive resin composition capable of suppressing the occurrence of “footing” in which the width of the bottom (the side proximate to the surface of a support) becomes narrower than that of the top (the side proximate to the surface of a resist layer) in the nonresist portion when a resist pattern serving as a template for a plated article is formed on a metal surface of a substrate having a metal surface by using the chemically amplified positive-type photosensitive resin composition; a photosensitive dry film having a photosensitive resin layer including the chemically amplified positive-type photosensitive resin; a method of manufacturing the photosensitive dry film; a method of manufacturing a patterned resist film using the above-mentioned chemically amplified positive-type photosensitive resin composition; a method of manufacturing a substrate with a template using the above-mentioned photosensitive resin; and a method of manufacturing a plated article using the substrate with a template.

After conducting extensive studies in order to achieve the above objects, the present inventors have found that the above problem can be solved by including a mercapto compound with a specific structure in a chemically amplified positive-type photosensitive resin composition, and have completed the present invention. Specifically, the present invention provides the following.

A first aspect of the present invention is a chemically amplified positive-type photosensitive resin composition comprising an acid generator (A) which generates acid upon exposure to an irradiated active ray or radiation, a resin (B) the solubility of which in alkali increases under the action of acid, and a mercapto compound (C) represented by the following formula (C):

(C)

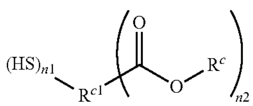

In the formula (C), n1 is an integer of 1 or more and 4 or less, n2 is an integer of 1 or more and 4 or less, $R^{c1}$ is an organic group having a valence of (n1+n2) and the $R^{c1}$ is bonded to a carbonyl group by a C—C bond, and bonded to a mercapto group by a C—S bond, and $R^c$ is a monovalent organic group bonded to an oxygen atom by a C—O bond, and having any one of structures represented by the following formulae (c1) to (c4):

(c1)

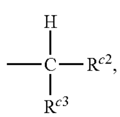

(c2)

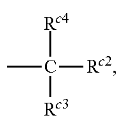

(c3)

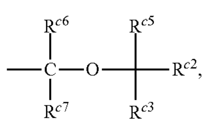

(c4)

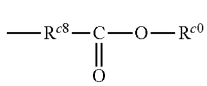

in the group represented by the above-mentioned formula (c1), $R^{c2}$ and $R^{c3}$ are each independently a hydrogen atom or a monovalent organic group, in a proviso that at least one of $R^{c2}$ and $R^{c3}$ is a monovalent organic group having an aliphatic ring CL including a divalent group represented by —CO—O— in the ring structure, or a monovalent organic group having an aliphatic ring CS including a divalent group represented by $—SO_2—$ in the ring structure, or a monovalent organic group having an aliphatic ring CP including a trivalent group represented by the following formula in the ring structure:

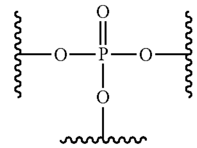

or $R^{c2}$ and $R^{c3}$ are bonded to each other to form an aliphatic ring CL, an aliphatic ring CS, or an aliphatic ring CP;

in the group represented by the above formula (c2), $R^{c2}$ and $R^{c3}$ are each independently a hydrogen atom or a monovalent organic group, $R^{c4}$ is a hydrocarbon group, a carbon atom to which $R^{c2}$, $R^{c3}$ and $R^{c4}$ are bonded is a tertiary carbon atom, and $R^3$ and $R^4$ may be bonded to each other to form a ring, in a proviso that at least one of $R^{c2}$ and $R^{c3}$ is a monovalent organic group having an aliphatic ring CA including one or more divalent groups selected from a group consisting of an ether bond, a sulfide bond, and a carbonyl group in the ring structure, a monovalent organic group having an aliphatic ring CH substituted with a hydroxyl group or a hydroxyl group-containing group, a monovalent organic group having an aliphatic ring CL mentioned above as to the formula (c1), a monovalent organic group having an aliphatic ring CS mentioned above as to the formula (c1), or a monovalent organic group having an aliphatic ring CP mentioned above as to the formula (c1), or $R^{c2}$ and $R^{c3}$ are bonded to each other to form an aliphatic ring CA, an aliphatic ring CH, an aliphatic ring CL, an aliphatic ring CS, or an aliphatic ring CP;

in the group represented by the above formula (c3), $R^{c2}$ and $R^{c3}$ are the same as $R^{c2}$ and $R^{c3}$ in the above formula (c2), $R^{c5}$, $R^{c6}$, and $R^{c7}$ are each independently a hydrogen atom, or an alkyl group, and $R^{c5}$ and $R^{c6}$ may be bonded to each other to form a ring, in a proviso that at least one of $R^{c2}$ and $R^{c3}$ is a monovalent organic group having an aliphatic ring CA, a monovalent organic group having an aliphatic ring CH, a monovalent organic group having an aliphatic ring CL, a monovalent organic group having an aliphatic ring CS, or a monovalent organic group having an aliphatic ring CP, or $R^{c2}$ and $R^{c3}$ are bonded to each other to form an aliphatic ring CA, an aliphatic ring CH, an aliphatic ring CL, an aliphatic ring CS, or an aliphatic ring CP;

in the group represented by the above formula (c4), $R^{c8}$ is a divalent organic group, and $R^{c8}$ is bonded to a carbonyl group by a C—C bond, and is bonded to an oxygen atom by a C—O bond, and $R^{c0}$ is an acid dissociable group.

The chemically amplified positive-type photosensitive resin composition according to the first aspect of the present invention includes a chemically amplified positive-type photosensitive resin composition including an acid generator (A) which generates acid upon exposure to an irradiated active ray or radiation, a resin (B) the solubility of which in alkali increases under the action of acid, and a mercapto compound (C) represented by the following formula (C1):

(C1)

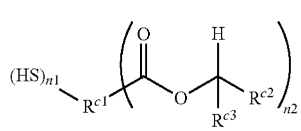

In the formula (C1), $R^{c1}$ is an organic group having a valence of (n1+n2), and the $R^{c1}$ is bonded to a carbonyl group by a C—C bond, and bonded to a mercapto group by a C—S bond, $R^{c2}$ and $R^{c3}$ are each independently a hydrogen atom or a monovalent organic group, n1 is an integer of 1 or more and 4 or less, and n2 is an integer of 1 or more and 4 or less, in a proviso that at least one of $R^{c2}$ and $R^{c3}$ is a monovalent organic group having an aliphatic ring CL including a divalent group represented by —CO—O— in a ring structure, a monovalent organic group having an aliphatic ring CS including a divalent group represented by —$SO_2$— in a ring structure, or a monovalent organic group having an aliphatic ring CP including a trivalent group represented by the following formula in the ring structure:

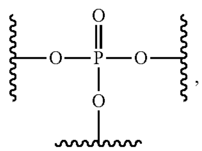 [SMILES: *OP(=O)(O*)O*]

or $R^{c2}$ and $R^{c3}$ are bonded to each other to form an aliphatic ring CL, an aliphatic ring CS, or an aliphatic ring CP.

The chemically amplified positive-type photosensitive resin composition according to the first aspect of the present invention includes a chemically amplified positive-type photosensitive resin composition including an acid generator (A) which generates acid upon explosure to irradiated active ray or radiation, a resin (B) the solubility of which in alkali increases under the action of acid, and a mercapto compound (C) represented by the following formula (C2):

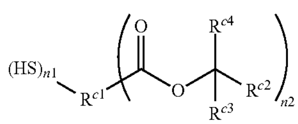

(C2)

(in the formula (C2), $R^{c1}$, n1, and n2 are the same as those in the formula (C1), $R^{c2}$ and $R^{c3}$ are each independently a hydrogen atom or a monovalent organic group, $R^{c4}$ is a hydrocarbon group, a carbon atom to which $R^{c2}$, $R^{c3}$ and $R^{c4}$ are bonded is a tertiary carbon atom, and $R^{c3}$ and $R^{c4}$ may be bonded to each other to form a ring, in a proviso that at least one of $R^{c2}$ and $R^{c3}$ is a monovalent organic group having an aliphatic ring CA including one or more divalent groups selected from an ether bond, a sulfide bond, and a carbonyl group in a ring structure, a monovalent organic group having an aliphatic ring CH substituted with a hydroxyl group or a hydroxyl group-containing group, a monovalent organic group having an aliphatic ring CL including a divalent group represented by —CO—O— in a ring structure, a monovalent organic group having an aliphatic ring CS including a divalent group represented by —$SO_2$— in a ring structure, or a monovalent organic group having an aliphatic ring CP including a trivalent group represented by the following formula in a ring structure:

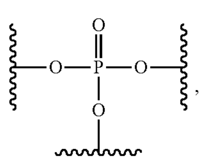 [SMILES: *OP(=O)(O*)O*]

or $R^{c2}$ and $R^{c3}$ are bonded to each other to form an aliphatic ring CA, an aliphatic ring CH, an aliphatic ring CL, an aliphatic ring CS, or an aliphatic ring CP.);

or a mercapto compound (C) represented by the following formula (C3):

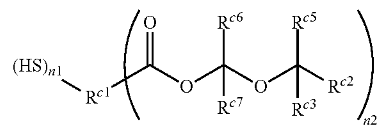

(C3)

(in the formula (C3), $R^{c1}$, $R^{c2}$, $R^{c3}$, n1, and n2 are the same as those in the formula (C2), $R^{c5}$, $R^{c6}$, and $R^{c7}$ are each independently a hydrogen atom, or an alkyl group, $R^{c5}$ and $R^{c6}$ may be bonded to each other to form a ring, in a proviso that at least one of $R^{c2}$ and $R^{c3}$ is a monovalent organic group having an aliphatic ring CA, a monovalent organic group having an aliphatic ring CH, a monovalent organic group having an aliphatic ring CL, a monovalent organic group having an aliphatic ring CS, or a monovalent organic group having an aliphatic ring CP, or $R^{c2}$ and $R^{c3}$ are bonded to each other to form an aliphatic ring CA, an aliphatic ring CH, an aliphatic ring CL, an aliphatic ring CS, or an aliphatic ring CP.).

The chemically amplified positive-type photosensitive resin compound according to the first aspect of the present invention includes a chemically amplified positive-type photosensitive resin compound including an acid generator (A) which generates acid upon exposure to an irradiated active ray or radiation, a resin (B) the solubility of which in alkali increases under the action of acid, and a mercapto compound (C) represented by the following formula (C4):

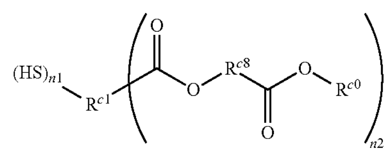

(C4)

In the formula (C4), $R^{c1}$, n1, and n2 are the same as those in the formula (C1), $R^{c8}$ is a divalent organic group, $R^{c8}$ is bonded to a carbonyl group by a C—C bond, and bonded to an oxygen atom by a C—O bond, and $R^{c0}$ is an acid dissociable group.

A second aspect of the present invention is a photosensitive dry film comprising a substrate film, and a photosensitive resin layer formed on a surface of the substrate film, wherein the photosensitive resin layer includes the chemically amplified positive-type photosensitive resin composition according to the first aspect.

A third aspect of the present invention is a method of manufacturing a photosensitive dry film. The method includes applying the chemically amplified positive-type photosensitive resin composition according to the first aspect on a substrate film to form a photosensitive resin layer.

A fourth aspect of the present invention is a method of manufacturing a patterned resist film. The method includes: layering a photosensitive resin layer on a substrate having a metal surface, the layer comprising the chemically amplified positive-type photosensitive resin composition of the first aspect, exposing the photosensitive resin layer through irradiation with an active ray or radiation in a position-selective manner, and developing the exposed photosensitive resin layer.

A fifth aspect of the present invention is a method of manufacturing a substrate with a template. The method includes:

layering a photosensitive resin layer on a substrate having a metal surface, the layer comprising the chemically amplified positive-type photosensitive resin composition of the first aspect, exposing the photosensitive resin layer through irradiation with an active ray or radiation in a position-selective manner, and developing the exposed photosensitive layer to prepare a template for plated article formation.

A sixth aspect of the present invention is a method of manufacturing a plated article, and the method comprising plating the substrate with the template manufactured by the method of the fifth aspect to form the plated article in the template.

A seventh aspect of the present invention is a mercapto compound represented by the following formula (C):

(C)

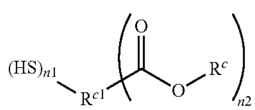

In the formula (C), n1 is an integer of 1 or more and 4 or less, n2 is an integer of 1 or more and 4 or less, $R^{c1}$ is an organic group having a valence of (n1+n2) and the $R^{c1}$ is bonded to a carbonyl group by a C—C bond, and bonded to a mercapto group by a C—S bond, and $R^c$ is a monovalent organic group bonded to an oxygen atom by a C—O bond, and having any one of structures represented by the following formulae (c1) to (c4):

(c1)

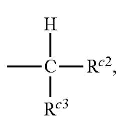

(c2)

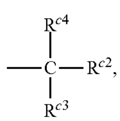

(c3)

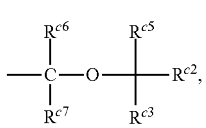

(c4)

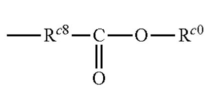

(in the group represented by the above-mentioned (c1), $R^{c2}$ and $R^3$ are each independently a hydrogen atom or a monovalent organic group, in a proviso that at least one of $R^{c2}$ and $R^{c3}$ is a monovalent organic group having an aliphatic ring CL including a divalent group represented by —CO—O— in the ring structure, or a monovalent organic group having an aliphatic ring CS including a divalent group represented by —$SO_2$— in the ring structure, or a monovalent organic group having an aliphatic ring CP including a trivalent group represented by the following formula in the ring structure:

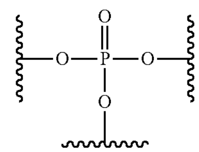

or $R^{c2}$ and $R^{c3}$ are bonded to each other to form an aliphatic ring CL, an aliphatic ring CS, or an aliphatic ring CP;

in the group represented by the above formula (c2), $R^{c2}$ and $R^{c3}$ are each independently a hydrogen atom or a monovalent organic group, $R^{c4}$ is a hydrocarbon group, a carbon atom to which $R^{c2}$, $R^{c3}$ and $R^{c4}$ are bonded is a tertiary carbon atom, and $R^{c3}$ and $R^{c4}$ may be bonded to each other to form a ring, in a proviso that at least one of $R^{c2}$ and $R^{c3}$ is a monovalent organic group having an aliphatic ring CA including one or more divalent groups selected from a group consisting of an ether bond, a sulfide bond, and a carbonyl group in the ring structure, a monovalent organic group having an aliphatic ring CH substituted with a hydroxyl group or a hydroxyl group-containing group, a monovalent organic group having an aliphatic ring CL mentioned above as to the formula (c1), a monovalent organic group having an aliphatic ring CS mentioned above as to the formula (c1), or a monovalent organic group having an aliphatic ring CP mentioned above as to the formula (c1), or $R^{c2}$ and $R^{c3}$ are bonded to each other to form an aliphatic ring CA, an aliphatic ring CH, an aliphatic ring CL, an aliphatic ring CS, or an aliphatic ring CP;

in the group represented by the above formula (c3), $R^{c2}$ and $R^{c3}$ are the same as $R^{c2}$ and $R^{c3}$ in the above formula (c2), $R^{c5}$, $R^{c6}$, and $R^{c7}$ are each independently a hydrogen atom, or an alkyl group, and $R^{c5}$ and $R^{c6}$ may be bonded to each other to form a ring, in a proviso that at least one of $R^{c2}$ and $R^{c3}$ is a monovalent organic group having an aliphatic ring CA, a monovalent organic group having an aliphatic ring CH, a monovalent organic group having an aliphatic ring CL, a monovalent organic group having an aliphatic ring CS, or a monovalent organic group having an aliphatic ring CP, or $R^{c2}$ and $R^{c3}$ are bonded to each other to form an aliphatic ring CA, an aliphatic ring CH, an aliphatic ring CL, an aliphatic ring CS, or an aliphatic ring CP;

in the group represented by the above formula (c4), $R^{c8}$ is a divalent organic group, and $R^{c8}$ is bonded to a carbonyl group by a C—C bond, and is bonded to an oxygen atom by a C—O bond, and $R^{c0}$ is an acid dissociable group.).

The mercapto compound of the seventh aspect of the present invention includes a compound represented by the following formula (C1):

(C1)

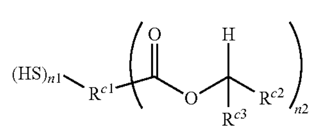

In the formula (C1), $R^{c1}$ is an organic group having a valence of (n1+n2), and the $R^{c1}$ is bonded to a carbonyl group by a C—C bond, and bonded to a mercapto group by a C—S bond, $R^{c2}$ and $R^{c3}$ are each independently a hydrogen atom or a monovalent organic group, n1 is an integer of 1 or more and 4 or less, and n2 is an integer of 1 or more and 4 or less, in a proviso that at least one of $R^{c2}$ and $R^{c3}$ is a monovalent organic group having an aliphatic ring CL including a divalent group represented by —CO—O— in a ring structure, a monovalent organic group having an aliphatic ring CS including a divalent group represented by —$SO_2$— in a ring structure, or a monovalent organic group having an aliphatic ring CP including a trivalent group represented by the following formula in the ring structure:

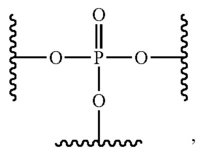 [SMILES: *OP(=O)(O*)O*]

or $R^{c2}$ and $R^{c3}$ are bonded to each other to form an aliphatic ring CL, an aliphatic ring CS, or an aliphatic ring CP.

The mercapto compound of the seventh aspect of the present invention includes a compound represented by the following formula (C2):

(C2)

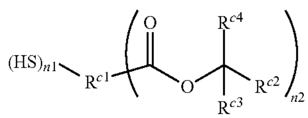

In the formula (C2), $R^{c1}$, n1, and n2 are the same as those in the formula (C1), $R^{c2}$ and $R^{c3}$ are each independently a hydrogen atom or a monovalent organic group, $R^{c4}$ is a hydrocarbon group, a carbon atom to which $R^{c2}$, $R^{c3}$ and $R^{c4}$ are bonded is a tertiary carbon atom, and $R^{c3}$ and $R^{c4}$ may be bonded to each other to form a ring, in a proviso that at least one of $R^{c2}$ and $R^{c3}$ is a monovalent organic group having an aliphatic ring CA including one or more divalent groups selected from an ether bond, a sulfide bond, and a carbonyl group in a ring structure, a monovalent organic group having an aliphatic ring CH substituted with a hydroxyl group or a hydroxyl group-containing group, a monovalent organic group having an aliphatic ring CL including a divalent group represented by —CO—O— in a ring structure, a monovalent organic group having an aliphatic ring CS including a divalent group represented by —$SO_2$— in a ring structure, or a monovalent organic group having an aliphatic ring CP including a trivalent group represented by the following formula in a ring structure:

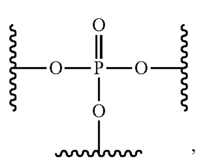

or $R^{c2}$ and $R^{c3}$ are bonded to each other to form an aliphatic ring CA, an aliphatic ring CH, an aliphatic ring CL, an aliphatic ring CS, or an aliphatic ring CP.

The mercapto compound of the seventh aspect of the present invention includes a compound represented by the following formula (C3):

(C3)

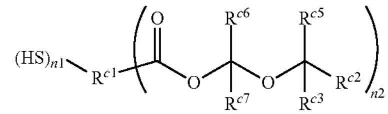

In the formula (C3), $R^{c1}$, $R^{c2}$, $R^{c3}$, n1, and n2 are the same as those in the formula (C2), $R^{c5}$, $R^{c6}$, and $R^{c7}$ are each independently a hydrogen atom, or an alkyl group, $R^{c5}$ and $R^{c6}$ may be bonded to each other to form a ring, in a proviso that at least one of $R^{c2}$ and $R^{c3}$ is a monovalent organic group having an aliphatic ring CA, a monovalent organic group having an aliphatic ring CH, a monovalent organic group having an aliphatic ring CL, a monovalent organic group having an aliphatic ring CS, or a monovalent organic group having an aliphatic ring CP, or $R^{c2}$ and $R^{c3}$ are bonded to each other to form an aliphatic ring CA, an aliphatic ring CH, an aliphatic ring CL, an aliphatic ring CS, or an aliphatic ring CP.

The mercapto compound of the seventh aspect of the present invention includes a mercapto compound represented by the following formula (C4):

(C4)

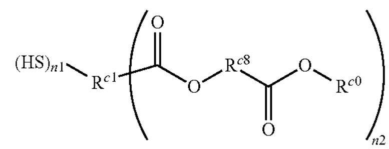

In the formula (C4), $R^{c1}$, n1, and n2 are the same as those in the formula (C1), $R^{c8}$ is a divalent organic group, $R^{c8}$ is bonded to a carbonyl group by a C—C bond, and bonded to an oxygen atom by a C—O bond, and $R^{c0}$ is an acid dissociable group.

An eighth aspect of the present invention is a compound represented by the following formula (C1-d) or (C1-f):

(C1-d)

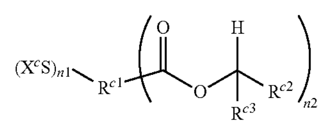

(in the formula (C1-d), $R^{c1}$ is an organic group having a valence of (n1+n2), and the $R^{c1}$ is bonded to a carbonyl group by a C—C bond, and bonded to a mercapto group by a C—S bond, $R^{c2}$ and $R^{c3}$ are each independently a hydrogen atom or a monovalent organic group, $X^c$ is a group represented by $R^{x1}$—(C═O)—, $R^{x1}$ is a monovalent hydrocarbon group, n1 is an integer of 1 or more and 4 or less, and n2 is an integer of 1 or more and 4 or less, in a proviso that at least one of $R^{c2}$ and $R^{c3}$ is a monovalent organic group having an aliphatic ring CL including a divalent group represented by —CO—O— in a ring structure, a monovalent organic group having an aliphatic ring CS including a divalent group represented by —$SO_2$— in a ring structure, or a monovalent organic group having an aliphatic ring CP including a trivalent group represented by the following formula in a ring structure:

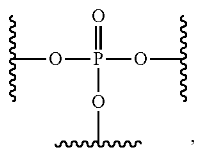 [SMILES: *OP(=O)(O*)O*]

or $R^{c2}$ and $R^{c3}$ are bonded to each other to form an aliphatic ring CL, an aliphatic ring CS, or an aliphatic ring CP.);

(C1-f)

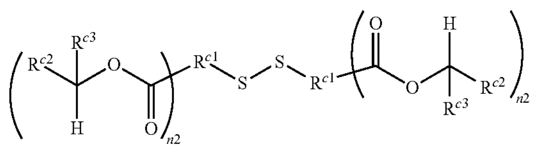

(in the formula (C1-f), $R^{c1}$ is an organic group having a valence of (1+n2), and the $R^{c1}$ is bonded to a carbonyl group by a C—C bond, and bonded to a sulfur atom by a C—S bond, $R^{c2}$ and $R^3$ are each independently a hydrogen atom or a monovalent organic group, and n2 is an integer of 1 or more and 4 or less, in a proviso that at least one of $R^{c2}$ and $R^{c3}$ is a monovalent organic group having an aliphatic ring CL including a divalent group represented by —CO—O— in a ring structure, a monovalent organic group having an aliphatic ring CS including a divalent group represented by $—SO_2—$ in a ring structure, or a monovalent organic group having an aliphatic ring CP including a trivalent group represented by the following formula in a ring structure:

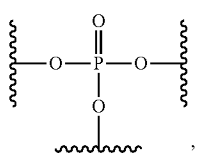 [SMILES: *OP(=O)(O*)O*]

or $R^{c2}$ and $R^{c3}$ are bonded to each other to form an aliphatic ring CL, an aliphatic ring CS, or an aliphatic ring CP.).

The present invention can provide a chemically amplified positive-type photosensitive resin composition capable of suppressing the occurrence of "footing" in which the width of the bottom (the side proximate to the surface of a support) becomes narrower than that of the top (the side proximate to the surface of a resist layer) in the nonresist portion when a resist pattern serving as a template for a plated article is formed on a metal surface of a substrate having a metal surface by using the chemically amplified positive-type photosensitive resin composition; a photosensitive dry film having a photosensitive resin layer including the chemically amplified positive-type photosensitive resin composition, a method of manufacturing the photosensitive dry film, a method of manufacturing a patterned resist film using the above-mentioned chemically amplified positive-type photosensitive resin composition, a method of manufacturing a substrate with a template using the above-mentioned photosensitive resin composition, and a method of manufacturing a plated article using the substrate with a template.

BRIEF DESCRIPTION OF THE DRAWINGS

FIG. 1 is a view schematically showing a cross section of a resist pattern when a footing amount in a nonresist portion in the resist pattern is observed in Examples and Comparative Examples.

DETAILED DESCRIPTION OF THE INVENTION

<<Chemically Amplified Positive-Type Photosensitive Resin Composition>>

The chemically amplified positive-type photosensitive resin composition (hereinafter also referred to as the "photosensitive resin composition") includes an acid generator (A) capable of producing an acid when irradiated with an active ray or radiation (hereinafter also referred to as the acid generator (A)), a resin (B) the solubility of which in alkali increases under the action of acid (hereinafter also referred to as the resin (B)), and a mercapto compound (C) having a predetermined structure. The photosensitive resin composition may include components such as an alkali-soluble resin (D), an acid diffusion suppressing agent (E), and an organic solvent (S), if desired.

The film thickness of the resist pattern formed using the photosensitive resin composition is not particularly limited. The photosensitive resin composition is preferably used for the formation of a thick resist pattern. Specifically, the film thickness of a resist pattern formed using the photosensitive resin composition is preferably 0.5 μm or more, more preferably 0.5 μm or more and 300 μm or less, particularly preferably 1 μm or more and 150 μm or less, and most preferably 3 μm or more and 100 μm or less.

Hereinafter, described are essential or optional components in the photosensitive resin composition, and a method for manufacturing the photosensitive resin composition.

<Acid Generator (A)>

The acid generator (A) is a compound capable of producing an acid when irradiated with an active ray or radiation, and is not particularly limited as long as it is a compound which directly or indirectly produces an acid under the action of light. The acid generator (A) is preferably any one of the acid generators of the first to fifth aspects that will be described below. Hereinafter, suitable aspects of the acid generator (A) that are suitably used in photosensitive resin compositions will be described as the first to fifth aspects.

The first aspect of the acid generator (A) may be a compound represented by the following formula (a1).

$$R^{1a}{}_{g}X^{1a+}\left[X^{2a}-\underset{\underset{R^{1a}{}_{g-1}}{|}}{X^{1a+}}\right]_{h}R^{1a}\quad (h+1)X^{3a-} \tag{a1}$$

In the formula (a1), $X^{1a}$ represents a sulfur atom or iodine atom respectively having a valence of g; g represents 1 or 2. h represents the number of repeating units in the structure within parentheses. $R^{1a}$ represents an organic group that is bonded to $X^{1a}$, and represents an aryl group having 6 or more and 30 or less carbon atoms, a heterocyclic group having 4 or more and 30 or less carbon atoms, an alkyl group having 1 or more and 30 or less carbon atoms, an alkenyl group having 2 or more and 30 or less carbon atoms, or an alkynyl group having 2 or more and 30 or less carbon atoms, and $R^{1a}$ may be substituted with at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen atoms. The number of $R^{1a}$s is g+h(g−1)+1, and the $R^{1a}$s may be respectively identical to or different from each other. Furthermore, two or more $R^{1a}$s may be bonded to each other directly or via —O—, —S—, —SO—, —$SO_2$—, —NH—, —$NR^{2a}$—, —CO—, —COO—, —CONH—, an alkylene group having 1 or more and 3 or less carbon atoms, or a phenylene group, and may form a ring structure including $X^{1a}$. $R^{2a}$ represents an alkyl group having 1 or more and 5 or less carbon atoms, or an aryl group having 6 or more and 10 or less carbon atoms.

$X^{2a}$ represents a structure represented by the following formula (a2).

$$—X^{4a}\!\left[X^{5a}—X^{4a}\right]_h \qquad (a2)$$

In the above formula (a2), $X^{4a}$ represents an alkylene group having 1 or more and 8 or less carbon atoms, an arylene group having 6 or more and 20 or less carbon atoms, or a divalent group of a heterocyclic compound having 8 or more and 20 or less carbon atoms, and $X^{4a}$ may be substituted with at least one selected from the group consisting of an alkyl group having 1 or more and 8 or less carbon atoms, an alkoxy group having 1 or more and 8 or less carbon atoms, an aryl group having 6 or more and 10 or less carbon atoms, a hydroxyl group, a cyano group, a nitro group, and halogen atoms. $X^{5a}$ represents —O—, —S—, —SO—, —$SO_2$—, —NH—, —$NR^{2a}$—, —CO—, —COO—, —CONH—, an alkylene group having 1 or more and 3 or less carbon atoms, or a phenylene group.

h represents the number of repeating units of the structure in parentheses. $X^{4a}$s in the number of h+1 and $X^{5a}$s in the number of h may be identical to or different from each other. $R^{2a}$ has the same definition as described above.

$X^{3a-}$ represents a counterion of an onium, and examples thereof include a fluorinated alkylfluorophosphoric acid anion represented by the following formula (a17) or a borate anion represented by the following formula (a18).

$$[(R^{3a})_j PF_{6-j}]^- \qquad (a17)$$

In the formula (a17), $R^{3a}$ represents an alkyl group having 80% or more of the hydrogen atoms substituted with fluorine atoms.

j represents the number of $R^{3a}$s and is an integer of 1 or more and 5 or less. $R^{3a}$s in the number of j may be respectively identical to or different from each other.

(a18)

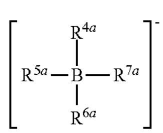

In the formula (a18) $R^{4a}$ to $R^{7a}$ each independently represents a fluorine atom or a phenyl group, and a part or all of the hydrogen atoms of the phenyl group may be substituted with at least one selected from the group consisting of a fluorine atom and a trifluoromethyl group.

Examples of the onium ion in the compound represented by the above formula (a1) include triphenylsulfonium, tri-p-tolylsulfonium, 4-(phenylthio)phenyldiphenylsulfonium, bis[4-(diphenylsulfonio)phenyl] sulfide, bis[4-{bis[4-(2-hydroxyethoxy)phenyl]sulfonio}phenyl] sulfide, bis{4-[bis(4-fluorophenyl)sulfonio]phenyl} sulfide, 4-(4-benzoyl-2-chlorophenylthio)phenylbis(4-fluorophenyl)sulfonium, 7-isopropyl-9-oxo-10-thia-9,10-dihydroanthracen-2-yldi-p-tolylsulfonium, 7-isopropyl-9-oxo-10-thia-9,10-dihydroanthracen-2-yldiphenylsulfonium, 2-[(diphenyl)sulfonio]thioxanthone, 4-[4-(4-tert-butylbenzoyl)phenylthio]phenyldi-p-tolylsulfonium, 4-(4-benzoylphenylthio)phenyldiphenylsulfonium, diphenylphenacylsulfonium, 4-hydroxyphenylmethylbenzylsulfo-nium, 2-naphthylmethyl(1-ethoxycarbonyl)ethylsulfonium, 4-hydroxyphenylmethylphenacylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, 4-isobutylphenyl(p-tolyl)iodonium, or the like.

Among the onium ions in the compound represented by the above formula (a1), a preferred onium ion may be a sulfonium ion represented by the following formula (a19).

(a19)

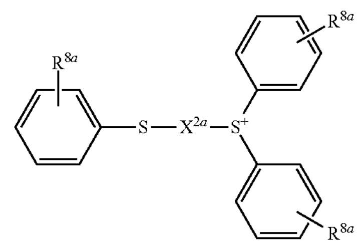

In the above formula (a19), $R^{8a}$s each independently represents a hydrogen atom or a group selected from the group consisting of alkyl, hydroxyl, alkoxy, alkylcarbonyl, alkylcarbonyloxy, alkyloxycarbonyl, a halogen atom, an aryl, which may be substituted, and arylcarbonyl. $X^{2a}$ has the same definition as $X^{2a}$ in the above formula (a1).

Specific examples of the sulfonium ion represented by the above formula (a19) include 4-(phenylthio)phenyldiphenylsulfonium, 4-(4-benzoyl-2-chlorophenylthio)phenylbis(4-fluorophenyl)sulfonium, 4-(4-benzoylphenylthio)phenyldiphenylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, and diphenyl[4-(p-terphenylthio)phenyl]diphenylsulfonium.

In regard to the fluorinated alkylfluorophosphoric acid anion represented by the above formula (a17), $R^{3a}$ represents an alkyl group substituted with a fluorine atom, and a preferred number of carbon atoms is 1 or more and 8 or less, while a more preferred number of carbon atoms is 1 or more and 4 or less. Specific examples of the alkyl group include linear alkyl groups such as methyl, ethyl, propyl, butyl, pentyl and octyl; branched alkyl groups such as isopropyl, isobutyl, sec-butyl and tert-butyl; and cycloalkyl groups such as cyclopropyl, cyclobutyl, cyclopentyl, and cyclohexyl. The proportion of hydrogen atoms substituted with fluorine atoms in the alkyl groups is usually 80% or more, preferably 90% or more, and even more preferably 100%. If the substitution ratio of fluorine atoms is less than 80%, the acid strength of the onium fluorinated alkylfluorophosphate represented by the above formula (a1) decreases.

A particularly preferred example of $R^{3a}$ is a linear or branched perfluoroalkyl group having 1 or more and 4 or less carbon atoms and a substitution ratio of fluorine atoms of 100%. Specific examples thereof include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$.

j which is the number of $R^{3a}$s represents an integer of 1 or more and 5 or less, and is preferably 2 or more and 4 or less, and particularly preferably 2 or 3.

Preferred specific examples of the fluorinated alkylfluorophosphoric acid anion include $[(CF_3CF_2)_2PF_4]^-$, $[(CF_3CF_2)_3PF_3]^-$, $[((CF_3)_2CF)_2PF_4]^-$, $[((CF_3)_2CF)_3PF_3]^-$, $[(CF_3CF_2CF_2)_2PF_4]^-$, $[(CF_3CF_2CF_2)_3PF_3]^-$, $[((CF_3)_2CFCF_2)_2PF_4]^-$, $[((CF_3)_2CFCF_2)_3PF_3]^-$, $[(CF_3CF_2CF_2CF_2)_2PF_4]^-$, or $[(CF_3CF_2CF_2)_3PF_3]^-$. Among these, $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$, or $[((CF_3)_2CFCF_2)_2PF_4]^-$ are particularly preferred.

Preferred specific examples of the borate anion represented by the above formula (a18) include tetrakis(pentafluorophenyl)borate ($[B(C_6F_5)_4]^-$), tetrakis[(trifluoromethyl)phenyl]borate ($[B(C_6H_4CF_3)_4]^-$), difluorobis(pentafluorophenyl)borate ($[(C_6F_5)_2BF_2]^-$), trifluoro(pentafluorophenyl)borate ($[(C_6F_5)BF_3]^-$), and tetrakis(difluorophenyl)borate ($[B(C_6H_3F_2)_4]^-$). Among these, tetrakis(pentafluorophenyl)borate ($[B(C_6F_5)_4]^-$) is particularly preferred.

The second aspect of the acid generator (A) include halogen-containing triazine compounds such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy) styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine and tris(2,3-dibromopropyl)-1,3,5-triazine, and halogen-containing triazine compounds represented by the following formula (a3) such as tris(2,3-dibromopropyl)isocyanurate.

(a3)

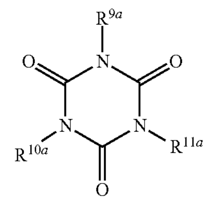

In the above formula (a3), $R^{9a}$, $R^{10a}$ and $R^{11a}$ each independently represent a halogenated alkyl group.

Further, the third aspect of the acid generator (A) include α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile and α-(ethylsulfonyloxyimino)-1-cyclopentenylacetonitrile, and compounds represented by the following formula (a4) having an oximesulfonate group.

(a4)

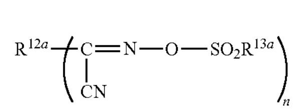

In the above formula (a4), $R^{12a}$ represents a monovalent, bivalent or trivalent organic group, $R^{13a}$ represents a substituted or unsubstituted saturated hydrocarbon group, an unsaturated hydrocarbon group, or an aromatic group, and n represents the number of repeating units of the structure in the parentheses.

In the formula (a4), the aromatic group indicates a group of compounds having physical and chemical properties characteristic of aromatic compounds, and examples thereof include aryl groups such as a phenyl group and a naphthyl group, and heteroaryl groups such as a furyl group and a thienyl group. These may have one or more appropriate substituents such as halogen atoms, alkyl groups, alkoxy groups and nitro groups on the rings. It is particularly preferable that $R^{13a}$ is an alkyl group having 1 or more and 6 or less carbon atoms such as a methyl group, an ethyl group, a propyl group, and a butyl group. In particular, compounds in which $R^{12a}$ represents an aromatic compound group, and $R^{13a}$ represents an alkyl group having 1 or more and 4 or less carbon atoms are preferred.

Examples of the acid generator represented by the above formula (a4) include compounds in which $R^{12a}$ is any one of a phenyl group, a methylphenyl group and a methoxyphenyl group, and $R^{13a}$ is a methyl group, provided that n is 1, and specific examples thereof include α-(methylsulfonyloxyimino)-1-phenylacetonitrile, α-(methylsulfonyloxyimino)-1-(p-methylphenyl)acetonitrile, α-(methylsulfonyloxyimino)-1-(p-methoxyphenyl)acetonitrile, [2-(propylsulfonyloxyimino)-2,3-dihydroxythiophene-3-ylidene](o-tolyl)acetonitrile and the like. Provided that n is 2, the acid generator represented by the above formula (a4) is specifically an acid generator represented by the following formulae.

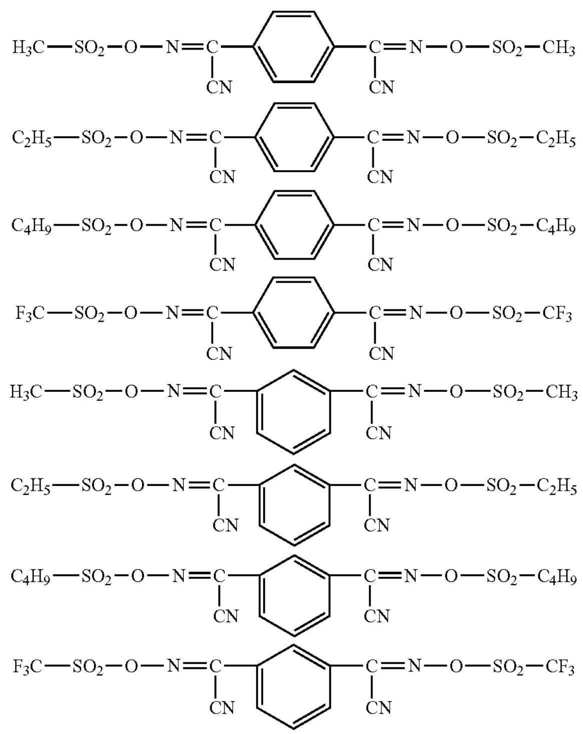

In addition, the fourth aspect of the acid generator (A) include onium salts that have a naphthalene ring at their cation moiety. The expression "have a naphthalene ring" indicates having a structure derived from naphthalene and also indicates at least two ring structures and their aromatic properties are maintained. The naphthalene ring may have a substituent such as a linear or branched alkyl group having 1 or more and 6 or less carbon atoms, a hydroxyl group, a linear or branched alkoxy group having 1 or more and 6 or less carbon atoms or the like. The structure derived from the naphthalene ring, which may be of a monovalent group (one free valance) or of a bivalent group (two free valences), is desirably of a monovalent group (in this regard, the number of free valance is counted except for the portions connecting with the substituents described above). The number of naphthalene rings is preferably 1 or more and 3 or less.

Preferably, the cation moiety of the onium salt having a naphthalene ring at the cation moiety is of the structure represented by the following formula (a5).

(a5)

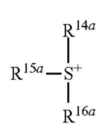

In the above formula (a5), at least one of $R^{14a}$, $R^{15a}$ and $R^{16a}$ represents a group represented by the following formula (a6), and the remaining represents a linear or branched alkyl group having 1 or more and 6 or less carbon atoms, a phenyl group which may have a substituent, a hydroxyl group, or a linear or branched alkoxy group having 1 or more and 6 or less carbon atoms. Alternatively, one of $R^{14a}$, $R^{15a}$ and $R^{16a}$ is a group represented by the following formula (a6), and the remaining two are each independently a linear or branched alkylene group having 1 or more and 6 or less carbon atoms, and these terminals may bond to form a ring structure.

(a6)

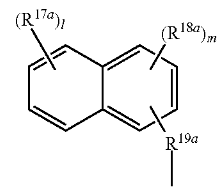

In the formula (a6), $R^{17a}$ and $R^{18a}$ each independently represent a hydroxyl group, a linear or branched alkoxy group having 1 or more and 6 or less carbon atoms, or a linear or branched alkyl group having 1 or more and 6 or less carbon atoms, and $R^{19a}$ represents a single bond or a linear or branched alkylene group having 1 or more and 6 or less carbon atoms that may have a substituent.

l and m each independently represent an integer of 0 or more and 2 or less, and l+m is 3 or less. Herein, when there exists a plurality of $R^{17a}$, they may be identical to or different from each other. Furthermore, when there exists a plurality of $R^{18a}$, they may be identical to or different from each other.

Preferably, among $R^{14a}$, $R^{15a}$ and $R^{16a}$ as above, the number of groups represented by the above formula (a6) is one in view of the stability of the compound, and the remaining are linear or branched alkylene groups having 1 or more and 6 or less carbon atoms of which the terminals may bond to form a ring. In this case, the two alkylene groups described above form a 3 to 9 membered ring including sulfur atom(s). Preferably, the number of atoms to form the ring (including sulfur atom(s)) is 5 or more and 6 or less.

Examples of the substituent, which the alkylene group may have, include an oxygen atom (in this case, a carbonyl group is formed together with a carbon atom that constitutes the alkylene group), a hydroxyl group or the like.

Furthermore, examples of the substituent, which the phenyl group may have, include a hydroxyl group, a linear or branched alkoxy group having 1 or more and 6 or less carbon atoms, a linear or branched alkyl group having 1 or more and 6 or less carbon atoms, or the like.

Examples of cations for the suitable cation moiety include cations represented by the following formulae (a7) and (a8), and the structure represented by the following formula (a8) is particularly preferable.

(a7)

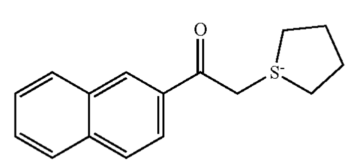

(a8)

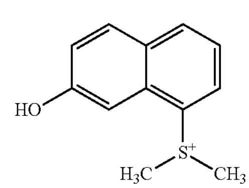

The cation moieties, which may be of an iodonium salt or a sulfonium salt, are desirably of a sulfonium salt in view of acid-producing efficiency.

It is, therefore, desirable that the suitable anions for the anion moiety of the onium salt having a naphthalene ring at the cation moiety is an anion capable of forming a sulfonium salt.

The anion moiety of the acid generator is exemplified by fluoroalkylsulfonic acid ions, of which hydrogen atom(s) being partially or entirely fluorinated, or aryl sulfonic acid ions.

The alkyl group of the fluoroalkylsulfonic acid ions may be linear, branched or cyclic and have 1 or more and 20 or less carbon atoms. Preferably, the carbon number is 1 or more and 10 or less in view of bulkiness and diffusion distance of the produced acid. In particular, branched or cyclic alkyl groups are preferable due to shorter diffusion length. Also, methyl, ethyl, propyl, butyl, octyl groups and the like are preferable due to being inexpensively synthesizable.

The aryl group of the aryl sulfonic acid ions may be an aryl group having 6 or more and 20 or less carbon atoms, and is exemplified by a phenol group or a naphthyl group that may be unsubstituted or substituted with an alkyl group or a halogen atom. In particular, aryl groups having 6 or more and 10 or less carbon atoms are preferable due to being inexpensively synthesizable. Specific examples of preferable aryl group include phenyl, toluenesulfonyl, ethylphenyl, naphthyl, methylnaphthyl groups and the like.

When hydrogen atoms in the above fluoroalkylsulfonic acid ion or the aryl sulfonic acid ion are partially or entirely substituted with a fluorine atom, the fluorination rate is preferably 10% or more and 100% or less, and more preferably 50% or more and 100% or less; it is particularly preferable that all hydrogen atoms are each substituted with a fluorine atom in view of higher acid strength. Specific examples thereof include trifluoromethane sulfonate, perfluorobutane sulfonate, perfluorooctane sulfonate, perfluorobenzene sulfonate, and the like.

Among these, the preferable anion moiety is exemplified by those represented by the following formula (a9).

$$R^{20a}SO_3^- \quad (a9)$$

In the above formula (a9), $R^{20}$ represents groups represented by the following formulae (a10), (a11), and (a12).

(a10)

$$—C_xF_{2x+1}$$

(a11)

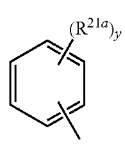

(a12)

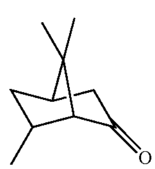

In the above formula (a10), x represents an integer of 1 or more and 4 or less. Also, in the above formula (a11), $R^{21a}$ represents a hydrogen atom, a hydroxyl group, a linear or branched alkyl group having 1 or more and 6 or less carbon atoms, or a linear or branched alkoxy group having 1 or more and 6 or less carbon atoms, and y represents an integer of 1 or more and 3 or less. Of these, trifluoromethane sulfonate, and perfluorobutane sulfonate are preferable in view of safety.

In addition, a nitrogen-containing moiety represented by the following formulae (a13) and (a14) may also be used for the anion moiety.

(a13)

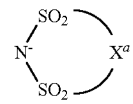

(a14)

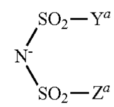

In the formulae (a13) and (a14), $X^a$ represents a linear or branched alkylene group in which at least one hydrogen atom is substituted with a fluorine atom, the carbon number of the alkylene group is 2 or more and 6 or less, preferably 3 or more and 5 or less, and most preferably the carbon number is 3. In addition, $Y^a$ and $Z^a$ each independently represent a linear or branched alkyl group of which at least one hydrogen atom is substituted with a fluorine atom, the number of carbon atoms of the alkyl group is 1 or more and 10 or less, preferably 1 or more and 7 or less, and more preferably 1 or more and 3 or less.

The smaller number of carbon atoms in the alkylene group of $X^a$, or in the alkyl group of $Y^a$ or $Z^a$ is preferred since the solubility into organic solvent is favorable.

In addition, a larger number of hydrogen atoms each substituted with a fluorine atom in the alkylene group of $X^a$, or in the alkyl group of $Y^a$ or $Z^a$ is preferred since the acid strength becomes greater. The percentage of fluorine atoms in the alkylene group or alkyl group, i.e., the fluorination rate is preferably 70% or more and 100% or less and more preferably 90% or more and 100% or less, and most preferable are perfluoroalkylene or perfluoroalkyl groups in which all of the hydrogen atoms are each substituted with a fluorine atom.

Examples of preferable compounds for onium salts having a naphthalene ring at their cation moieties include compounds represented by the following formulae (a15) and (a16).

(a15)

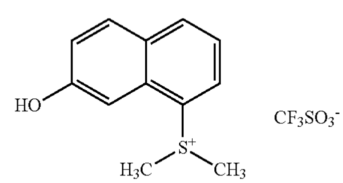

(a16)

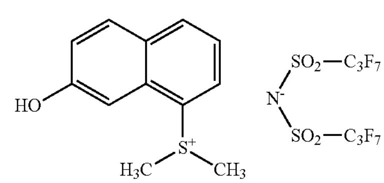

Also, the fifth aspect of the acid generator (A) include bissulfonyldiazomethanes such as bis(p-toluenesulfonyl)diazomethane, bis(1,1-dimethyl ethylsulfonyl)diazomethane, bis(cyclohexylsulfonyl)diazomethane and bis(2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosylate, dinitrobenzyl tosylate, nitrobenzyl sulfonate, nitrobenzyl carbonate and dinitrobenzyl carbonate; sulfonates such as pyrogalloltrimesylate, pyrogalloltritosylate, benzyltosylate, benzylsulfonate, N-methylsulfonyloxysuccinimide, N-trichloromethylsulfonyloxysuccinimide, N-phenylsulfonyloxymaleimide and N-methylsulfonyloxyphthalimide; trifluoromethane sulfonates such as N-hydroxyphthalimide and N-hydroxynaphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate and (p-tert-butylphenyl)diphenylsulfonium trifluoromethanesulfonate; benzointosylates such as benzointosylate and α-methylbenzointosylate; other diphenyliodonium salts, triphenylsulfonium salts, phenyldiazonium salts, benzylcarbonates and the like.

This acid generator (A) may be used alone, or two or more kinds may be used in combination. Furthermore, the content of the acid generator (A) is preferably adjusted to 0.1% by mass or more and 10% by mass or less, and more preferably 0.5% by mass or more and 3% by mass or less, relative to the total mass of the photosensitive resin composition. When the amount of the acid generator (A) used is adjusted to the range described above, a photosensitive resin composition that is a uniform solution having satisfactory sensitivity and exhibiting excellent storage stability can be readily prepared.

<Resin (B)>

A resin (B) the solubility of which in alkali increases under the action of acid is not particularly limited, and any resin the solubility of which in alkali increases under the action of acid can be used. Among them, it is preferable to contain at least one resin selected from the group consisting of novolac resin (B1), polyhydroxystyrene resin (B2), and acrylic resin (B3).

[Novolac Resin (B1)]

As the novolak resin (B1), a resin including the constituent unit represented by the following formula (b1) may be used.

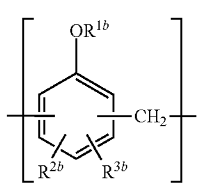

(b1)

In the formula (b1), $R^{1b}$ represents an acid-dissociable dissolution-inhibiting group, and $R^{2b}$ and $R^{3b}$ each independently represent a hydrogen atom or an alkyl group having 1 or more and 6 or less carbon atoms.

The acid-dissociable dissolution-inhibiting group represented by the above $R^{1b}$ is preferably a group represented by the following formula (b2) or (b3), a linear, branched or cyclic alkyl group having 1 or more and 6 or less carbon atoms, a vinyloxyethyl group, a tetrahydropyranyl group, a tetrahydrofuranyl group, or a trialkylsilyl group.

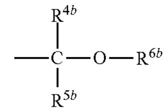

(b2)

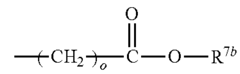

(b3)

In the above formulae (b2) and (b3), $R^{4b}$ and $R^{5b}$ each independently represent a hydrogen atom, or a linear or branched alkyl group having 1 or more and 6 or less carbon atoms, $R^{6b}$ represents a linear, branched or cyclic alkyl group having 1 or more and 10 or less carbon atoms, $R^{7b}$ represents a linear, branched or cyclic alkyl group having 1 or more and 6 or less carbon atoms, and o represents 0 or 1.

Examples of the above linear or branched alkyl group include a methyl group, an ethyl group, a propyl group, an isopropyl group, an n-butyl group, an isobutyl group, a tert-butyl group, a pentyl group, an isopentyl group, a neopentyl group, and the like. Also, examples of the above cyclic alkyl group include a cyclopentyl group, a cyclohexyl group, and the like.

Specific examples of the acid-dissociable dissolution-inhibiting group represented by the above formula (b2) include a methoxyethyl group, ethoxyethyl group, n-propoxyethyl group, isopropoxyethyl group, n-butoxyethyl group, isobutoxyethyl group, tert-butoxyethyl group, cyclohexyloxyethyl group, methoxypropyl group, ethoxypropyl group, 1-methoxy-1-methylethyl group, 1-ethoxy-1-methylethyl group, and the like. Furthermore, specific examples of the acid-dissociable dissolution-inhibiting group represented by the above formula (b3) include a tert-butoxycarbonyl group, a tert-butoxycarbonylmethyl group, and the like. Examples of the above trialkylsilyl group include a trimethylsilyl group and tri-tert-butyldimethylsilyl group in which each alkyl group has 1 or more and 6 or less carbon atoms.

[Polyhydroxystyrene Resin (B2)]

As the polyhydroxystyrene resin (B2), a resin including a constituent unit represented by the following formula (b4) may be used.

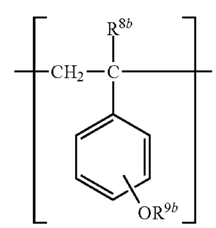

(b4)

In the above formula (b4), $R^{8b}$ represents a hydrogen atom or an alkyl group having 1 or more and 6 or less carbon atoms, and $R^{9b}$ represents an acid-dissociable dissolution-inhibiting group.

The above alkyl group having 1 or more and 6 or less carbon atoms may include, for example, linear, branched or cyclic alkyl groups having 1 or more and 6 or less carbon atoms. Examples of the linear or branched alkyl group include a methyl group, ethyl group, propyl group, isopropyl group, n-butyl group, isobutyl group, tert-butyl group, pentyl group, isopentyl group, neopentyl group, and the like. Examples of the cyclic alkyl group include a cyclopentyl group and cyclohexyl group.

The acid-dissociable dissolution-inhibiting group represented by the above $R^{9b}$ may be similar to the acid-dissociable dissolution-inhibiting groups exemplified in terms of the above formulae (b2) and (b3).

Furthermore, the polyhydroxystyrene resin (B2) may include another polymerizable compound as a constituent unit in order to moderately control physical or chemical properties. The polymerizable compound is exemplified by conventional radical polymerizable compounds and anion polymerizable compounds. Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid and 2-methacryloyloxyethyl hexahydrophthalic acid; (meth)acrylic acid alkyl esters such as methyl (meth)acrylate, ethyl (meth)acrylate and butyl (meth)acrylate; (meth)acrylic acid hydroxyalkyl esters such as 2-hydroxyethyl (meth)acrylate and 2-hydroxypropyl (meth) acrylate; (meth)acrylic acid aryl esters such as phenyl (meth) acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

[Acrylic resin (B3)]

An acrylic resin (B3) is not particularly limited as long as it is an acrylic resin the solubility of which in alkali increases under the action of acid, and has conventionally blended in various photosensitive resin compositions.

Preferably, the acrylic resin (B3) contains a constituent unit (b-3) derived from, for example, an acrylic ester including an —$SO_2$-containing cyclic group or a lactone-containing cyclic group. In such a case, when a resist pattern is formed, the occurrence of footing can be suppressed.

(—$SO_2$-Containing Cyclic Group)

Herein, the "—$SO_2$-containing cyclic group" refers to a cyclic group having a cyclic group containing a ring including —$SO_2$— in the ring skeleton thereof, specifically a cyclic group in which the sulfur atom (S) in —$SO_2$— forms a part of the ring skeleton of the cyclic group. Considering a ring including —$SO_2$— in the ring skeleton thereof as the first ring, a group having that ring alone is called a monocyclic group, and a group further having another ring structure is called a polycyclic group regardless of its structure. The —$SO_2$-containing cyclic group may be monocyclic or polycyclic.

In particular, the —$SO_2$-containing cyclic group is preferably a cyclic group containing —O—$SO_2$— in the ring skeleton thereof, i.e., a cyclic group containing a sultone ring in which —O—S— in —O—$SO_2$— forms a part of the ring skeleton.

The number of carbon atoms in an —$SO_2$-containing cyclic group is preferably 3 or more and 30 or less, more preferably 4 or more and 20 or less, even more preferably 4 or more and 15 or less, and in particular preferably 4 or more and 12 or less. The above number of carbon atoms is the number of carbon atoms constituting a ring skeleton, and shall not include the number of carbon atoms in a substituent.

The —$SO_2$-containing cyclic group may be an —$SO_2$-containing aliphatic cyclic group or an —$SO_2$-containing aromatic cyclic group. It is preferably an —$SO_2$-containing aliphatic cyclic group.

—$SO_2$— containing aliphatic cyclic groups include a group in which at least one hydrogen atom is removed from an aliphatic hydrocarbon ring where a part of the carbon atoms constituting the ring skeleton thereof is(are) substituted with —$SO_2$— or —O—$SO_2$—. More specifically, they include a group in which at least one hydrogen atom is removed from an aliphatic hydrocarbon ring where —$CH_2$— constituting the ring skeleton thereof is substituted with —$SO_2$— and a group in which at least one hydrogen atom is removed from an aliphatic hydrocarbon ring where —$CH_2$—$CH_2$— constituting the ring thereof is substituted with —O—$SO_2$—.

The number of carbon atoms in the above alicyclic hydrocarbon ring is preferably 3 or more and 20 or less, more preferably 3 or more and 12 or less. The above alicyclic hydrocarbon ring may be polycyclic, or may be monocyclic. As the monocyclic alicyclic hydrocarbon group, preferred is a group in which two hydrogen atoms are removed from monocycloalkane having 3 or more and 6 or less carbon atoms. Examples of the above monocycloalkane can include cyclopentane, cyclohexane and the like. As the polycyclic alicyclic hydrocarbon ring, preferred is a group in which two hydrogen atoms are removed from polycycloalkane having 7 or more and 12 or less carbon atoms, and specific examples of the above polycycloalkane include adamantane, norbornane, isobornane, tricyclodecane, tetracyclododecane and the like.

The —$SO_2$-containing cyclic group may have a substituent. Examples of the above substituent include, for example, an alkyl group, an alkoxy group, a halogen atom, a halogenated alkyl group, a hydroxy group, an oxygen atom (=O), —COOR", —OC(=O)R", a hydroxyalkyl group, a cyano group and the like.

For an alkyl group as the above substituent, preferred is an alkyl group having 1 or more and 6 or less carbon atoms. The above alkyl group is preferably linear or branched. Specific examples include a methyl group, an ethyl group, an n-propyl group, an isopropyl group, an n-butyl group, an isobutyl group, a tert-butyl group, an n-pentyl group, an isopentyl group, a neopentyl group, an n-hexyl group and the like. Among these, a methyl group or an ethyl group is preferred, and a methyl group is particularly preferred.

For an alkoxy group as the above substituent, preferred is an alkoxy group having 1 or more and 6 or less carbon atoms. The above alkoxy group is preferably linear or branched. Specific examples include a group in which an alkyl groups recited as an alkyl group for the above substituent is attached to the oxygen atom (—O—).

Halogen atoms as the above substituent include a fluorine atom, a chlorine atom, a bromine atom, an iodine atom and the like, and a fluorine atom is preferred.

Halogenated alkyl groups for the above substituent include a group in which a part or all of the hydrogen atoms in the above alkyl group is(are) substituted with the above halogen atom(s).

Halogenated alkyl groups as the above substituent include a group in which a part or all of the hydrogen atoms in the alkyl groups recited as an alkyl group for the above substituent is(are) substituted with the above halogen atom(s). As the above halogenated alkyl group, a fluorinated alkyl group is preferred, and a perfluoroalkyl group is particularly preferred.

R"s in the aforementioned —COOR" and —OC(=O)R" are either a hydrogen atom or a linear, branched or cyclic alkyl group having 1 or more and 15 or less carbon atoms.

In a case where R" is a linear or branched alkyl group, the number of carbon atoms in the above chain alkyl group is preferably 1 or more and 10 or less, more preferably 1 or more and 5 or less, and in particular preferably 1 or 2.

In a case where R" is a cyclic alkyl group, the number of carbon atoms in the above cyclic alkyl group is preferably 3 or more and 15 or less, more preferably 4 or more and 12 or less, and in particular preferably 5 or more and 10 or less. Specific examples can include a group in which one or more hydrogen atoms are removed from monocycloalkane; and polycycloalkane such as bicycloalkane, tricycloalkane, tetracycloalkane and the like optionally substituted with a fluorine atom or a fluorinated alkyl group. More specific examples include a group in which one or more hydrogen atoms are removed from monocycloalkane such as cyclopentane and cyclohexane; and polycycloalkane such as adamantane, norbornane, isobornane, tricyclodecane and tetracyclododecane.

For a hydroxyalkyl group as the above substituent, preferred is a hydroxyalkyl group having 1 or more and 6 or less carbon atoms. Specific examples include a group in which at least one of the hydrogen atoms in the alkyl groups recited as an alkyl group for the above substituent is substituted with a hydroxy group.

More specific examples of the —$SO_2$-containing cyclic group include the groups represented by the following formulae (3-1) to (3-4).

(3-1)

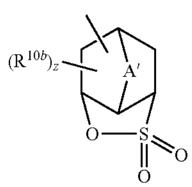

(3-2)

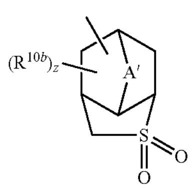

(3-3)

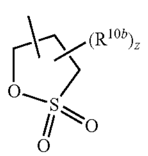

(3-4)

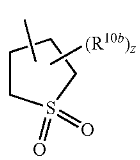

(In the formulae, A' represents an alkylene group having 1 or more and 5 or less carbon atoms optionally including an oxygen atom or a sulfur atom, an oxygen atom or a sulfur atom; z represents an integer of 0 or more and 2 or less; $R^{10b}$ represents an alkyl group, an alkoxy group, a halogenated alkyl group, a hydroxy group, —COOR", —OC(=O)R", a hydroxyalkyl group, or a cyano group; and R" represents a hydrogen atom or an alkyl group.)

In the above formulae (3-1) to (3-4), A' represents an alkylene group having 1 or more and 5 or less carbon atoms optionally including an oxygen atom (—O—) or a sulfur atom (—S—), an oxygen atom or a sulfur atom. As an alkylene group having 1 or more and 5 or less carbon atoms in A', a linear or branched alkylene group is preferred, and examples thereof include a methylene group, an ethylene group, an n-propylene group, an isopropylene group and the like.

In a case where the above alkylene group includes an oxygen atom or a sulfur atom, specific examples thereof include a group in which —O— or —S— is present at a terminal or between carbon atoms of the above alkylene group, for example, —O—$CH_2$—, —$CH_2$—O—$CH_2$—, —S—$CH_2$—, —$CH_2$—S—$CH_2$—, and the like. As A', an alkylene group having 1 or more and 5 or less carbon atoms or —O— is preferred, and an alkylene group having 1 or more and 5 or less carbon atoms is more preferred, and a methylene group is most preferred.

z may be any of 0, 1, and 2, and is most preferably 0. In a case where z is 2, a plurality of $R^{10b}$ may be the same, or may differ from each other.

Examples of an alkyl group, an alkoxy group, a halogenated alkyl group, —COOR", —OC(=O)R" and a hydroxyalkyl group in $R^{10b}$ include those similar to the hydroxyalkyl groups described above for the alkyl group, the alkoxy group, the halogenated alkyl group, —COOR", —OC(=O)R" and the hydroxyalkyl group, respectively, which are recited as a substituent optionally contained in the —$SO_2$-containing cyclic group.

Below, specific cyclic groups represented by the above formulae (3-1) to (3-4) will be illustrated. Note here that "Ac" in the formulae represents an acetyl group.

(3-1-1)

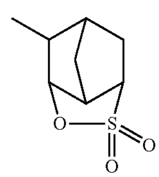

(3-1-2)

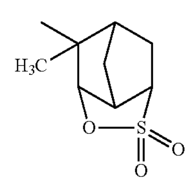

(3-1-3)

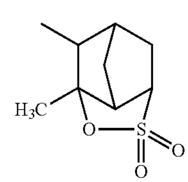

-continued
(3-1-4)
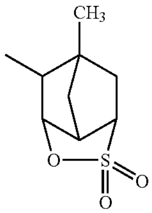
(3-1-5)
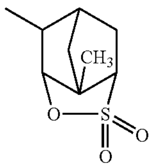
(3-1-6)
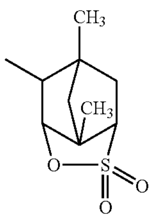
(3-1-7)
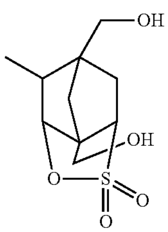
(3-1-8)
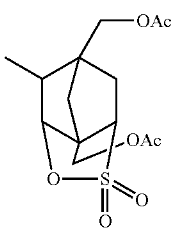
(3-1-9)
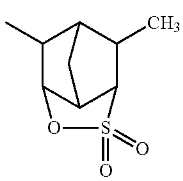
(3-1-10)
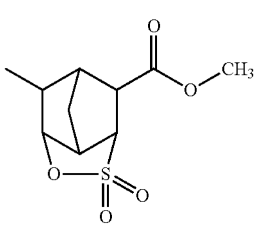
-continued
(3-1-11)
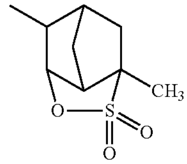
(3-1-12)
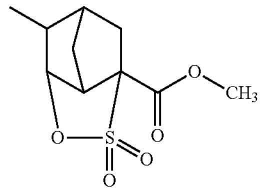
(3-1-13)
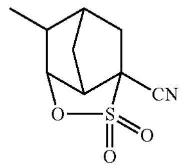
(3-1-14)
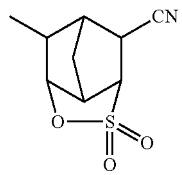
(3-1-15)
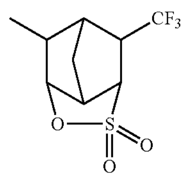
(3-1-16)
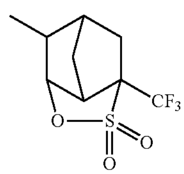
(3-1-17)
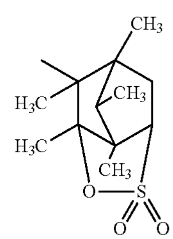
(3-1-18)
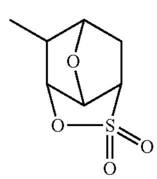

-continued
(3-1-19)
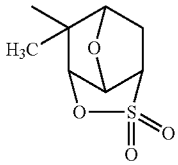
(3-1-20)
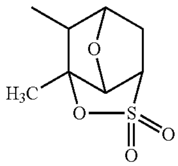
(3-1-21)
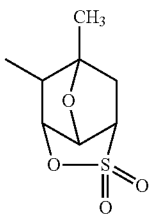
(3-1-22)
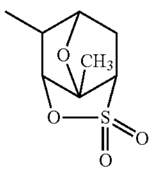
(3-1-23)
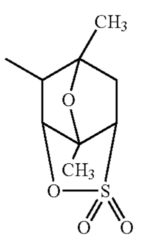
(3-1-24)
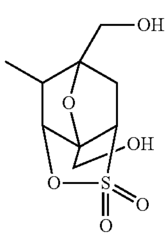
(3-1-25)
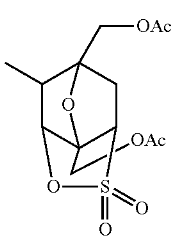
(3-1-26)
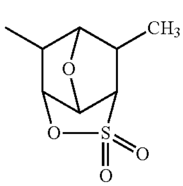
-continued
(3-1-27)
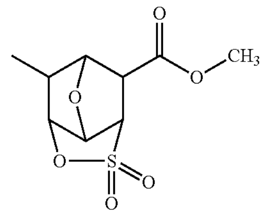
(3-1-28)
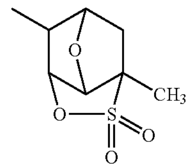
(3-1-29)
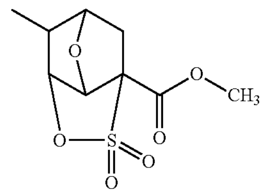
(3-1-30)
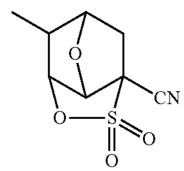
(3-1-31)
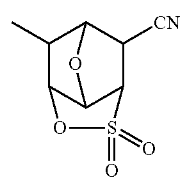
(3-1-32)
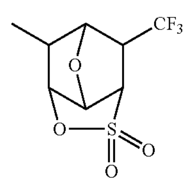
(3-1-33)
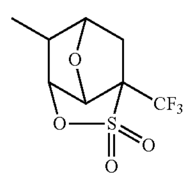
(3-2-1)
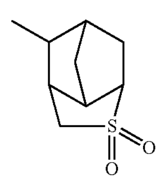

-continued (3-2-2)

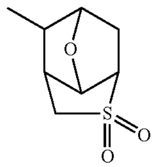

(3-3-1)

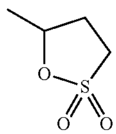

(3-4-1)

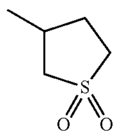

As the —$SO_2$-containing cyclic group, among those shown above, a group represented by the above formula (3-1) is preferred, and at least one selected from the group consisting of the groups represented by any of the aforementioned formulae (3-1-1), (3-1-18), (3-3-1) and (3-4-1) is more preferred, and a group represented by the aforementioned formula (3-1-1) is most preferred.

(Lactone-Containing Cyclic Group)

The "lactone-containing cyclic group" refers to a cyclic group containing a ring (lactone ring) including —O—C(═O)— in the ring skeleton thereof. Considering the lactone ring as the first ring, a group having that lactone ring alone is called a monocyclic group, and a group further having another ring structure is called a polycyclic group regardless of its structure. The lactone-containing cyclic group may be a monocyclic group, or may be a polycyclic group.

There is no particular limitation on the lactone-containing cyclic group in the constituent unit (b-3), and any cyclic group containing lactone can be used. Specifically, examples of the lactone-containing monocyclic groups include a group in which one hydrogen atom is removed from 4 to 6 membered ring lactone, for example, a group in which one hydrogen atom is removed from β-propiono lactone, a group in which one hydrogen atom is removed from γ-butyrolactone, a group in which one hydrogen atom is removed from δ-valerolactone and the like. Further, lactone-containing polycyclic groups include a group in which one hydrogen atom is removed from bicycloalkane, tricycloalkane and tetracycloalkane having a lactone ring.

As to the structure of the constituent unit (b-3), as long as the constituent unit (b-3) has an —$SO_2$-containing cyclic group or a lactone-containing cyclic group, the structure of parts other than an —$SO_2$-containing cyclic group and a lactone-containing cyclic group is not particularly limited. A preferred constituent unit (b-3) is at least one constituent unit selected from the group consisting of a constituent unit (b-3-S) derived from an acrylic acid ester including an —$SO_2$-containing cyclic group in which a hydrogen atom attached to the carbon atom in the a position may be substituted with a substituent; and a constituent unit (b-3-L) derived from an acrylic acid ester including a lactone-containing cyclic group in which the hydrogen atom attached to the carbon atom in the a position may be substituted with a substituent.

[Constituent Unit (b-3-S)]

More specifically, examples of the constituent unit (b-3-S) include one represented by the following formula (b-S1)

(b-S1)

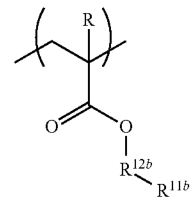

(In the formula, R represents a hydrogen atom, an alkyl group having 1 or more 5 or less carbon atoms or a halogenated alkyl group having 1 or more 5 or less carbon atoms; and $R^{11b}$ represents an —$SO_2$-containing cyclic group; and $R^{12b}$ represents a single-bond or divalent linking group.)

In the formula (b-S1), R is similarly defined as above. $R^{11b}$ is similarly defined as in the —$SO_2$-containing cyclic group described above. $R^{12b}$ may be either a single-bond linking group or a divalent linking group. A divalent linking group is preferred due to the superior effect of the present invention.

There is no particular limitation on the divalent linking group in $R^{12b}$. Suitable examples include a divalent hydrocarbon group optionally having a substituent, a divalent linking group including a hetero atom, and the like.

Optionally Substituted Divalent Hydrocarbon Group

The hydrocarbon group as a divalent linking group may be an aliphatic hydrocarbon group, or may be an aromatic hydrocarbon group. The aliphatic hydrocarbon group means a hydrocarbon group without aromaticity. The above aliphatic hydrocarbon group may be saturated or may be unsaturated. Usually, a saturated hydrocarbon group is preferred. More specifically, examples of the above aliphatic hydrocarbon group include a linear or branched aliphatic hydrocarbon group, an aliphatic hydrocarbon group including a ring in the structure thereof and the like.

The number of carbon atoms in the linear or branched aliphatic hydrocarbon group is preferably 1 or more and 10 or less, more preferably 1 or more and 8 or less, and even more preferably 1 or more and 5 or less.

As the linear aliphatic hydrocarbon group, a linear alkylene group is preferred. Specific examples include a methylene group [—$CH_2$—], an ethylene group [—$(CH_2)_2$—], a trimethylene group [—$(CH_2)_3$—], a tetramethylene group [—$(CH_2)_4$—], a pentamethylene group [—$(CH_2)_5$-] and the like.

As the branched aliphatic hydrocarbon group, a branched alkylene group is preferred. Specific examples include alkyl alkylene groups such as alkyl methylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; alkyl ethylene groups such as —$CH(CH_3)CH_2$—, —$CH(CH_3)CH(CH_3)$—, —$C(CH_3)_2CH_2$—, —$CH(CH_2CH_3)CH_2$— and —$C(CH_2CH_3)_2$—$CH_2$—; alkyl trimethylene groups such as —$CH(CH_3)CH_2CH_2$— and —$CH_2CH(CH_3)CH_2$—; alkyl tetramethylene groups such as —$CH(CH_3)CH_2CH_2CH_2$— and —$CH_2CH(CH_3)CH_2CH_2$—; and the like. As an alkyl group in the alkyl alkylene group, a linear alkyl group having 1 or more and 5 or less carbon atoms is preferred.

The above linear or branched aliphatic hydrocarbon group may or may not have a substituent (a group or atom other than a hydrogen atom) which substitutes a hydrogen atom. Examples of the substituent include a fluorine atom, a fluorinated alkyl group having 1 or more and 5 or less carbon atoms substituted with a fluorine atom, an oxo group (═O) and the like.

Examples of the above aliphatic hydrocarbon group including a ring in the structure thereof include a cyclic aliphatic hydrocarbon group optionally including a hetero atom in the ring structure (a group in which two hydrogen atoms are removed from an aliphatic hydrocarbon ring); a group in which the above cyclic aliphatic hydrocarbon group is attached to an end of a linear or branched aliphatic hydrocarbon group; a group in which the above cyclic aliphatic hydrocarbon group is present in a linear or branched aliphatic hydrocarbon group along the chain; and the like. Examples of the above linear or branched aliphatic hydrocarbon group include groups similar to the above.

The number of carbon atoms in the cyclic aliphatic hydrocarbon group is preferably 3 or more and 20 or less, and more preferably 3 or more and 12 or less.

The cyclic aliphatic hydrocarbon group may be polycyclic, or may be monocyclic. As the monocyclic aliphatic hydrocarbon group, a group in which two hydrogen atoms are removed from monocycloalkane is preferred. The number of carbon atoms in the above monocycloalkane is preferably 3 or more and 6 or less. Specific examples include cyclopentane, cyclohexane and the like. As the polycyclic aliphatic hydrocarbon group, a group in which two hydrogen atoms are removed from polycycloalkane is preferred. The number of carbon atoms in the above polycycloalkane is preferably 7 or more and 12 or less. Specific examples include adamantane, norbornane, isobornane, tricyclodecane, tetracyclododecane and the like.

The cyclic aliphatic hydrocarbon group may or may not have a substituent which substitutes a hydrogen atom (a group or atom other than a hydrogen atom). Examples of the above substituent include an alkyl group, an alkoxy group, a halogen atom, a halogenated alkyl group, a hydroxy group, an oxo group (═O) and the like.

For an alkyl group as the above substituent, an alkyl group having 1 or more and 5 or less carbon atoms is preferred, and a methyl group, an ethyl group, a propyl group, an n-butyl group and a tert-butyl group are more preferred.

For an alkoxy group as the above substituent, an alkoxy group having 1 or more and 5 or less carbon atoms is preferred, and a methoxy group, an ethoxy group, an n-propoxy group, an iso-propoxy group, an n-butoxy group and a tert-butoxy group are more preferred, and a methoxy group and an ethoxy group are particularly preferred.

Halogen atoms as the above substituent include a fluorine atom, a chlorine atom, a bromine atom, an iodine atoms and the like, and a fluorine atom is preferred.

Halogenated alkyl groups as the above substituent include a group in which a part or all of hydrogen atoms in the aforementioned alkyl group is(are) substituted with the above halogen atom(s).

In the cyclic aliphatic hydrocarbon group, a part of carbon atoms constituting the ring structure thereof may be substituted with —O—, or —S—. As the substituent including the above hetero atom, preferred are —O—, —C(═O)—O—, —S—, $—S(═O)_2—$ and $—S(═O)_2—O—$.

The aromatic hydrocarbon group as the divalent hydrocarbon group is a divalent hydrocarbon group having at least one aromatic ring, and may have a substituent. There is no particular limitation on the aromatic ring as long as it is a cyclic conjugated system having a 4n+2 π electrons, and it may be monocyclic or may be polycyclic. The number of carbon atoms in the aromatic ring is preferably 5 or more and 30 or less, more preferably 5 or more and 20 or less, further more preferably 6 or more and 15 or less, and particularly preferably 6 or more and 12 or less. However, the number of carbon atoms in a substituent shall not be included in the above number of carbon atoms.

Specifically, aromatic rings include aromatic hydrocarbon rings such as benzene, naphthalene, anthracene and phenanthrene; aromatic heterocycles in which a part of the carbon atoms constituting the above aromatic hydrocarbon ring is(are) substituted with hetero atom(s). Hetero atoms in the aromatic heterocycle include an oxygen atom, a sulfur atom, a nitrogen atom and the like. Specifically, aromatic heterocycles include a pyridine ring, a thiophene ring, and the like.

Specific examples of the aromatic hydrocarbon group as a divalent hydrocarbon group include a group in which two hydrogen atoms are removed from the above aromatic hydrocarbon ring or the above aromatic heterocycle (an arylene group or a heteroarylene group); a group in which two hydrogen atoms are removed from an aromatic compound including two or more aromatic rings (for example, biphenyl, fluorene and the like); a group in which one hydrogen atom from a group where one hydrogen atom is removed from the above aromatic hydrocarbon ring or the above aromatic heterocycle (an aryl group or a heteroaryl group) is substituted with an alkylene group (for example, a group in which one hydrogen atom is further removed from an aryl group in an arylalkyl group such as a benzyl group, a phenethyl group, a 1-naphthylmethyl group, a 2-naphthylmethyl group, a 1-naphthylethyl group and a 2-naphthylethyl group); and the like.

The number of carbon atoms in the above alkylene group bonded to an aryl group or a heteroaryl group is preferably 1 or more and 4 or less, more preferably 1 or more and 2 or less, and particularly preferably 1.

In the above aromatic hydrocarbon group, a hydrogen atom of the above aromatic hydrocarbon group may be substituted with a substituent. For example, a hydrogen atom attached to an aromatic ring in the above aromatic hydrocarbon group may be substituted with a substituent. Examples of the substituent include an alkyl group, an alkoxy group, a halogen atom, a halogenated alkyl group, a hydroxy group, an oxo group (═O) and the like.

For an alkyl group as the above substituent, an alkyl group having 1 or more and 5 or less carbon atoms is preferred, and a methyl group, an ethyl group, an n-propyl group, an n-butyl group and a tert-butyl group are more preferred.

For an alkoxy group as the above substituent, an alkoxy group having 1 or more and 5 or less carbon atoms is preferred, and a methoxy group, an ethoxy group, an n-propoxy group, an iso-propoxy group, an n-butoxy group and a tert-butoxy group are preferred, and a methoxy group and an ethoxy group are more preferred.

Halogen atoms as the above substituent include a fluorine atom, a chlorine atom, a bromine atom, an iodine atom and the like, and a fluorine atom is preferred.

Halogenated alkyl groups as the above substituent include a group in which a part or all of hydrogen atoms in the aforementioned alkyl group is(are) substituted with the above halogen atom(s).

Divalent Linking Group Including Hetero Atom

A hetero atom in the divalent linking group including a hetero atom is an atom other than a carbon atom and a hydrogen atom, and examples thereof include an oxygen atom, a nitrogen atom, a sulfur atom, a halogen atom and the like.

Specific examples of the divalent linking group including a hetero atom include non-hydrocarbon based linking groups such as —O—, —C(=O)—, —C(=O)—O—, —O—C(=O)—O—, —S—, —S(=O)$_2$—, —S(=O)$_2$—O—, —NH—, —NH—C(=O)—, —NH—C(=NH)—, =N—, and combinations of at least one of these non-hydrocarbon based linking groups and a divalent hydrocarbon group and the like. Examples of the above divalent hydrocarbon group include those similar to the aforementioned divalent hydrocarbon groups optionally having a substituent, and linear or branched aliphatic hydrocarbon groups are preferred.

Among those described above, —NH— in —C(=O)—NH—, and H in —NH— and —NH—C(=NH)— may be substituted with a substituent such as an alkyl group or an acyl group, respectively. The number of carbon atoms in the above substituent is preferably 1 or more and 10 or less, more preferably 1 or more and 8 or less, and in particular preferably 1 or more and 5 or less.

As a divalent linking group in $R^{12b}$, a linear or branched alkylene group, a cyclic aliphatic hydrocarbon group, or a divalent linking group including a hetero atom is preferred.

In a case where the divalent linking group in $R^{12b}$ is a linear or branched alkylene group, the number of carbon atoms in the above alkylene group is preferably 1 or more and 10 or less, more preferably 1 or more and 6 or less, in particular preferably 1 or more and 4 or less, and most preferably 1 or more and 3 or less. Specific examples include groups similar to the linear alkylene groups or branched alkylene groups recited as a linear and branched aliphatic hydrocarbon group in the description of the "divalent hydrocarbon group optionally having a substituent" as the aforementioned divalent linking group.

In a case where the divalent linking group in $R^{12b}$ is an cyclic aliphatic hydrocarbon group, examples of the above cyclic aliphatic hydrocarbon group include groups similar to the cyclic aliphatic hydrocarbon groups recited as the "aliphatic hydrocarbon group including a ring in the structure" in the description of the "divalent hydrocarbon group optionally having a substituent" as the aforementioned divalent linking group.

As the above cyclic aliphatic hydrocarbon group, particularly preferred is a group in which two or more hydrogen atoms are removed from cyclopentane, cyclohexane, norbornane, isobornane, adamantane, tricyclodecane or tetracyclododecane.

In a case where the divalent linking group in $R^{12b}$ is a divalent linking group including a hetero atom, groups preferred as the above linking groups include —O—, —C(=O)—O—, —C(=O)—, —O—C(=O)—O—, —C(=O)—NH—, —NH— (H may be substituted with a substituent such as an alkyl group or an acyl group.), —S—, —S(=O)$_2$—, —S(=O)$_2$—O— and a group represented by the general formula —Y—O—$Y^2$—, —[$Y^1$—C(=O)—O]$_{m'}$—$Y^2$— or —$Y^1$—O—C(=O)—$Y_2$— (wherein $Y^1$ and $Y^2$ are divalent hydrocarbon groups each independently, optionally having a substituent, and O represents an oxygen atom, and m' is an integer of 0 or more and 3 or less.).

In a case where the divalent linking group in $R^{12b}$ is —NH—, the hydrogen atom in —NH— may be substituted with a substituent such as an alkyl group or an acyl group. The number of carbon atoms in the above substituent (an alkyl group, an acyl group and the like) is preferably 1 or more and 10 or less, more preferably 1 or more and 8 or less, and in particular preferably 1 or more and 5 or less.

$Y^1$ and $Y^2$ in the formula $Y^1$—O—$Y^2$—, —[Y—C(=O)—O]$_{m'}$—$Y^2$— or —$Y^1$—O—C(=O)—$Y^2$— are divalent hydrocarbon groups each independently, optionally having a substituent. Examples of the above divalent hydrocarbon group include groups similar to the "divalent hydrocarbon group optionally having a substituent" recited in the description of the above divalent linking group.

As $Y^1$, a linear aliphatic hydrocarbon group is preferred, and a linear alkylene group is more preferred, and a linear alkylene group having 1 or more and 5 or less carbon atoms is more preferred, and a methylene group and an ethylene group are particularly preferred.

As $Y^2$, a linear or branched aliphatic hydrocarbon group is preferred, and a methylene group, an ethylene group and an alkylmethylene group are more preferred. The alkyl group in the above alkylmethylene group is preferably a linear alkyl group having 1 or more and 5 or less carbon atoms, more preferably a linear alkyl group having 1 or more and 3 or less carbon atoms, and particularly preferably a methyl group.

In a group represented by the formula —[$Y^1$—C(=O)—O]$_{m'}$—$Y^2$—, m' is an integer of 0 or more and 3 or less, preferably an integer of 0 or more and 2 or less, more preferably 0 or 1, and particularly preferably 1. In other words, as a group represented by the formula —[$Y^1$—C(=O)—O]$_{m'}$—$Y^2$—, a group represented by the formula —$Y^1$—C(=O)—O—$Y^2$— is particularly preferred. Among these, a group represented by the formula —$(CH_2)_{a'}$—C(=O)—O—$(CH_2)_{b'}$— is preferred. In the above formula, a' is an integer of 1 or more and 10 or less, preferably an integer of 1 or more and 8 or less, more preferably an integer of 1 or more and 5 or less, even more preferably 1 or 2, and most preferably 1.

b' is an integer of 1 or more and 10 or less, preferably an integer of 1 or more and 8 or less, more preferably an integer of 1 or more and 5 or less, even more preferably 1 or 2, and most preferably 1.

With regard to the divalent linking group in $R^{12b}$, an organic group including a combination of at least one non-hydrocarbon group and a divalent hydrocarbon group is preferred as the divalent linking group including a hetero atom. Among these, a linear chain group having an oxygen atom as a hetero atom, for example, a group including an ether bond or an ester bond is preferred, and a group represented by the aforementioned formula —$Y^1$—O—$Y^2$—, —[$Y^1$—C(=O)—O]$_{m'}$—$Y^2$— Or —Y—O—C(=O)—$Y^2$— is more preferred, and a group represented by the aforementioned formula —[Y—C(=O)—O]$_{m'}$—$Y^2$— or —Y—O—C(=O)—$Y^2$— is particularly preferred.

As the divalent linking group in $R^{12b}$, a group including an alkylene group or an ester bond (—C(=O)—O—) is preferred.

The above alkylene group is preferably a linear or branched alkylene group. Suitable examples of the above linear aliphatic hydrocarbon group include a methylene group [—$CH_2$—], an ethylene group [—$(CH_2)_2$—], a trimethylene group [—$(CH_2)_3$—], a tetramethylene group [—$(CH_2)_4$—], a pentamethylene group [—$(CH_2)_5$-] and the like. Suitable examples of the above branched alkylene group include alkyl alkylene groups such as alkyl methylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; alkyl ethylene groups such as —$CH(CH_3)CH_2$—, —$CH(CH_3)CH(CH_3)$—, —$C(CH_3)_2CH_2$—, —$CH(CH_2CH_3)$ $CH_2$— and —$C(CH_2CH_3)_2$—$CH_2$—; alkyl trimethylene groups such as —$CH(CH_3)CH_2CH_2$— and —$CH_2CH(CH_3)CH_2$—; alkyl tetramethylene groups such as —$CH(CH_3)CH_2CH_2CH_2$— and —$CH_2CH(CH_3)$ $CH_2CH_2$—.

As the divalent linking group including an ester bond, particularly preferred is a group represented by the formula: —$R^{13b}$—C(═O)—O—[wherein $R^{13b}$ represents a divalent linking group.].

In other words, the constituent unit (b-3-S) is preferably a constituent unit represented by the following formula (b-S1-1).

(b-S1-1)

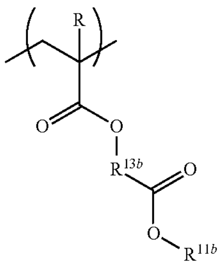

(In the formula, R and $R^{11b}$ are each similar to the above, and $R^{13b}$ represents a divalent linking group.)

There is no particular limitation for $R^{13b}$, examples thereof include groups similar to the aforementioned divalent linking group in $R^{12b}$. As the divalent linking group in $R^{13b}$, a linear or branched alkylene group, an aliphatic hydrocarbon group including a ring in the structure, or a divalent linking group including a hetero atom is preferred, and a linear or branched alkylene group or a divalent linking group including an oxygen atom as a hetero atom is preferred.

As the linear alkylene group, a methylene group or an ethylene group is preferred, and a methylene group is particularly preferred. As the branched alkylene group, an alkylmethylene group or an alkylethylene group is preferred, and —$CH(CH_3)$—, —$C(CH_3)_2$— or —$C(CH_3)_2CH_2$— is particularly preferred.

As the divalent linking group including an oxygen atom, a divalent linking group including an ether bond or an ester bond is preferred, and the aforementioned —$Y^1$—O—$Y^2$—, —[$Y^1$—C(═O)—O]$_{m'}$—$Y^2$— or —$Y^1$—O—C(═O)—$Y^2$— is more preferred. $Y^1$ and $Y^2$ are each independently divalent hydrocarbon groups optionally having a substituent, and m' is an integer of 0 or more and 3 or less. Among these, —$Y^1$—O—C(═O)—$Y^2$— is preferred, and a group represented by —$(CH_2)_c$—O—C(═O)—$(CH_2)_d$— is particularly preferred.

c is an integer of 1 or more and 5 or less, and 1 or 2 is preferred.

d is an integer of 1 or more and 5 or less, and 1 or 2 is preferred.

As the constituent unit (b-3-S), in particular, one represented by the following formula (b-S1-11) or (b-S1-12) is preferred, and one represented by the formula (b-S1-12) is more preferred.

(b-S1-11)

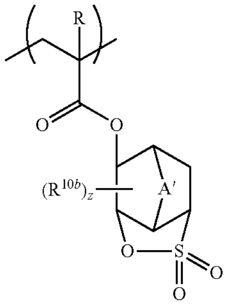

-continued (b-S1-12)

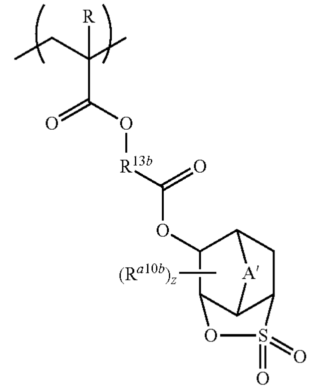

(In the formulae, R, A', $R^{10b}$, z and $R^{13b}$ are each the same as the above.)

In the formula (b-S1-11), A' is preferably a methylene group, an oxygen atom (—O—) or a sulfur atom (—S—).

As $R^{13b}$, preferred is a linear or branched alkylene group or a divalent linking group including an oxygen atom. Examples of the linear or branched alkylene group and the divalent linking group including an oxygen atom in $R^{13b}$ include groups similar to the aforementioned linear or branched alkylene group and the aforementioned divalent linking group including an oxygen atom, respectively.

As the constituent unit represented by the formula (b-S1-12), particularly preferred is one represented by the following formula (b-S1-12a) or (b-S1-12b).

(b-S1-12a)

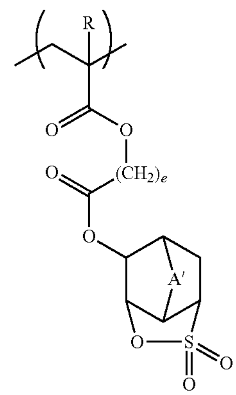

(b-S1-12b)

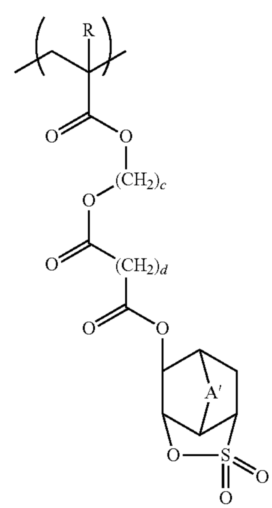

(In the formulae, R and A' are each the same as the above, and c to e are each independently an integer of 1 or more and 3 or less.)

[Constituent Unit (b-3-L)]

Examples of the constituent unit (b-3-L) include, for example, a constituent unit in which $R^{1b}$ in the aforementioned formula (b-S1) is substituted with a lactone-containing cyclic group. More specifically they include those represented by the following formulae (b-L1) to (b-L5).

(b-L1)

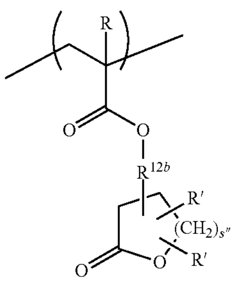

(b-L2)

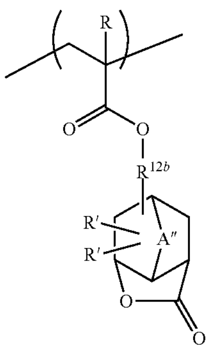

(b-L3)

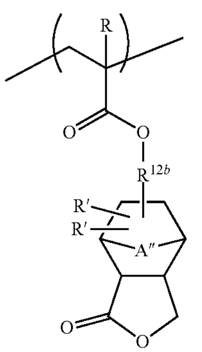

(b-L4)

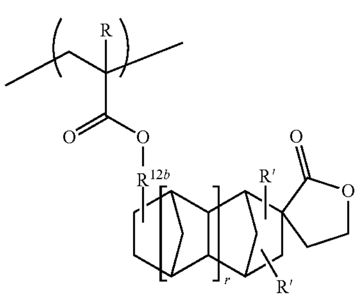

-continued (b-L5)

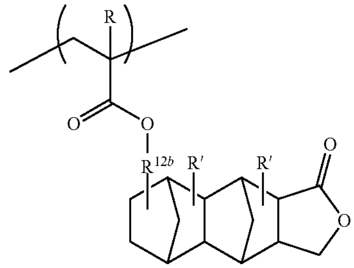

(In the formulae, R represents a hydrogen atom, an alkyl group having 1 or more and 5 or less carbon atoms or a halogenated alkyl group having 1 or more and 5 or less carbon atoms; R' represents each independently a hydrogen atom, an alkyl group, an alkoxy group, a halogenated alkyl group, a hydroxy group, —COOR", —OC(=O)R", a hydroxyalkyl group or a cyano group, and R" represents a hydrogen atom or an alkyl group; $R^{12b}$ represents a single bond or divalent linking group, and s" is an integer of 0 or more and 2 or less; A" represents an alkylene group having 1 or more and 5 or less carbon atoms optionally including an oxygen atom or a sulfur atom, an oxygen atom or a sulfur atom; and r is 0 or 1.)

R in the formulae (b-L1) to (b-L5) is the same as the above. Examples of the alkyl group, the alkoxy group, the halogenated alkyl group, —COOR", —OC(=O)R" and the hydroxyalkyl group in R' include groups similar to those described for the alkyl group, the alkoxy group, the halogenated alkyl group, —COOR", —OC(=O)R" and the hydroxyalkyl group recited as a substituent which the —$SO_2$-containing cyclic group may have, respectively.

R' is preferably a hydrogen atom in view of easy industrial availability and the like. The alkyl group in R" may be any of a linear, branched or cyclic chain. In a case where R" is a linear or branched alkyl group, the number of carbon atoms is preferably 1 or more and 10 or less, and more preferably 1 or more and 5 or less. In a case where R" is a cyclic alkyl group, the number of carbon atoms is preferably 3 or more and 15 or less, more preferably 4 or more and 12 or less, and most preferably 5 or more and 10 or less. Specific examples include a group in which one or more hydrogen atoms are removed from monocycloalkane and polycycloalkane such as bicycloalkane, tricycloalkane, tetracycloalkane and the like optionally substituted with a fluorine atom or a fluorinated alkyl group. Specific examples include a group in which one or more hydrogen atoms are removed from monocycloalkane such as cyclopentane and cyclohexane; and polycycloalkane such as adamantane, norbornane, isobornane, tricyclodecane and tetracyclododecane; and the like. Examples of A" include groups similar to A' in the aforementioned formula (3-1). A" is preferably an alkylene group having 1 to 5 carbon atoms, an oxygen atom (—O—) or a sulfur atom (—S—), more preferably an alkylene group having 1 or more and 5 or less carbon atoms or —O—. As the alkylene group having 1 or more and 5 or less carbon atoms, a methylene group or a dimethylmethylene group is more preferred, and a methylene group is most preferred.

$R^{12b}$ is similar to $R^{12b}$ in the aforementioned formula (b-S1). In the formula (b-L1), s" is preferably 1 or 2. Below, specific examples of the constituent units represented by the aforementioned formulae (b-L1) to (b-L3) will be illustrated. In each of the following formulae, $R^{\alpha}$ represents a hydrogen atom, a methyl group or a trifluoromethyl group.

(b-L1-1)

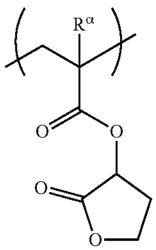

(b-L1-2)

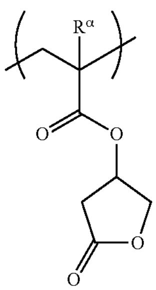

(b-L1-3)

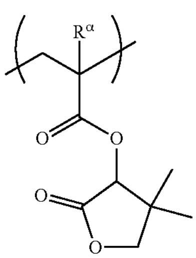

(b-L1-4)

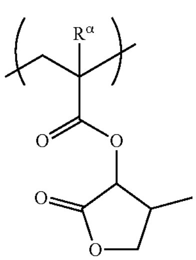

(b-L1-5)

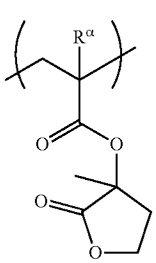

-continued (b-L1-6)

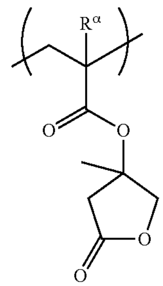

(b-L1-7)

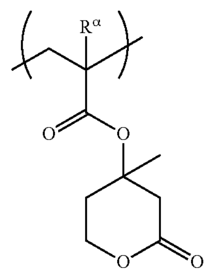

(b-L1-8)

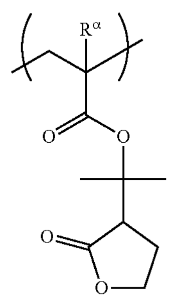

(b-L1-9)

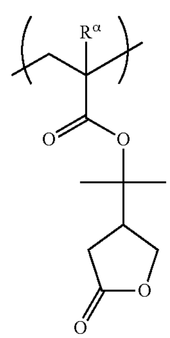

(b-L1-10)

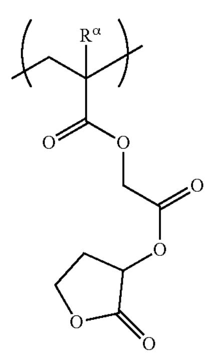

-continued
(b-L1-11)
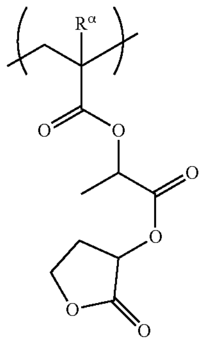
(b-L1-12)
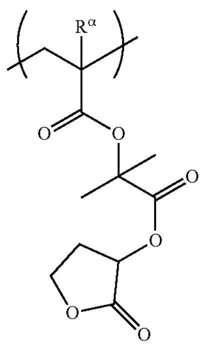
(b-L1-13)
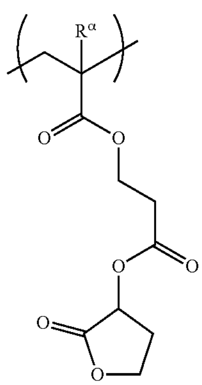
(b-L2-1)
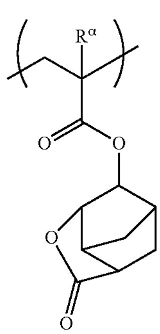
-continued
(b-L2-2)
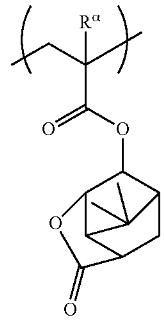
(b-L2-3)
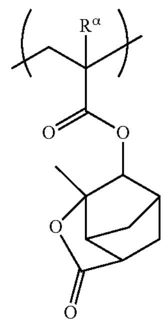
(b-L2-4)
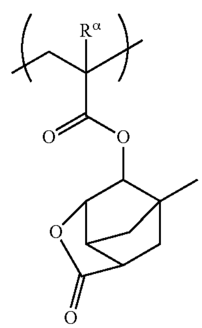
(b-L2-5)
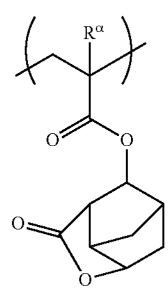
(b-L2-6)
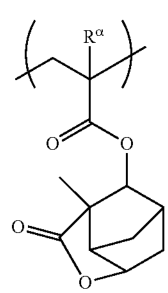

-continued
(b-L2-7)
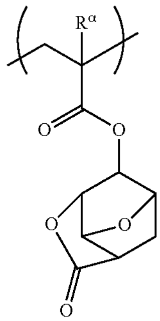
(b-L2-8)
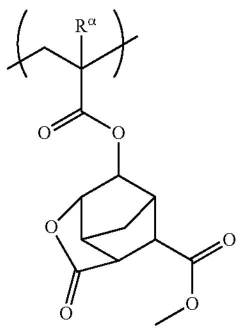
(b-L2-9)
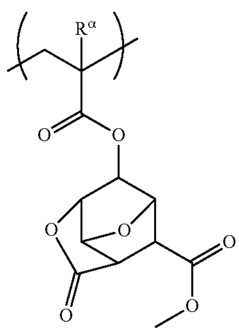
(b-L2-10)
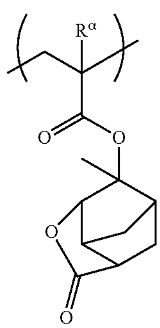
(b-L2-11)
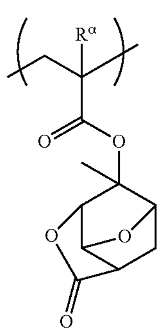
-continued
(b-L2-12)
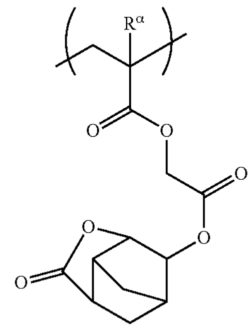
(b-L2-13)
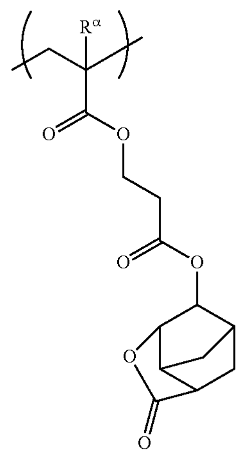
(b-L2-14)
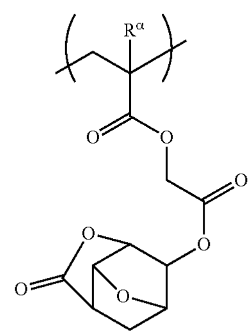
(b-L2-15)
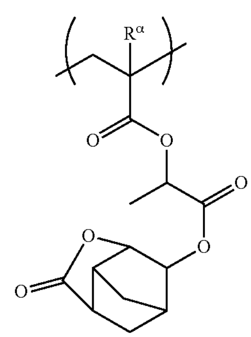

-continued (b-L2-16)

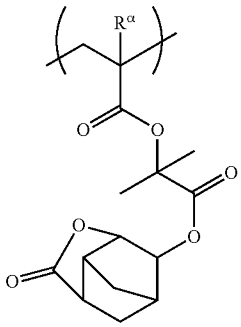

(b-L2-17)

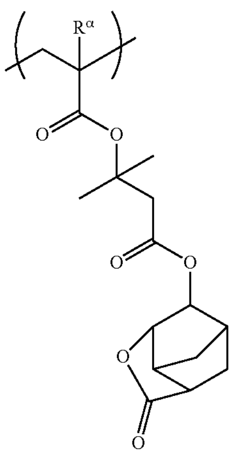

(b-L3-1)

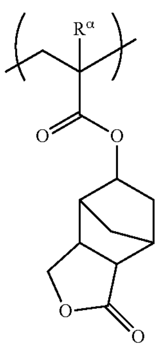

(b-L3-2)

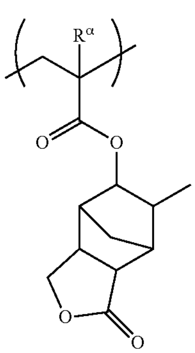

-continued (b-L3-3)

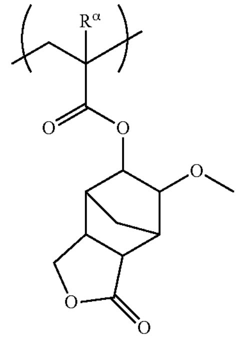

b-L3-4)

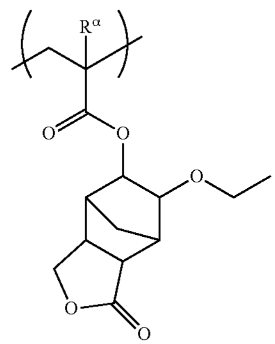

(b-L3-5)

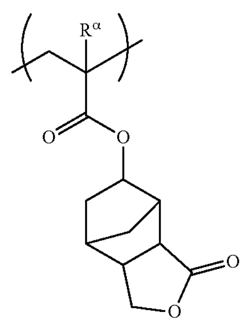

As the constituent unit (b-3a-L), at least one selected from the group consisting of the constituent units represented by the aforementioned formulae (b-L1) to (b-L5) is preferred, and at least one selected from the group consisting of the constituent units represented by the formulae (b-L1) to (b-L3) is more preferred, and at least one selected from the group consisting of the constituent units represented by the aforementioned formula (b-L1) or (b-L3) is particularly preferred. Among these, at least one selected from the group consisting of the constituent units represented by the aforementioned formulae (b-L1-1), (b-L1-2), (b-L2-1), (b-L2-7), (b-L2-12), (b-L2-14), (b-L3-1) and (b-L3-5) is preferred.

Further, as the constituent unit (b-3-L), the constituent units represented by following formulae (b-L6) to (b-L7) are also preferred.

(b-L6)

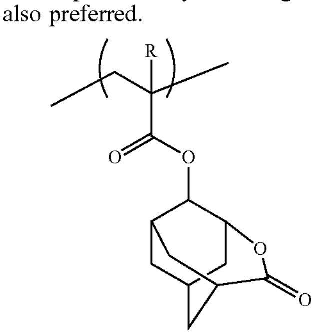

-continued (b-L7)

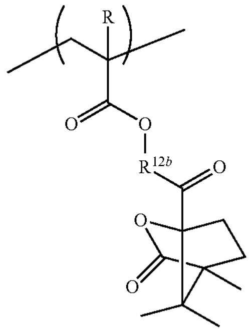

R and $R^{12b}$ in the formulae (b-L6) and (b-L7) are the same as the above.

Further, the acrylic resin (B3) includes constituent units represented by the following formulae (b5) to (b7), having an acid dissociable group, as constituent units that enhance the solubility of the acrylic resin (B3) in alkali under the action of acid.

(b5)

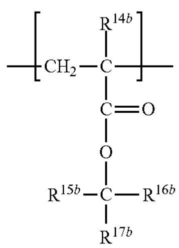

(b6)

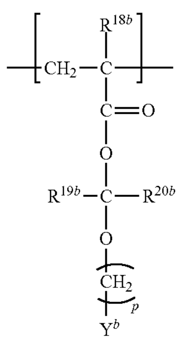

(b7)

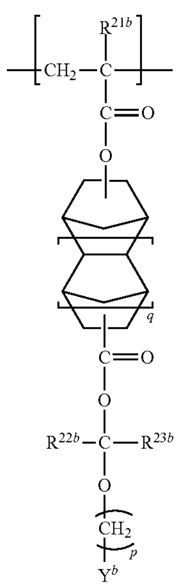

In the above formulae (b5) to (b7), $R^{14b}$ and $R^{18b}$ to $R^{23b}$ each independently represent a hydrogen atom, a linear or branched alkyl group having 1 or more and 6 or less carbon atoms, a fluorine atom, or a linear or branched fluorinated alkyl group having 1 or more and 6 or less carbon atoms; $R^{15b}$ to $R^{17b}$ each independently represent a linear or branched alkyl group having 1 or more and 6 or less carbon atoms, a linear or branched fluorinated alkyl group having 1 or more and 6 or less carbon atoms, or an aliphatic cyclic group having 5 or more and 20 or less carbon atoms, and each independently represent a linear or branched alkyl group having 1 or more and 6 or less carbon atoms, or a linear or branched fluorinated alkyl group having 1 or more and 6 or less carbon atoms; and $R^{16b}$ and $R^{17b}$ may be bonded to each other to form a hydrocarbon ring having 5 or more and 20 or less carbon atoms together with the carbon atom to which both the groups are bonded; $Y^b$ represents an optionally substituted aliphatic group or alkyl group; p is an integer of 0 or more and 4 or less; and q is 0 or 1.

Note here that examples of the linear or branched alkyl group include a methyl group, ethyl group, propyl group, isopropyl group, n-butyl group, isobutyl group, tert-butyl group, pentyl group, isopentyl group, neopentyl group, and the like. Furthermore, the fluorinated alkyl group refers to the abovementioned alkyl groups of which the hydrogen atoms are partially or entirely substituted with fluorine atoms. Specific examples of aliphatic cyclic groups include groups obtained by removing one or more hydrogen atoms from monocycloalkanes or polycycloalkanes such as bicycloalkanes, tricycloalkanes, and tetracycloalkanes. Specifically, groups obtained by removing one hydrogen atom from a monocycloalkane such as cyclopentane, cyclohexane, cycloheptane, or cyclooctane, or a polycycloalkane such as adamantane, norbornane, isobornane, tricyclodecane, or tetracyclododecane may be mentioned. In particular, groups obtained by removing one hydrogen atom from cyclohexane or adamantane (which may further be substituted) are preferred.

When $R^{16b}$ and $R^{17b}$ do not combine with each other to form a hydrocarbon ring, the above $R^{15b}$, $R^{16b}$, and $R^{17b}$ preferably represent a linear or branched alkyl group having 2 or more and 4 or less carbon atoms, for example, from the viewpoints of a high contrast and favorable resolution and depth of focus. The above $R^{19b}$, $R^{20b}$, $R^{22b}$, and $R^{23b}$ preferably represent a hydrogen atom or a methyl group.

The above $R^{16b}$ and $R^{17b}$ may form an aliphatic cyclic group having 5 or more and 20 or less carbon atoms together with a carbon atom to which the both are attached. Specific examples of such an alicyclic group are the groups of monocycloalkanes and polycycloalkanes such as bicycloalkanes, tricycloalkanes and tetracycloalkanes from which one or more hydrogen atoms are removed. Specific examples thereof are the groups of monocycloalkanes such as cyclopentane, cyclohexane, cycloheptane and cyclooctane and polycycloalkanes such as adamantane, norbornane, isobornane, tricyclodecane and tetracyclododecane from which one or more hydrogen atoms are removed. Particularly preferable are the groups of cyclohexane and adamantane from which one or more hydrogen atoms are removed (that may further have a substituent).

Further, in a case where an aliphatic cyclic group to be formed with the above $R^{16b}$ and $R^{17b}$ has a substituent on the ring skeleton thereof, examples of the substituent include a polar group such as a hydroxy group, a carboxyl group, a cyano group and an oxygen atom (=O), and a linear or branched alkyl group having 1 or more and 4 or less carbon atoms. As the polar group, an oxygen atom (=O) is particularly preferred.

The above $Y^b$ is an alicyclic group or an alkyl group; and examples thereof are the groups of monocycloalkanes and polycycloalkanes such as bicycloalkanes, tricycloalkanes and tetracycloalkanes from which one or more hydrogen atoms are removed. Specific examples thereof are the groups of monocycloalkanes such as cyclopentane, cyclohexane, cycloheptane and cyclooctane, and polycycloalkanes such as adamantane, norbornane, isobornane, tricyclodecane and tetracyclododecane from which one or more hydrogen atoms are removed. Particularly preferable is the group of adamantane from which one or more hydrogen atoms are removed (that may further have a substituent).

When the alicyclic group of the above $Y^b$ has a substituent on the ring skeleton, the substituent is exemplified by polar groups such as a hydroxy group, carboxyl group, cyano group and oxygen atom (=O), and linear or branched alkyl groups having 1 or more and 4 or less carbon atoms. The polar group is preferably an oxygen atom (=O) in particular.

When $Y^b$ is an alkyl group, it is preferably a linear or branched alkyl group having 1 or more and 20 or less carbon atoms, and more preferably 6 or more and 15 or less carbon atoms. The alkyl group is an alkoxyalkyl group particularly preferable. Examples of such an alkoxyalkyl group include a 1-methoxyethyl group, 1-ethoxyethyl group, 1-n-propoxyethyl group, 1-isopropoxyethyl group, 1-n-butoxyethyl group, 1-isobutoxyethyl group, 1-tert-butoxyethyl group, 1-methoxypropyl group, 1-ethoxypropyl group, 1-methoxy-1-methylethyl group, 1-ethoxy-1-methylethyl group, and the like.

Preferable specific examples of the constituent unit represented by the above formula (b5) include constituent units represented by the following formulae (b5-1) to (b5-33).

(b5-1)

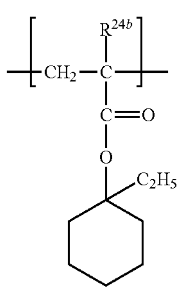

(b5-2)

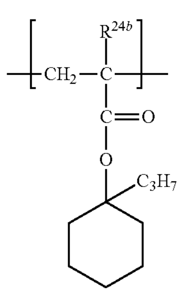

-continued (b5-3)

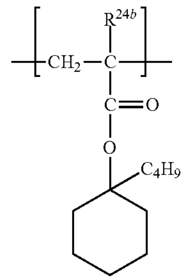

(b5-4)

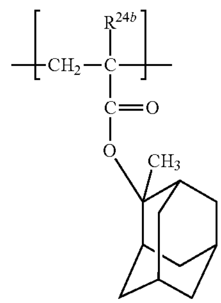

(b5-5)

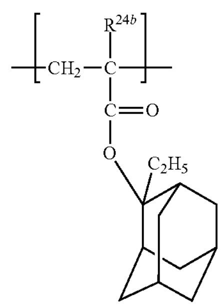

(b5-6)

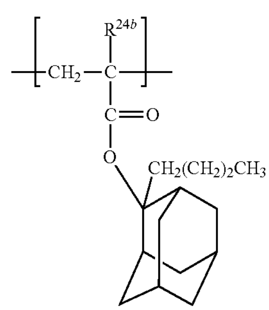

(b5-7)

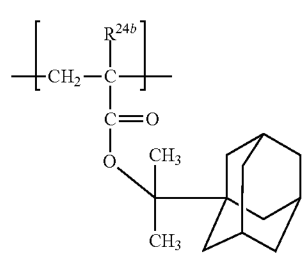

-continued
(b5-8)
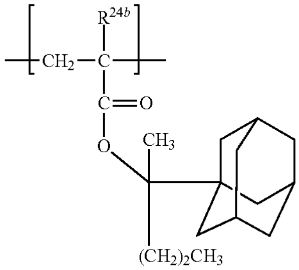
(b5-9)
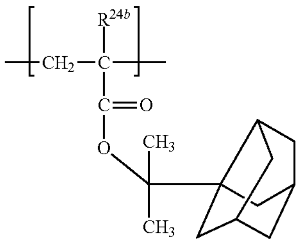
(b5-10)
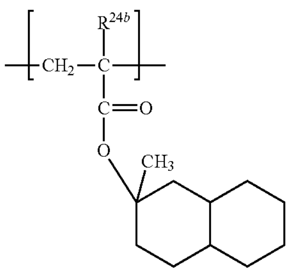
(b5-11)
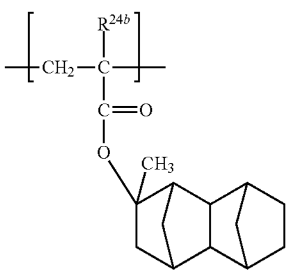
(b5-12)
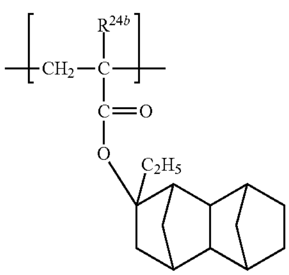
(b5-13)
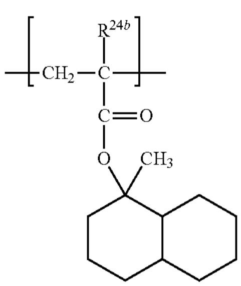
-continued
(b5-14)
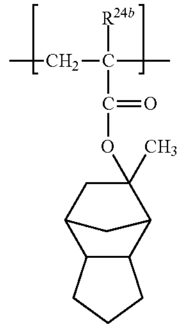
(b5-15)
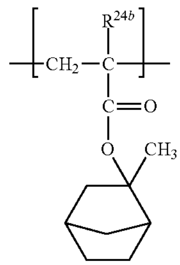
(b5-16)
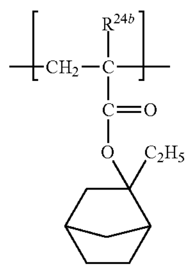
(b5-17)
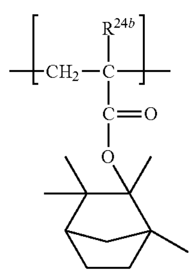
(b5-18)
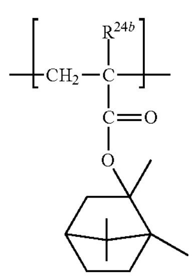

-continued
(b5-19)
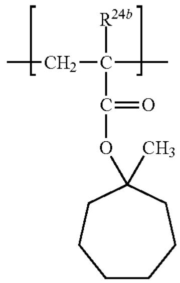
(b5-20)
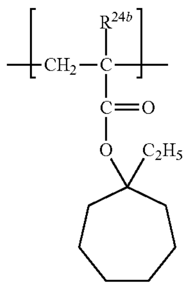
(b5-21)
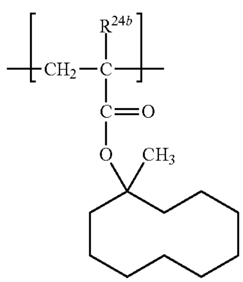
(b5-22)
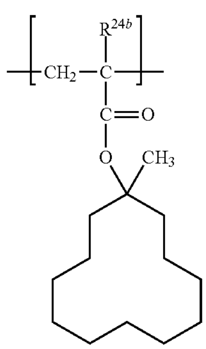
(b5-23)
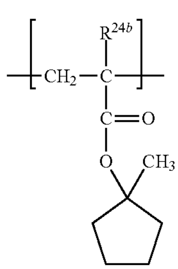
-continued
(b5-24)
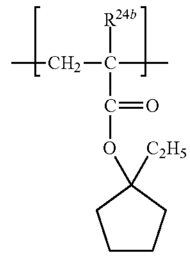
(b5-25)
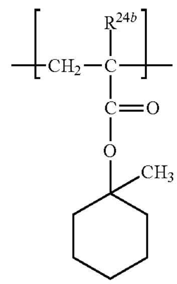
(b5-26)
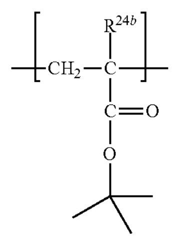
(b5-27)
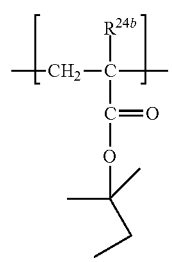
(b5-28)
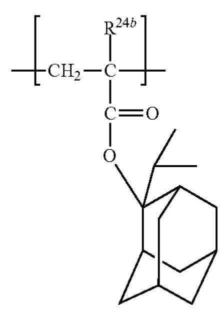
(b5-29)
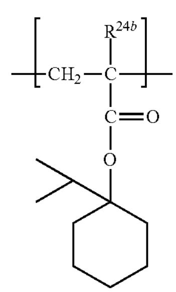

-continued
(b5-30)
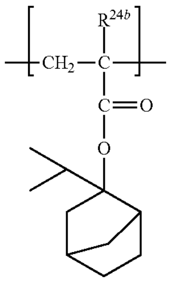
(b5-31)
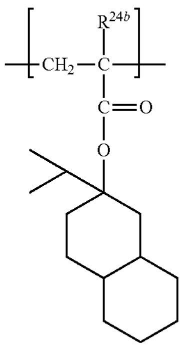
(b5-32)
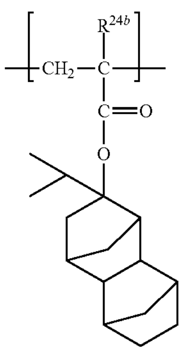
(b5-33)
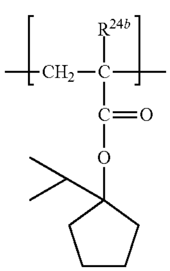
In the above formulae (b5-1) to (b5-33), $R^{24b}$ represents a hydrogen atom or a methyl group.
Preferable specific examples of the constituent unit represented by the above formula (b6) include constituent units represented by the following formulae (b6-1) to (b6-26).
(b6-1)
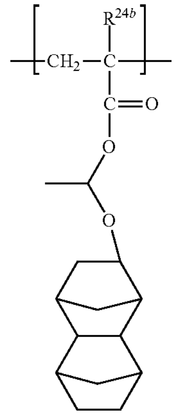
(b6-2)
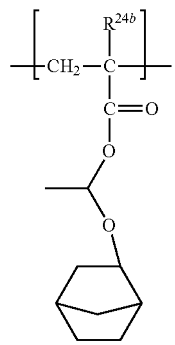
(b6-3)
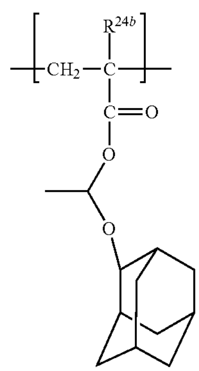
(b6-4)
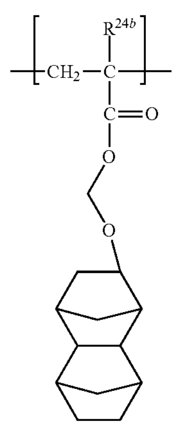

-continued
(b6-5)
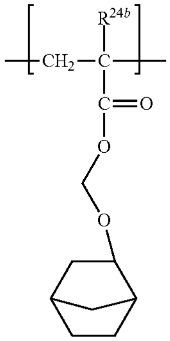
(b6-6)
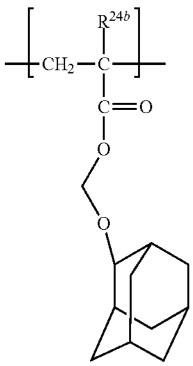
(b6-7)
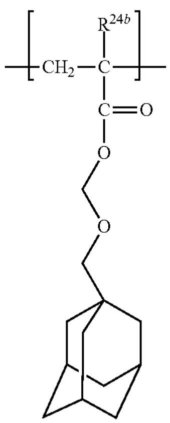
(b6-8)
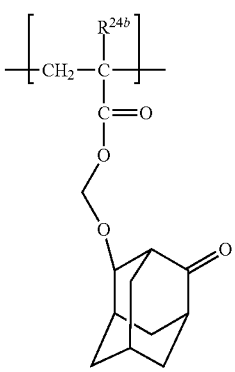
-continued
(b6-9)
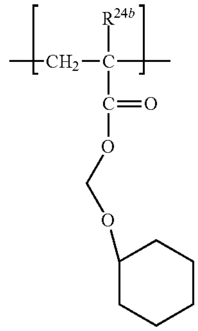
(b6-10)
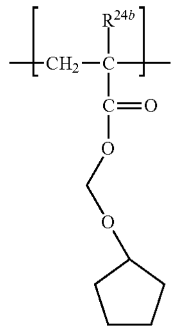
(b6-11)
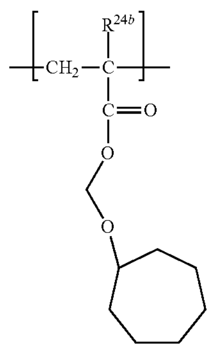
(b6-12)
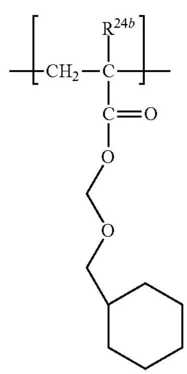

-continued
(b6-13)
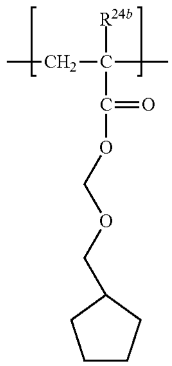
(b6-14)
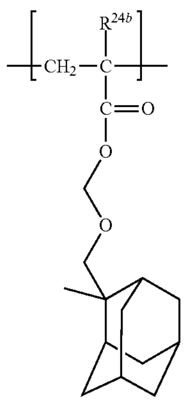
(b6-15)
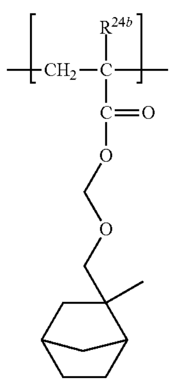
(b6-16)
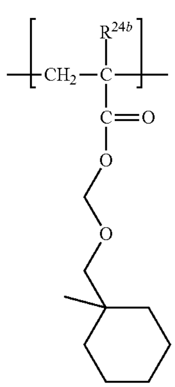
-continued
(b6-17)
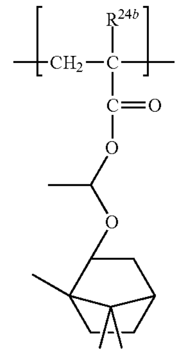
(b6-18)
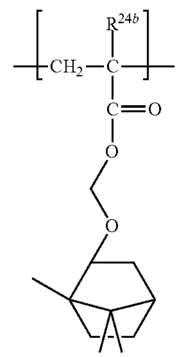
(b6-19)
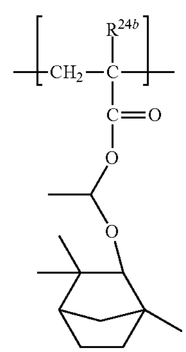
(b6-20)
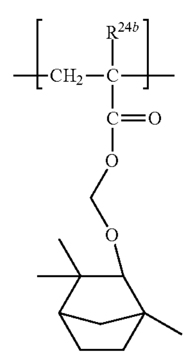

-continued
(b6-21)
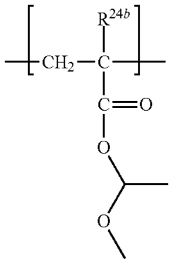
(b6-22)
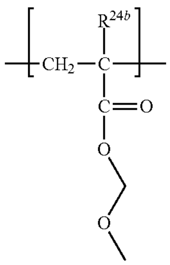
(b6-23)
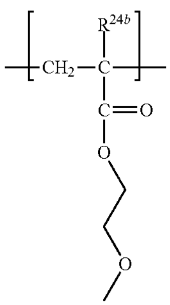
(b6-24)
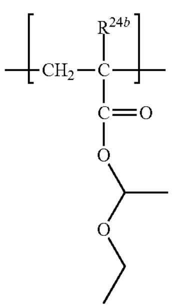
(b6-25)
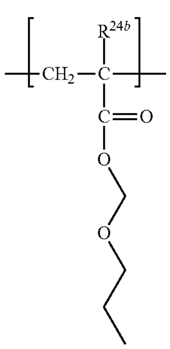
-continued
(b6-26)
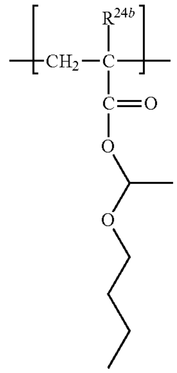
In the above formulae (b6-1) to (b6-26), $R^{24b}$ represents a hydrogen atom or a methyl group.
Preferable specific examples of the constituent unit represented by the above formula (b7) include constituent units represented by the following formulae (b7-1) to (b7-15).
(b7-1)
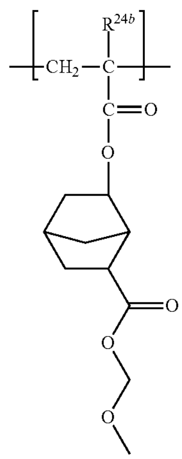
(b7-2)
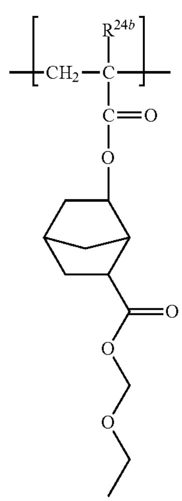

-continued
(b7-3)
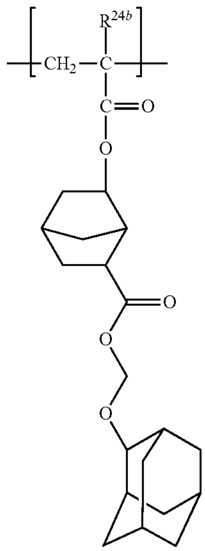
(b7-4)
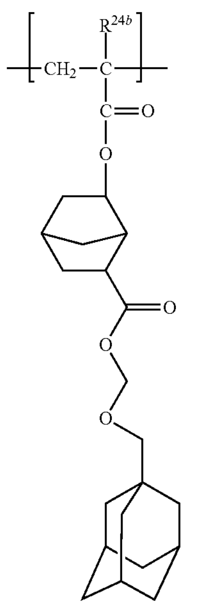
(b7-5)
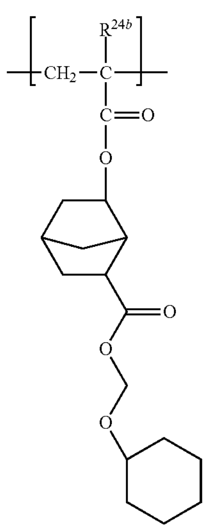
-continued
(b7-6)
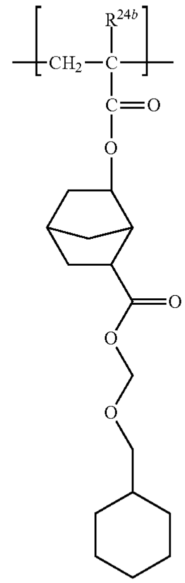
(b7-7)
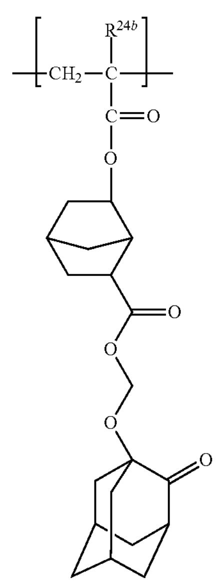

-continued
(b7-8)
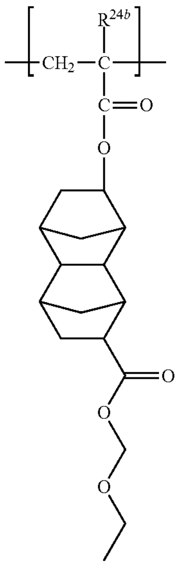
(b7-9)
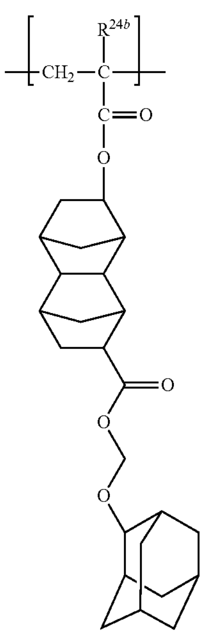
-continued
(b7-10)
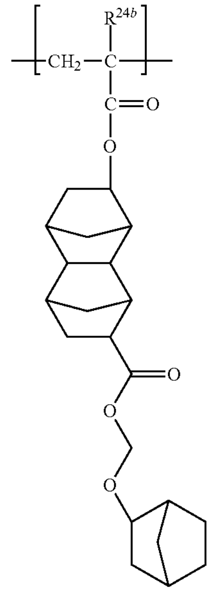
(b7-11)
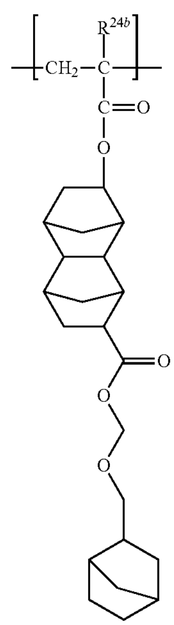

-continued (b7-12)

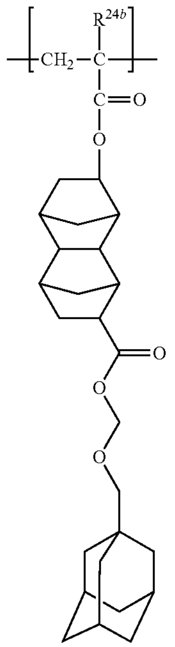

(b7-13)

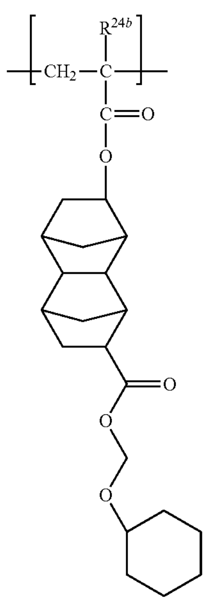

-continued (b7-14)

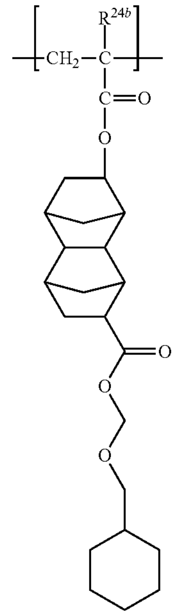

(b7-15)

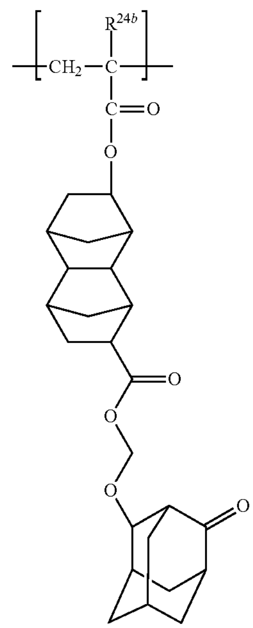

In the above formulae (b7-1) to (b7-15), $R^{24b}$ represents a hydrogen atom or a methyl group.

Among the constituent units represented by the formulae (b5) to (b7) described above, those represented by the formula (b6) are preferred in that they can be easily synthesized and relatively easily sensitized. Further, among the constituent units represented by the formula (b6), those in which $Y^b$ is an alkyl group are preferred, and those in which one or both of $R^{19b}$ and $R^{20b}$ are alkyl groups are preferred.

Further, the acrylic resin (B3) is preferably a resin including a copolymer including a constituent unit derived from a polymerizable compound having an ether bond together with a constituent unit represented by the above formulae (b5) to (b7).

Illustrative examples of the polymerizable compound having an ether bond include radical polymerizable compounds such as (meth)acrylic acid derivatives having an ether bond and an ester bond, and specific examples thereof include 2-methoxyethyl (meth)acrylate, 2-ethoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolyethylene glycol (meth)acrylate, methoxypolypropylene glycol (meth)acrylate, tetrahydrofurfuryl (meth)acrylate, and the like. Also, the above polymerizable compound having an ether bond is preferably, 2-methoxyethyl (meth) acrylate, 2-ethoxyethyl (meth)acrylate, or methoxytriethylene glycol (meth)acrylate. These polymerizable compounds may be used alone, or in combinations of two or more thereof.

Furthermore, the acrylic resin (B3) may include another polymerizable compound as a constituent unit in order to moderately control physical or chemical properties. The polymerizable compound is exemplified by conventional radical polymerizable compounds and anion polymerizable compounds.

Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid, and 2-methacryloyloxyethyl hexahydrophthalic acid; (meth) acrylic acid alkyl esters such as methyl(meth)acrylate, ethyl (meth)acrylate, butyl(meth)acrylate and cyclohexyl(meth) acrylate; (meth)acrylic acid hydroxyalkyl esters such as 2-hydroxyethyl (meth)acrylate and 2-hydroxypropyl (meth) acrylate; (meth)acrylic acid aryl esters such as phenyl (meth) acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; amide bond-containing polymerizable compounds such as acrylamide and methacrylamide; and the like.

As described above, the acrylic resin (B3) may include a constituent unit derived from a polymerizable compound having a carboxy group such as the above monocarboxylic acids and dicarboxylic acids. However, it is preferable that the acrylic resin (B3) does not substantially include a constituent unit derived from a polymerizable compound having a carboxyl group, since a resist pattern including a nonresist portion having a favorable rectangular sectional shape can easily be formed. Specifically, the proportion of a constituent unit derived from a polymerizable compound having a carboxyl group in the acrylic resin (B3) is preferably 20% by mass or less, more preferably 15% by mass or less, and particularly preferably 5% by mass or less. In acrylic resin (B3), acrylic resin including a relatively large amount of constituent unit derived from a polymerizable compound having a carboxy group preferably includes only a small amount of constituent unit derived from a polymerizable compound having a carboxy group or is used in combination with an acrylic resin that does not include this constituent unit.

Furthermore, examples of the polymerizable compound include (meth)acrylic acid esters having a non-acid-dissociable aliphatic polycyclic group, and vinyl group-containing aromatic compounds and the like. As the non-acid-dissociable aliphatic polycyclic group, particularly, a tricyclodecanyl group, an adamantyl group, a tetracyclododecanyl group, an isobornyl group, a norbornyl group, and the like are preferred in view of easy industrial availability and the like. These aliphatic polycyclic groups may have a linear or branched alkyl group having 1 or more and 5 or less carbon atoms as a substituent.

Specific examples of the constituent units derived from the (meth)acrylic acid esters having a non-acid-dissociable aliphatic polycyclic group include constituent units having structures represented by the following formulae (b8-1) to (b8-5).

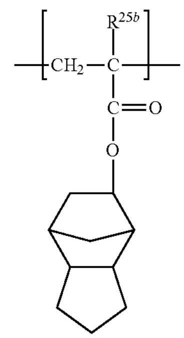

(b8-1)

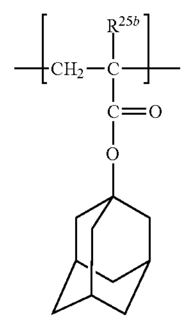

(b8-2)

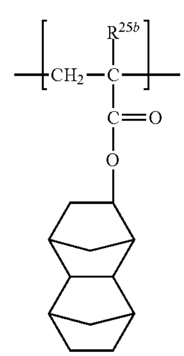

(b8-3)

-continued (b8-4)

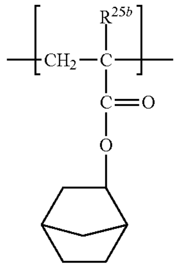

(b8-5)

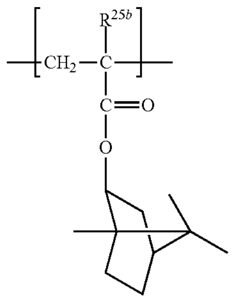

In formulae (b8-1) to (b8-5), $R^{25b}$ represents a hydrogen atom or a methyl group.

When the acrylic resin (B3) includes the constituent unit (b-3) including a —$SO_2$-containing cyclic group or a lactone-containing cyclic group, the content of the constituent unit (b-3) in the acrylic resin (B3) is preferably 5% by mass or more, more preferably 10% by mass or more, and particularly preferably 10% by mass or more and 50% by mass or less, and most preferably 10% by mass or more and 30% by mass or less. In a case where the photosensitive resin composition includes the constituent unit (b-3) having the above-mentioned range of amount, both good developing property and a good pattern shape can be easily achieved simultaneously.

Further, in the acrylic resin (B3), a constituent unit represented by the aforementioned formulae (b5) to (b7) is preferably included in an amount of 5% by mass or more, more preferably 10% by mass or more, and particularly preferably 10% by mass or more and 50% by mass or less.

The acrylic resin (B3) preferably includes the above constituent unit derived from a polymerizable compound having an ether bond. The content of the constituent unit derived from a polymerizable compound having an ether bond in the acrylic resin (B3) is preferably 0% by mass or more and 50% by mass or less, more preferably 5% by mass or more and 30% by mass or less.

The acrylic resin (B3) preferably includes the above constituent unit derived from (meth)acrylic acid esters having a non-acid-dissociable aliphatic polycyclic group. The content of the constituent unit derived from (meth)acrylic acid esters having a non-acid-dissociable aliphatic polycyclic group in the acrylic resin (B3) is preferably 0% by mass or more and 50% by mass or less, and more preferably 5% by mass or more and 30% by mass or less.

As long as the photosensitive resin composition contains a predetermined amount of the acrylic resin (B3), an acrylic resin other than the acrylic resin (B3) described above can also be used as the resin (B). There is no particular limitation for such an acrylic resin other than the acrylic resin (B3) as long as it includes a constituent unit represented by the aforementioned formulae (b5) to (b7).

The mass-average molecular weight of the resin (B) described above in terms of polystyrene is preferably 10000 or more and 600000 or less, more preferably 20000 or more and 400000 or less, and even more preferably 30000 or more and 300000 or less. A mass-average molecular weight within these ranges allows a photosensitive resin layer to maintain sufficient strength without reducing detachability from a substrate, and can further prevent a swelled profile and crack generation when plating.

It is also preferred that the resin (B) has a dispersivity of 1.05 or more. Dispersivity herein indicates a value of a mass average molecular weight divided by a number average molecular weight. A dispersivity in the range described above can avoid problems with respect to stress resistance on intended plating or possible swelling of metal layers resulting from the plating process.

The content of the resin (B) is preferably 5% by mass or more and 60% by mass or less with respect to the total mass of the photosensitive resin composition.

<Mercapto Compound (C)>

The photosensitive resin composition contains at least one type of the mercapto compound (C) represented by the following formula (C). Therefore, when a resist pattern is formed using a photosensitive resin composition, the occurrence of footing is suppressed.

(C)

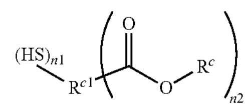

In the formula (C), n1 is an integer of 1 or more and 4 or less, n2 is an integer of 1 or more and 4 or less, $R^{c1}$ is an organic group having a valence of (n1+n2) and the $R^{c1}$ is bonded to a carbonyl group by a C—C bond, and bonded to a mercapto group by a C—S bond, and $R^c$ is a monovalent organic group bonded to an oxygen atom by a C—O bond, and having any one of structures represented by the following formulae (c1) to (c4):

(c1)

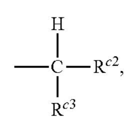

(c2)

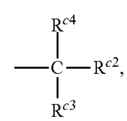

(c3)

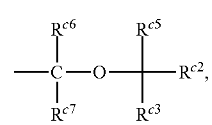

(c4)

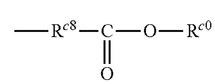

in the group represented by the above-mentioned (c1), $R^{c2}$ and $R^{c3}$ are each independently a hydrogen atom or a monovalent organic group, in a proviso that at least one of $R^{c2}$ and $R^{c3}$ is a monovalent organic group having an aliphatic ring CL including a divalent group represented by —CO—O— in the ring structure, or a monovalent organic group having an aliphatic ring CS including a divalent group represented by $—SO_2—$ in the ring structure, or a monovalent organic group having an aliphatic ring CP including a trivalent group represented by the following formula in the ring structure:

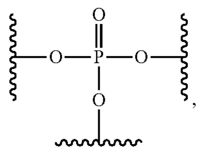 [SMILES: *OP(=O)(O*)O*]

or $R^{c2}$ and $R^{c3}$ are bonded to each other to form an aliphatic ring CL, an aliphatic ring CS, or an aliphatic ring CP; in the group represented by the above formula (c2), $R^{c2}$ and $R^{c3}$ are each independently a hydrogen atom or a monovalent organic group, $R^{c4}$ is a hydrocarbon group, a carbon atom to which $R^{c2}$, $R^{c3}$ and $R^{c4}$ are bonded is a tertiary carbon atom, and $R^3$ and $R^4$ may be bonded to each other to form a ring, in a proviso that at least one of $R^{c2}$ and $R^{c3}$ is a monovalent organic group having an aliphatic ring CA including one or more divalent groups selected from a group consisting of an ether bond, a sulfide bond, and a carbonyl group in the ring structure, a monovalent organic group having an aliphatic ring CH substituted with a hydroxyl group or a hydroxyl group-containing group, a monovalent organic group having an aliphatic ring CL mentioned above as to the formula (c1), a monovalent organic group having an aliphatic ring CS mentioned above as to the formula (c1), or a monovalent organic group having an aliphatic ring CP mentioned above as to the formula (c1), or $R^{c2}$ and $R^{c3}$ are bonded to each other to form an aliphatic ring CA, an aliphatic ring CH, an aliphatic ring CL, an aliphatic ring CS, or an aliphatic ring CP;

in the group represented by the above formula (c3), $R^{c2}$ and $R^{c3}$ are the same as $R^{c2}$ and $R^{c3}$ in the above formula (c2), $R^{c5}$, $R^{c6}$, and $R^{c7}$ are each independently a hydrogen atom, or an alkyl group, and $R^{c5}$ and $R^{c6}$ may be bonded to each other to form a ring, in a proviso that at least one of $R^{c2}$ and $R^{c3}$ is a monovalent organic group having an aliphatic ring CA, a monovalent organic group having an aliphatic ring CH, a monovalent organic group having an aliphatic ring CL, a monovalent organic group having an aliphatic ring CS, or a monovalent organic group having an aliphatic ring CP, or $R^{c2}$ and $R^{c3}$ are bonded to each other to form an aliphatic ring CA, an aliphatic ring CH, an aliphatic ring CL, an aliphatic ring CS, or an aliphatic ring CP;

in the group represented by the above formula (c4), $R^{c8}$ is a divalent organic group, and $R^{c8}$ is bonded to a carbonyl group by a C—C bond, and is bonded to an oxygen atom by a C—O bond, and $R^{c0}$ is an acid dissociable group.

The mercapto compounds represented by the above formula (C) includes a compound represented by the formula (C1), a compound represented by the formula (C2), a compound represented by the formula (C3), and a compound represented by the formula (C4), which are respectively shown below. Hereinafter, the mercapto compound (C) is specifically described taken the compound represented by the formula (C1), the compound represented by the formula (C2), the compound represented by the formula (C3), and the compound represented by the formula (C4) as examples.

(Compound Represented by the Formula (C1))

The compound represented by the following formula (C1) corresponds to a compound represented by the above formula (C), wherein $R^c$ in the formula (C) is a group represented by the above formula (c1).

(C1)

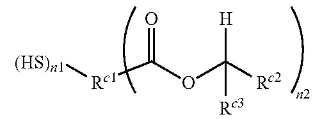

(in the formula (C1), $R^{c1}$ is an organic group having a valence of (n1+n2), and the $R^{c1}$ is bonded to a carbonyl group by a C—C bond, and bonded to a mercapto group by a C—S bond, $R^{c2}$ and $R^{c3}$ are each independently a hydrogen atom or a monovalent organic group, n1 is an integer of 1 or more and 4 or less, and n2 is an integer of 1 or more and 4 or less, in a proviso that at least one of $R^{c2}$ and $R^{c3}$ is a monovalent organic group having an aliphatic ring CL including a divalent group represented by —CO—O— in a ring structure, a monovalent organic group having an aliphatic ring CS including a divalent group represented by $—SO_2—$ in a ring structure, or a monovalent organic group having an aliphatic ring CP including a trivalent group represented by the following formula in the ring structure:

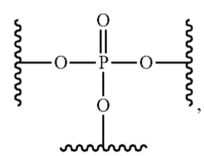

or $R^{c2}$ and $R^{c3}$ are bonded to each other to form an aliphatic ring CL, an aliphatic ring CS, or an aliphatic ring CP). Note here that a group represented by $—CHR^{c2}R^{c3}$ in the formula (C1) is preferably a group that does not leave by an acid generated by the acid generator (A) through exposure.

$R^{c1}$ is an organic group having a valence of (n1+n2). The organic group having a valence of (n1+n2) as $R^{c1}$ may include a hetero atom. However, in the mercapto compound represented by the formula (C1), the $R^{c1}$ is bonded to a carbonyl group by a C—C bond, and bonded to a mercapto group by a C—S bond. In other words, each atomic bonding of the organic group as $R^{c1}$ is bonded to a carbon atom in the organic group, respectively. Furthermore, the divalent organic group may have an unsaturated bond.

Examples of the hetero atom which may be included in the organic group as $R^{c1}$ include a halogen atom, an oxygen atom, a nitrogen atom, a phosphorus atom, and a silicon atom, and the like. The hetero atom may be present in the substituent bonded to a main skeleton of the divalent organic group, and may be present as a part of the bond constituting a divalent organic group.

Examples of the substituent including a hetero atom include a halogen atom, a hydroxyl group, a mercapto group, an alkoxy group, a cycloalkyloxy group, an aryloxy group, an aralkyloxy group, an alkylthio group, a cycloalkylthio group, an arylthio group, an aralkylthio group, an acyl group, an acyloxy group, an acylthio group, an alkoxycarbonyl group, a cycloalkyloxycarbonyl group, an aryloxycarbonyl group, an amino group, an N-monosubstituted amino group, an N,N-disubstituted amino group, a carbamoyl group (—CO—$NH_2$), an N-monosubstituted carbamoyl group, an N,N-disubstituted carbamoyl group, a nitro group, and a cyano group, and the like.

Specific examples of a halogen atom include a fluorine atom, a chlorine atom, a bromine atom, and an iodine atom, and the like.

The number of carbon atoms of the alkoxy group is not particularly limited, but the number is preferably 1 or more and 6 or less, and more preferably 1 or more and 3 or less. The alkoxy group may be linear or may be branched. Specific examples of the alkoxy group include a methoxy group, an ethoxy group, an n-propyloxy group, an isopropyloxy group, an n-butyloxy group, an isobutyloxy group, a sec-butyloxy group, a tert-butyloxy group, an n-pentyloxy group, and an n-hexyloxy group.

The number of carbon atoms of the cycloalkyloxy group is not particularly limited, but the number is preferably 3 or more and 10 or less, and more preferably 3 or more and 8 or less. Specific examples of the cycloalkyloxy group include a cyclopropyloxy group, a cyclobutyloxy group, a cyclopentyloxy group, a cyclohexyloxy group, a cycloheptyloxy group, a cyclooctyloxy group, a cyclononyloxy group, and a cyclodecyloxy group.

The number of carbon atoms of the aryloxy group is not particularly limited, but the number is preferably 6 or more and 20 or less, and more preferably 6 or more and 12 or less. Specific examples of the aryloxy group include a phenoxy group, a naphthalene-1-yloxy group, a naphthalene-2-yloxy group, and a biphenylyloxy group.

The number of carbon atoms of the aralkyloxy group is not particularly limited, but the number is preferably 7 or more and 20 or less, and more preferably 7 or more and 13 or less. Specific examples of the aralkyloxy group include a benzyloxy group, a phenethyloxy group, a naphthalene-1-ylmethoxy group, a naphthalene-2-ylmethoxy group, and the like.

The number of carbon atoms of the acyl group is not particularly limited, but the number is preferably 2 or more and 20 or less, and more preferably 2 or more and 11 or less. The acyl group may be an aliphatic acyl group, or may be an aromatic acyl group including an aromatic group. Specific examples of the acyl group include an acetyl group, a propionyl group, a butanoyl group, a pentanoyl group, a hexanoyl group, an octanoyl group, a nonanoyl group, a decanoyl group, a benzoyl group, a naphthalene-1-yl carbonyl group, and a naphthalene-2-yl carbonyl group.

The number of carbon atoms of the acyloxy group is not particularly limited, but the number is preferably 2 or more and 20 or less, and more preferably 2 or more and 11 or less. The acyloxy group may be an aliphatic acyloxy group, or may be an aromatic acyloxy group including an aromatic group. Specific examples of the acyloxy group include an acetyloxy group, a propionyloxy group, a butanoyloxy group, a pentanoyloxy group, a hexanoyloxy group, an octanoyloxy group, a nonanoyloxy group, a decanoyloxy group, a benzoyloxy group, a naphthalene-1-yl carbonyloxy group, and a naphthalene-2-ylcarbonyloxy group.

Suitable examples of an alkylthio group, a cycloalkylthio group, an arylthio group, an aralkylthio group, and an acylthio group include groups in which an oxygen atom is substituted with a sulfur atom in suitable groups as the alkoxy group, cycloalkoxy group, aryloxy group, aralkyloxy group, and acyloxy group.

The number of carbon atoms of the alkoxycarbonyl group is not particularly limited, but the number is preferably 2 or more and 7 or less, and more preferably 2 or more and 4 or less. The alkoxycarbonyl group may be linear or branched. Specific examples of the alkoxycarbonyl group include a methoxycarbonyl group, an ethoxycarbonyl group, an n-propyloxycarbonyl group, an isopropyloxycarbonyl group, an n-butyloxycarbonyl group, an isobutyloxycarbonyl group, a sec-butyloxycarbonyl group, a tert-butyloxycarbonyl group, an n-pentyloxycarbonyl group, and an n-hexyloxycarbonyl group.

The number of carbon atoms of the cycloalkyloxycarbonyl group is not particularly limited, but the number is preferably 4 or more and 11 or less, and more preferably 4 or more and 9 or less. Specific examples of the cycloalkyloxycarbonyl group include a cyclopropyloxycarbonyl group, a cyclobutyloxycarbonyl group, a cyclopentyloxycarbonyl group, a cyclohexyloxycarbonyl group, a cycloheptyloxycarbonyl group, a cyclooctyloxycarbonyl group, a cyclononyloxycarbonyl group, and a cyclodecyloxycarbonyl group.

The number of carbon atoms of the aryloxycarbonyl group is not particularly limited, but the number is preferably 7 or more and 21 or less, and more preferably 7 or more and 13 or less. Specific examples of the aryloxycarbonyl group include a phenoxycarbonyl group, a naphthalene-1-yloxycarbonyl group, a naphthalene-2-yloxycarbonyl group, and a biphenylyloxycarbonyl group.

In the N-monosubstituted amino group and N,N-disubstituted amino group, the types of substituents bonded to a nitrogen atom are not particularly limited. Suitable examples of the substituents bonded to a nitrogen atom include an alkyl group having 1 or more and 6 or less carbon atoms which may be linear or branched, a cycloalkyl group having 3 or more and 10 or less carbon atoms, an aryl group having 6 or more and 20 or less carbon atoms, an aliphatic acyl group having 2 or more and 7 or less carbon atoms, and an aromatic acyl group having 7 or more and 21 or less carbon atoms. Suitable specific examples of the N-monosubstituted amino group include a methyl amino group, an ethyl amino group, an n-propyl amino group, an isopropyl amino group, an n-butyl amino group, an isobutyl amino group, a sec-butyl amino group, a tert-butyl amino group, an n-pentyl amino group, an n-hexyl amino group, a cyclopropyl amino group, a cyclobutyl amino group, a cyclopentyl amino group, a cyclohexyl amino group, a cycloheptyl amino group, a cyclooctyl amino group, a cyclononyl amino group, a cyclodecyl amino group, a phenyl amino group, a naphthalene-1-yl amino group, a naphthalene-2-yl amino group, a biphenylyl amino group, an acetyl amino group, a propionyl amino group, a butanoyl amino group, a pentanoyl amino group, a hexanoyl amino group, an octanoyl amino group, a nonanoyl amino group, a decanoyl amino group, a benzoyl amino group, a naphthalene-1-yl carbonyl amino group, and a naphthalene-2-yl carbonyl amino group. Suitable examples of the N,N-disubstituted amino group include a dimethyl amino group, a diethyl amino group, a di-n-propyl amino group, a diisopropyl amino group, a di-n-butyl amino group, a diisobutyl amino group, a di-sec-butyl amino group, a di-tert-butyl amino group, a di-n-pentyl amino group, a di-n-hexyl amino group, a dicyclopentyl amino group, a dicyclohexyl amino group, a diphenyl amino group, a diacetyl amino group, a dipropionyl amino group, and a dibenzoyl amino group.

In the N-monosubstituted carbamoyl group and N,N-disubstituted carbamoyl group, the types of substituents bonded to a nitrogen atom are not particularly limited. Suitable examples of the substituents bonded to a nitrogen atom are the same as those descried as to the N-monosubstituted amino group and N,N-disubstituted amino group. Suitable specific examples of the N-monosubstituted amino carbamoyl group include an N-methyl carbamoyl group, an N-ethyl carbamoyl group, an N-n-propylcarbamoyl group, an N-isopropyl carbamoyl group, an N-n-butylcarbamoyl group, an N-isobutylcarbamoyl group, an N-sec-butylcarbamoyl group, an N-tert-butylcarbamoyl group, an N-n-pentyl carbamoyl group, an N-n-hexylcarbamoyl group, an N-cyclopropylcarbamoyl group, an N-cyclobutylcarbamoyl group, an N-cyclopentyl carbamoyl group, an N-cyclohexylcarbamoyl group, an N-cycloheptylcarbamoyl group, an N-cyclooctylcarbamoyl group, an N-cyclononylcarbamoyl group, an N-cyclodecylcarbamoyl group, an N-phenylcarbamoyl group, an N-naphthalene-1-ylcarbamoyl group, an N-naphthalene-2-ylcarbamoyl group, an N-biphenylylcarbamoyl group, an N-acetylcarbamoyl group, an N-propionylcarbamoyl group, an N-butanoylcarbamoyl group, an N-pentanoylcarbamoyl group, an N-hexanoylcarbamoyl group, an N-octanoylcarbamoyl group, an N-nonanoylcarbamoyl group, an N-decanoylcarbamoyl group, an N-benzoyl carbamoyl group, an N-naphthalene-1-yl carbonyl carbamoyl group, and an N-naphthalene-2-yl carbonyl carbamoyl group. Suitable examples of the N,N-disubstituted carbamoyl group include an N,N-dimethyl carbamoyl group, an N,N-diethyl carbamoyl group, an N,N-di-n-propylcarbamoyl group, an N,N-di isopropyl carbamoyl group, an N,N-di-n-butylcarbamoyl group, an N,N-diisobutylcarbamoyl group, an N,N-di-sec-butylcarbamoyl group, an N,N-di-tert-butylcarbamoyl group, an N,N-di-n-pentyl carbamoyl group, an N,N-di-n-hexyl carbamoyl group, an N,N-dicyclopentyl carbamoyl group, an N,N-dicyclohexyl carbamoyl group, an N,N-diphenylcarbamoyl group, an N,N-diacetylcarbamoyl group, an N,N-dipropionylcarbamoyl group, and an N,N-dibenzoyl carbamoyl group.

In $R^{c1}$, specific examples of the bonds which may be included in the organic group having a valence of (n1+n2) and which include a hetero atom include an ether bond, a thioether bond, a carbonyl bond, a thiocarbonyl bond, an ester bond, an amide bond, an urethane bond, an imino bond (—N═C(—R)—, —C(═NR)—: R represents a hydrogen atom or an organic group), a carbonate bond, a sulfonyl bond, a sulfinyl bond, an azo bond, and the like.

$R^{c1}$ is preferably a hydrocarbon group having 1 or more and 20 or less carbon atoms, more preferably a saturated aliphatic hydrocarbon group having 1 or more and 20 or less carbon atoms, or an aromatic hydrocarbon group having 6 or more and 20 or less carbon atoms, further preferably a saturated aliphatic hydrocarbon group having 1 or more and 20 or less carbon atoms, particularly preferably a saturated aliphatic hydrocarbon group having 1 or more and 10 or less carbon atoms, and most preferably a saturated aliphatic hydrocarbon group having 1 or more and 6 or less carbon atoms. When $R^{c1}$ is a saturated aliphatic hydrocarbon group, the saturated aliphatic hydrocarbon group may be linear or branched, and is preferably linear.

When $R^{c1}$ is an aromatic hydrocarbon group, an aromatic hydrocarbon group is preferably a divalent aromatic hydrocarbon group because the compound represented by the formula (C1) can be easily synthesized and obtained. Suitable specific examples of the divalent aromatic hydrocarbon group for $R^{c1}$ include a p-phenylene group, an m-phenylene group, a p-phenylene group, a naphthalene-2,6-diyl group, a naphthalene-2,7-diyl group, a naphthalene-1,4-diyl group, and a biphenyl-4,4'-diyl group. Among them, a p-phenylene group, an m-phenylene group, a naphthalene-2,6-diyl group, and a biphenyl-4,4'-diyl group are preferable, and a p-phenylene group, a naphthalene-2,6-diyl group, and a biphenyl-4,4'-diyl group are more preferable.

When $R^{c1}$ is a saturated aliphatic hydrocarbon group, a saturated aliphatic hydrocarbon group is preferably an alkylene group because the compound represented by the formula (C1) can be easily synthesized and obtained. Suitable specific examples of the alkylene group for $R^{c1}$ include a methylene group, an ethane-1,2-diyl group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, and a decane-1,10-diyl group. Among them, a methylene group, an ethane-1,2-diyl group, a propane-1,3-diyl group, a butane-1,4-diyl group, a pentane-1,5-diyl group, and a hexane-1,6-diyl group are preferable, and a methylene group, an ethane-1,2-diyl group, and a propane-1,3-diyl group are more preferable, and a methylene group, and an ethane-1,2-diyl group are most preferable.

In the formula (C1), at least one of $R^{c2}$ and $R^{c3}$ is a monovalent organic group having an aliphatic ring CL including a divalent group represented by —CO—O— in the ring structure, or a monovalent organic group having an aliphatic ring CS including a divalent group represented by —$SO_2$— in the ring structure, or a monovalent organic group having an aliphatic ring CP including a trivalent group represented by the following formula:

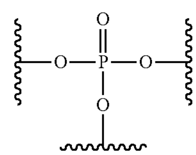 [SMILES: *OP(=O)(O*)O*]

or $R^{c2}$ and $R^{c3}$ are bonded to each other to form an aliphatic ring CL, an aliphatic ring CS, or an aliphatic ring CP.

In formula (C1), when at least one of $R^{c2}$ and $R^{c3}$ is the above-mentioned monovalent organic group having an aliphatic ring CL, or when $R^{c2}$ and $R^{c3}$ are bonded to each other to form an aliphatic ring CL, suitable examples of the monovalent organic group having an aliphatic ring CL or a cyclic group including an aliphatic ring CL represented by —$CHR^{c2}R^{c3}$ include the following formulae (c1-L1) to (c1-L7) included in the above-mentioned formulae (b-L1) to (b-L7).

(c1-L1)

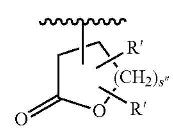

(c1-L2)

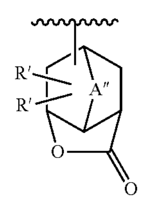

(c1-L3)

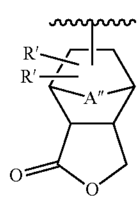

-continued (c1-L4)

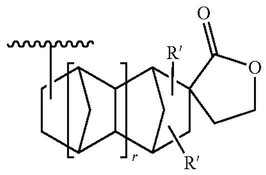

(c1-L5)

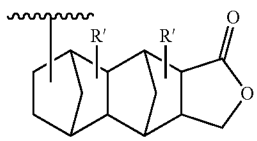

(c1-L6)

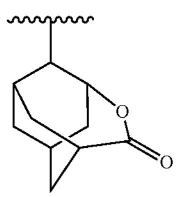

(c1-L7)

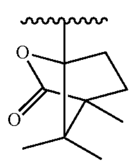

(In the formulae (c1-L1) to (c1-L7), R', s", A", and r are the same as those described in the formulae (b-L1) to (b-L7).)

Note here that the monovalent organic group having an aliphatic ring CL, or a cyclic group including an aliphatic ring CL represented by —$CHR^{c2}R^{c3}$ may be groups other than the groups represented by the following formulae (C1-2-1) to (C1-2-5).

(C1-2-1)

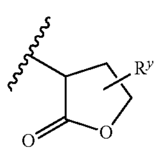

(C1-2-2)

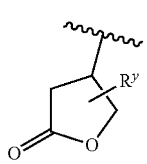

(C1-2-3)

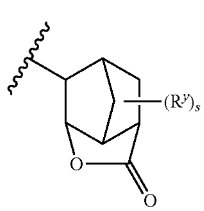

-continued (C1-2-4)

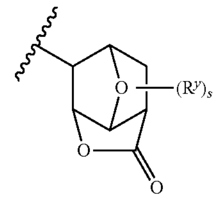

(C1-2-5)

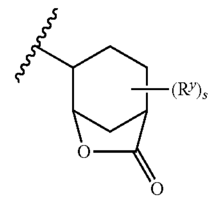

(in the following formulae (C1-2-1) to (C1-2-5), $R^y$ is a hydrogen atom, a methyl group, or an ethyl group, and s is 1 or 2).

When at least one of $R^{c2}$ and $R^{c3}$ is the above-mentioned monovalent organic group having an aliphatic ring CL, or when $R^{c2}$ and $R^{c3}$ are bonded to each other to form an aliphatic ring CL, suitable specific examples of the monovalent organic group having an aliphatic ring CL, or a cyclic group including an aliphatic ring CL represented by —$CHR^{c2}R^{c3}$ are shown below. However, among the following groups, a group in which the atomic bonding is bonded to a tertiary carbon atom is removed from the examples of the cyclic group including an aliphatic ring CL represented by —$CHR^{c2}R^{c3}$.

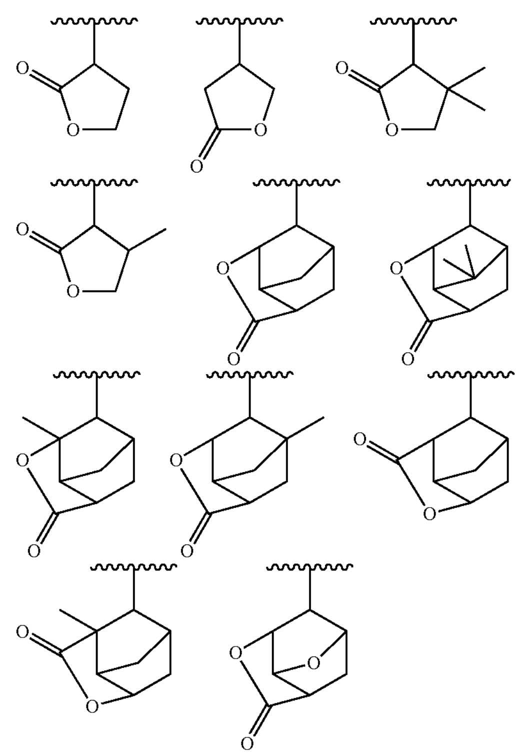

-continued

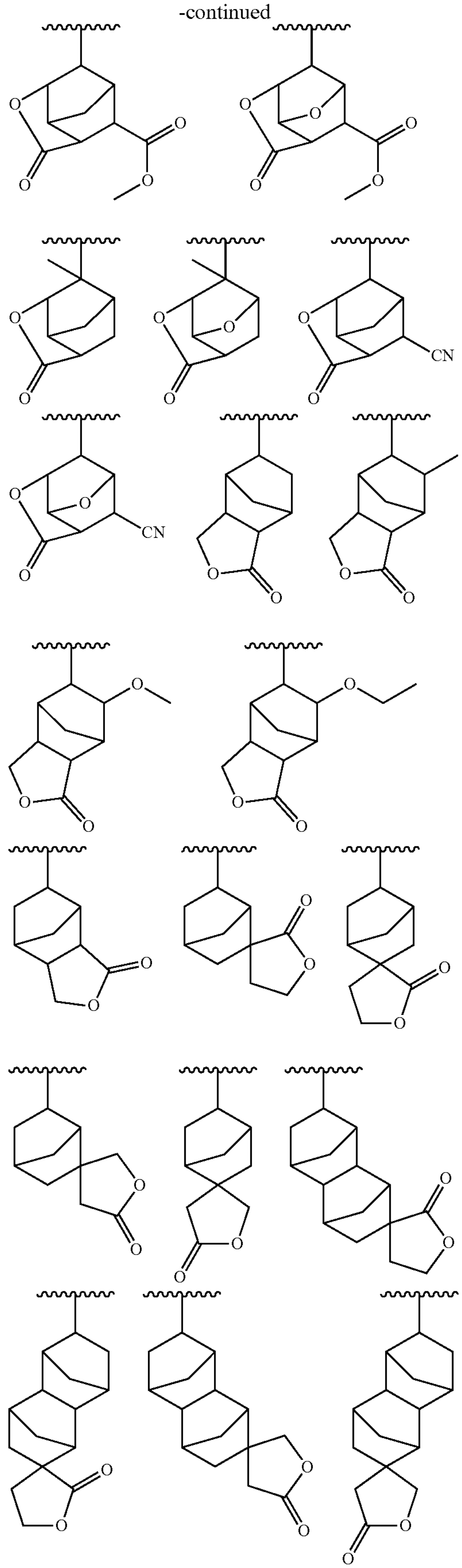

-continued

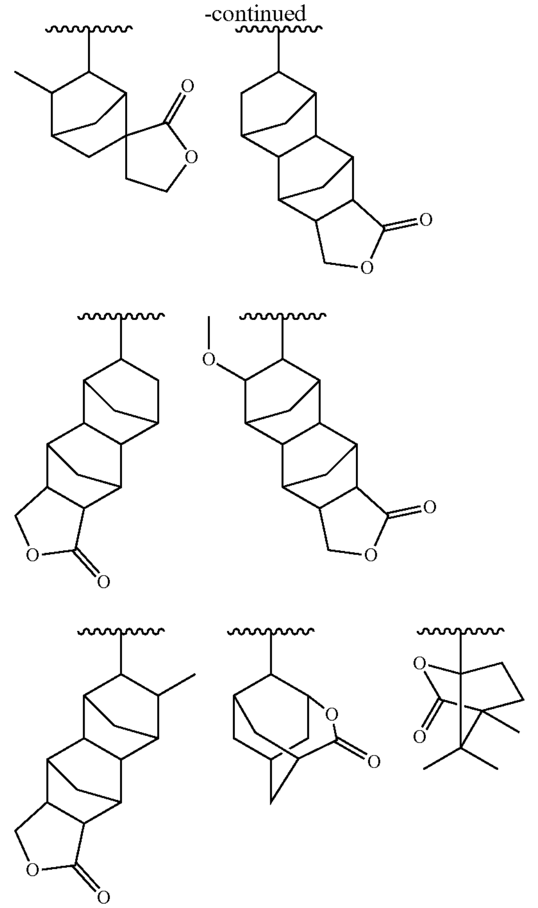

When at least one of $R^{c2}$ and $R^{c3}$ is the above-mentioned monovalent organic group having an aliphatic ring CS, or when $R^{c2}$ and $R^{c3}$ are bonded to each other to form an aliphatic ring CS, suitable specific examples of the monovalent organic group having an aliphatic ring CS or a cyclic group including an aliphatic ring CS represented by $—CHR^{c2}R^{c3}$ include groups represented by the above-mentioned formulae (3-1) to (3-4).

(3-1)

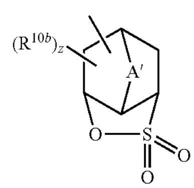

(3-2)

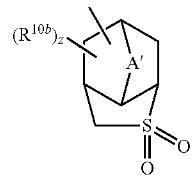

(3-3)

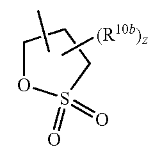

-continued

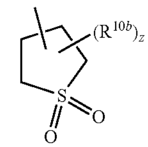

(3-4)

(In the formulae (3-1) to (3-4), definitions of abbreviations are the same as mentioned above.)

When at least one of $R^{c2}$ and $R^{c3}$ is the above-mentioned monovalent organic group having an aliphatic ring CS, or when $R^{c2}$ and $R^{c3}$ are bonded to each other to form an aliphatic ring CS, suitable specific examples of the monovalent organic group having an aliphatic ring CS or a cyclic group including an aliphatic ring CS represented by —$CHR^{c2}R^{c3}$ are described as follows. However, in the following groups, a group in which an atomic bonding is bonded to the tertiary carbon atom is removed from examples of the cyclic group including an aliphatic ring CS represented by —$CHR^{c2}R^{c3}$.

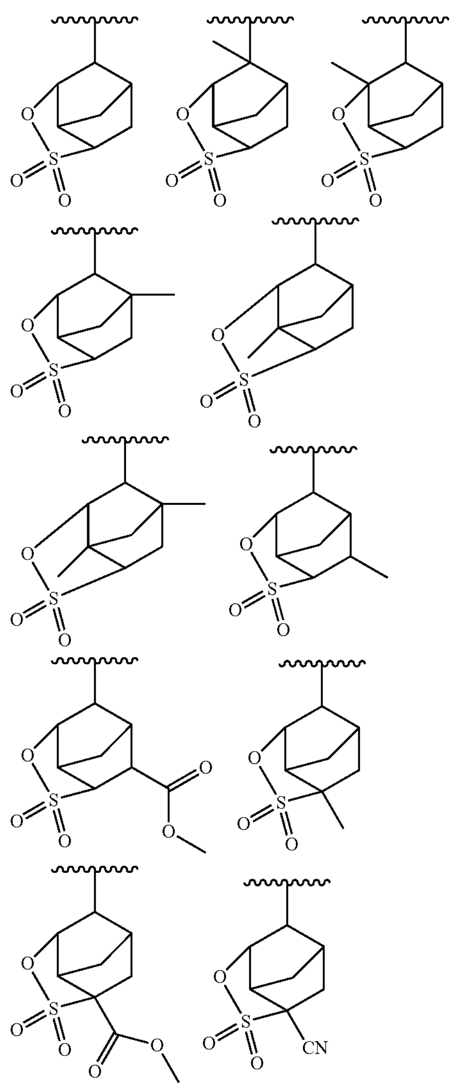

-continued

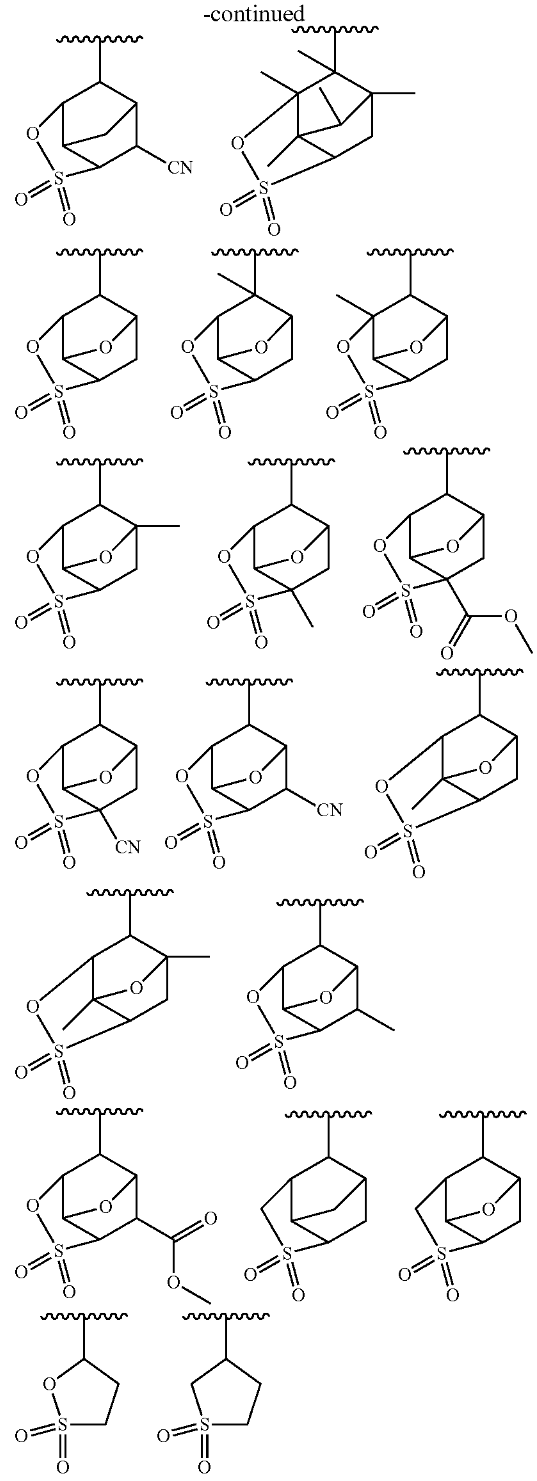

When at least one of $R^{c2}$ and $R^{c3}$ is the above-mentioned monovalent organic group having an aliphatic ring CP, the examples of the monovalent organic group having an aliphatic ring CP include groups represented by the following formula (C-P1). Furthermore, when $R^{c2}$ and $R^{c3}$ are bonded to each other to form an aliphatic ring CP, suitable examples of a cyclic group including the aliphatic ring CP represented by —$CHR^{c2}R^{c3}$ include groups represented by the following formula (C-P2).

(C-P1)

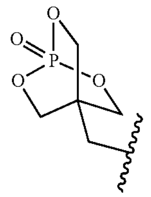

(C-P2)

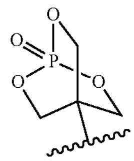

In the formula (C1), $R^{c2}$ and $R^{c3}$ are each independently a monovalent organic group. When $R^{c2}$ and $R^{c3}$ are not any one of the monovalent organic group having an aliphatic ring CL, the monovalent organic group having an aliphatic ring CS, and the monovalent organic group having an aliphatic ring CP, and $R^{c2}$ and $R^{c3}$ are not bonded to each other to form an aliphatic ring CL, an aliphatic ring CS, or an aliphatic ring CP, the $R^{c2}$ and $R^{c3}$ are preferably an optionally substituted hydrocarbon group, respectively. Substituents which the hydrocarbon group may have are preferably the same as substituents which a divalent hydrocarbon group of $R^{c1}$ may have.

As the hydrocarbon group as $R^{c2}$ and $R^{c3}$, an alkyl group, an alkenyl group, or an aromatic hydrocarbon group is preferable. The alkyl group may be linear or branched. The number of carbon atoms of the alkyl group is preferably 1 or more and 6 or less. Suitable examples of the alkyl group include a methyl group, an ethyl group, an n-propyl group, an isopropyl group, an n-butyl group, an isobutyl group, a sec-butyl group, a tert-butyl group, an n-pentyl group, and an n-hexyl group. The alkenyl group may be linear or branched. The number of carbon atoms of the alkenyl group is preferably 2 or more and 6 or less. Suitable examples of the alkenyl group include a vinyl group, an allyl group (2-propenyl group), a 3-butenyl group, a 4-pentenyl group, and a 5-hexenyl group. The number of carbon atoms of the aromatic hydrocarbon group is preferably 6 or more and 20 or less, and more preferably 6 or more and 12 or less. Suitable examples of the aromatic hydrocarbon group include a phenyl group, a naphthalene-1-yl group, and a naphthalene-2-yl group.

As the hydrocarbon group as $R^{c2}$ and $R^{c3}$, among the above-described groups, a methyl group, an ethyl group, an n-propyl group, an isopropyl group, an n-butyl group, an n-pentyl group, an n-hexyl group, a vinyl group, an allyl group, and a phenyl group are preferable, and a methyl group, an ethyl group, an n-propyl group, an isopropyl group, a vinyl group, and a phenyl group are more preferable.

A method of manufacturing a mercapto compound represented by the formula (C1) is not particularly limited, but, for example, it can be synthesized according to the following scheme 1. Specifically, firstly, a mercapto group in the carboxylic acid compound having the mercapto group represented by the following formula (C1-a) is selectively protected by a protecting group $X^c$ to obtain a carboxylic acid compound represented by the following formula (C1-b). Examples of the mercapto group protected by the protecting group $X^c$ include groups having the structure represented by the following formulae (X-1) to (X-3).

$$R^{x1}—S—S— \quad (X\text{-}1)$$

$$R^{x1}—(C{=}O)—S— \quad (X\text{-}2)$$

$$R^{x1}—S—CR^{x2}R^{x3}—S— \quad (X\text{-}3)$$

$R^{x1}$ is a hydrocarbon group. $R^{x2}$ and $R^{x3}$ are each independently a hydrogen atom or a hydrocarbon group. As the hydrocarbon group, an alkyl group and an aryl group are preferable. As the alkyl group, an alkyl group having 1 or more and 6 or less carbon atoms is preferable, an alkyl group having 1 or more 4 or less carbon atoms is more preferable, and a methyl group and an ethyl group are particularly preferable. As the aryl group, an aryl group having 6 or more 20 or less carbon atoms is preferable, an aryl group having 6 or more and 12 or less carbon atoms is more preferable, and a phenyl group, a naphthalene-1-yl group, and a naphthalene-2-yl group are further preferable, and a phenyl group is particularly preferable. As the protecting group $X^c$, in view of easiness in protection and deprotection, a group represented by $R^{x1}$—(C═O)— is preferable, an aliphatic acyl group is more preferable, an acetyl group, or a propionyl group is particularly preferable, and an acetyl group is the most preferable.

Then, an ester compound represented by the formula (C1-d) is obtained from a carboxylic acid compound represented by the formula (C1-b) and alcohol represented by the following formula (C1-c). An esterification method is not particularly limited. Suitable examples of the esterification method include a method of allowing a carbodiimide compound as a condensing agent to act in the presence of a small amount of N,N-dimethyl-4-aminopyridine, and condensing the carboxylic acid compound represented by the formula (C1-b) and alcohol represented by the formula (C1-c). Furthermore, the carboxylic acid compound represented by the formula (C1-b) may be reacted with halogenating agents such as thionyl chloride and phosphorus trichloride to generate carboxylic acid halide, followed by reacting the carboxylic acid halide with alcohol represented by the formula (C1-c).

In the obtained ester compound represented by the formula (C1-d), by deprotecting the protecting group $X^c$, the mercapto compound represented by the formula (C1) is obtained. A deprotection method is not particularly limited, and it can be appropriately selected depending on types of the protecting group $X^c$.

<Scheme 1>

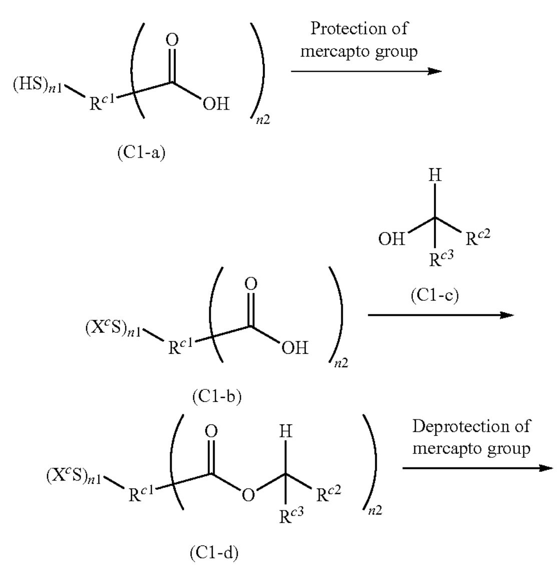

-continued

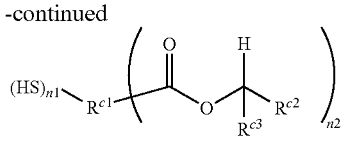

(C1)

In the mercapto compound represented by the formula (C1), when n1 is 1, the compound represented by the formula (C1) can be favorably synthesized also by, for example, the following scheme 2. In the method described in the scheme 2, a symmetrical polycarboxylic acid compound represented by the following formula (C1-e) and having a disulfide bond in the middle thereof is used as a raw material. Firstly, a polycarboxylic acid compound represented by the formula (C1-e) is reacted with alcohol represented by the formula (C1-c) to obtain an ester compound represented by the formula (C1-f). This esterification reaction is carried out similar to the reaction between a carboxylic acid compound represented by the formula (C1-b) and alcohol represented by the formula (C1-c) in the scheme 1.

Next, by cleaving a disulfide bond in the ester compound represented by the formula (C1-f), a mercapto compound represented by the formula (c1-g) is generated as a compound represented by the formula (C1) in which n1 is 1. A method of cleaving a disulfide bond is not particularly limited. Suitable methods include a method of reacting the ester compound represented by the formula (C1-f) with a base such as triethylamine and dithiothreitol.

Note here that in the formulae (C1-a) to (C1-g) shown in the schemes 1 and 2, $R^{c1}$, $R^{c2}$, $R^{c3}$, n1, and n2 are the same as those in the formula (C1).

<Scheme 2>

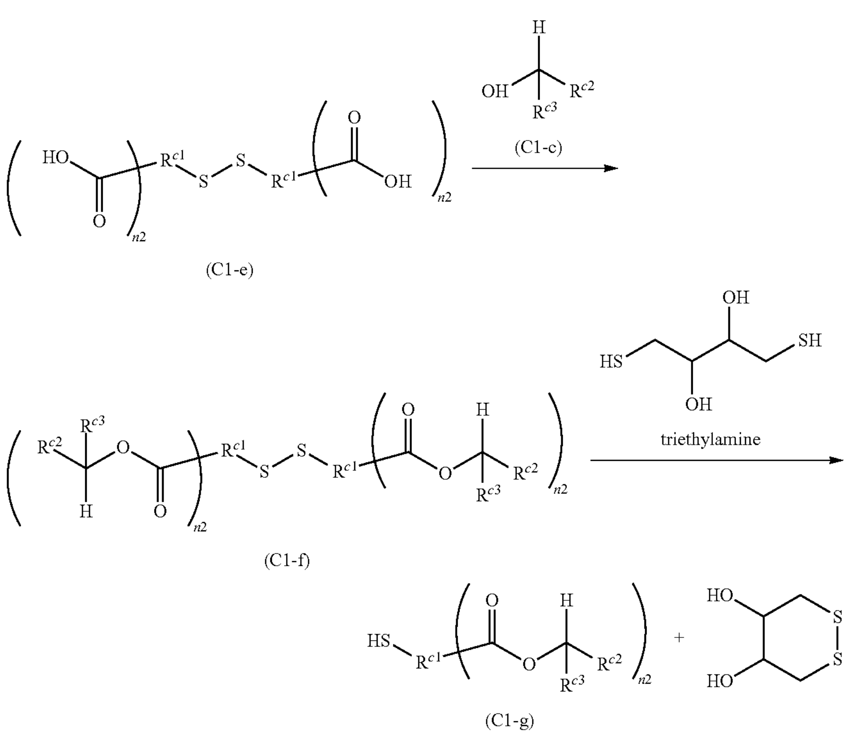

(C1-c) (C1-e) (C1-f) (C1-g)

As the above-described mercapto compound represented by the formula (C1), compounds of the following formulae are preferable. Note here that in the following formula, $R^x$ is a cyclic group represented by $—CHR^{c2}R^{c3}$, and including an aliphatic ring CL, an aliphatic ring CS, or an aliphatic ring CP. In $R^x$, $R^{c2}$ and $R^{c3}$ are bonded to each other to form a ring.

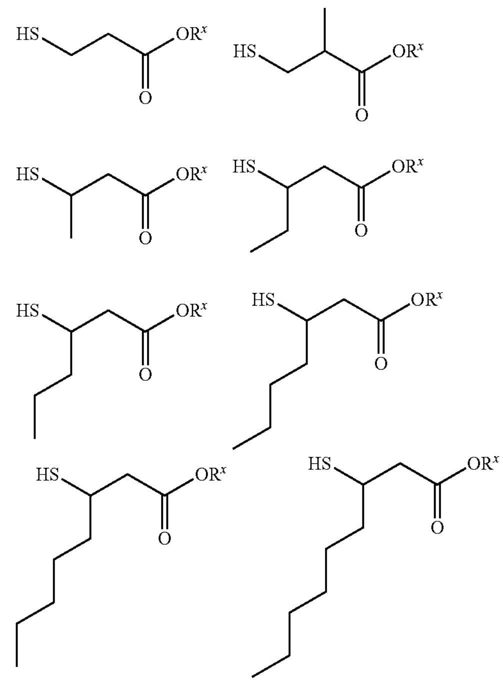

-continued

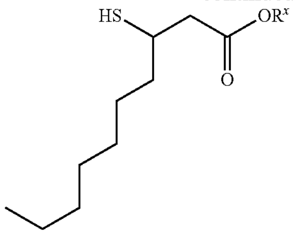

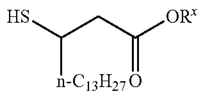

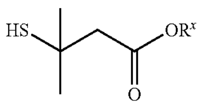

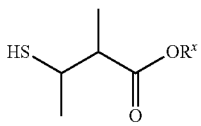

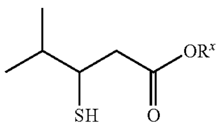

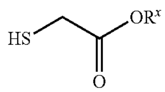

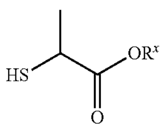

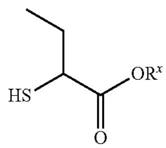

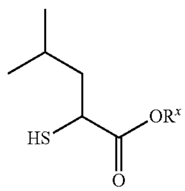

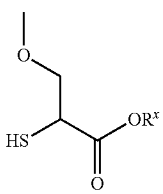

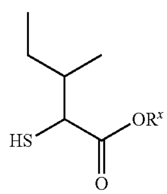

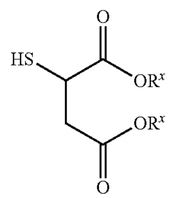

Specific suitable examples of the mercapto compound represented by the formula (C1) are shown below.

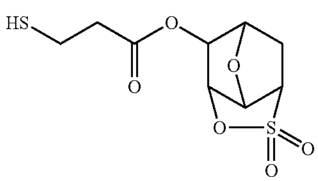

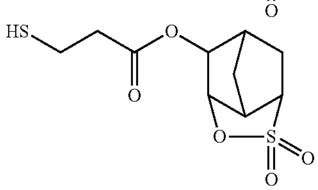

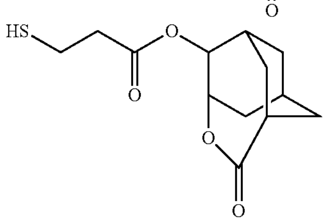

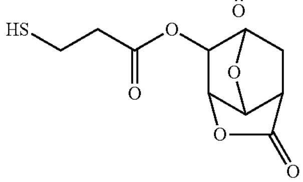

-continued

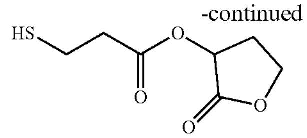

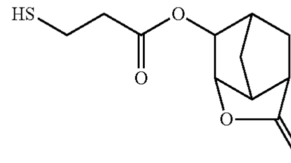

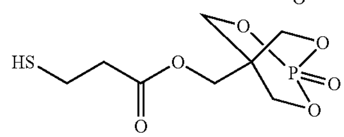

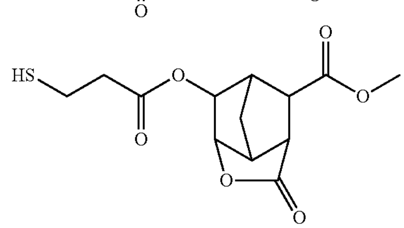

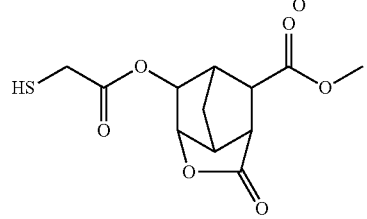

Furthermore, as mentioned above, an ester compound represented by the following formula (C1-d), and an ester compound having a disulfide bond represented by the formula (C1-f) are preferably used as an intermediate product of the compound represented by the formula (C1).

(C1-d)

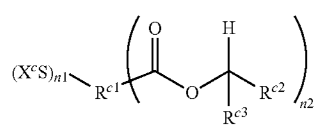

(In the formula (C1-d), $R^{c1}$, $R^{c2}$, $R^{c3}$, n1, and n2 are the same as those in the formula (C1), $X^c$ is a protecting group for a mercapto group.)

(C1-f)

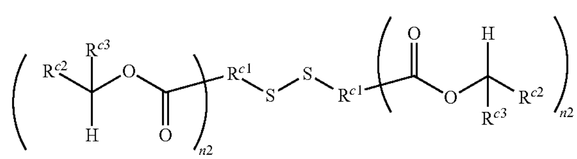

(In the formula (C1-f), $R^{c1}$ is an organic group having a valence of (1+n2), the $R^{c1}$ is bonded to a carbonyl group by a C—C bond and bonded to a sulfur atom by a C—S bond, and $R^{c2}$, $R^{c3}$, and n2 are the same as those in the formula (C1).)

As the protecting group $X^c$ in the formula (C1-d), as mentioned above, from the viewpoint of easiness in protection and deprotection, a group represented by $R^{x1}$—(C═O)— is preferable, an aliphatic acyl group is more preferable, an acetyl group or a propionyl group is particularly preferable, and an acetyl group is most preferable. Suitable specific examples of the compound represented by the formula (C1-d) include the following compounds.

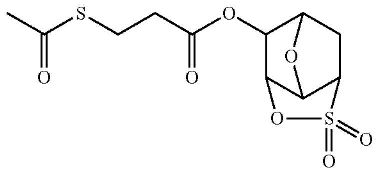

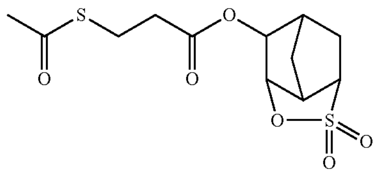

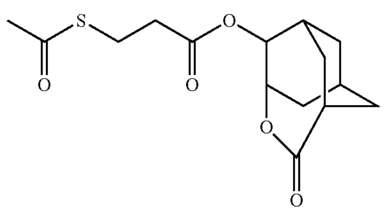

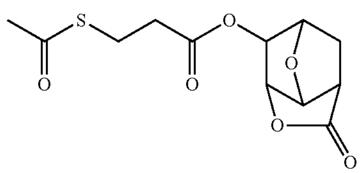

-continued

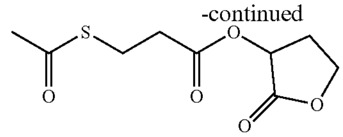

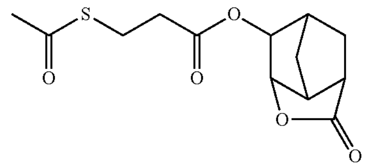

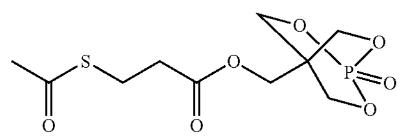

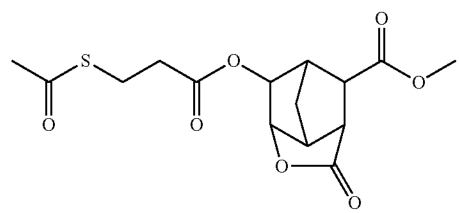

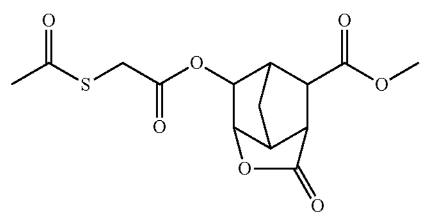

Suitable specific examples of the compound represented by the formula (C1-f) include the following compounds.

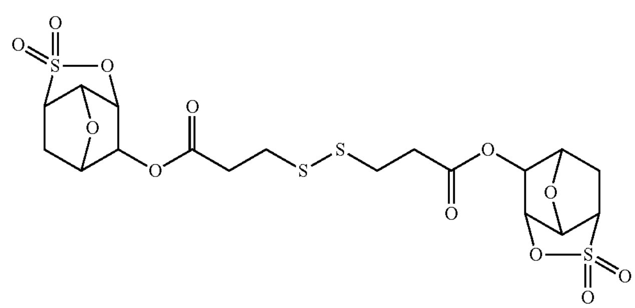

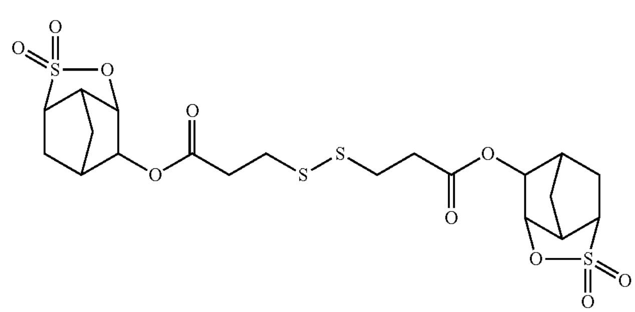

-continued
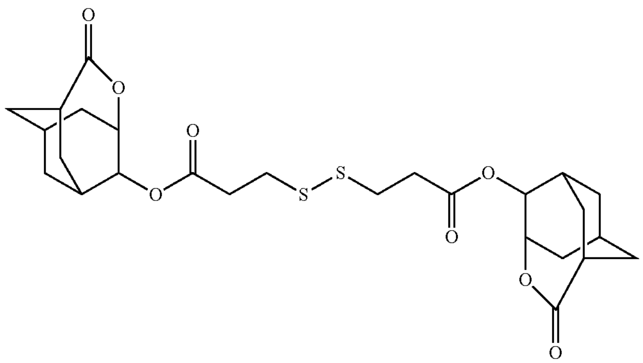
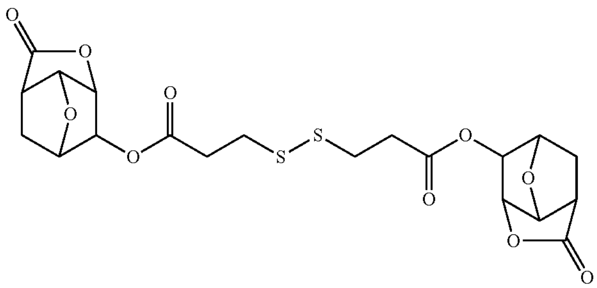
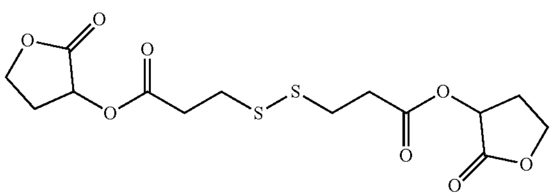
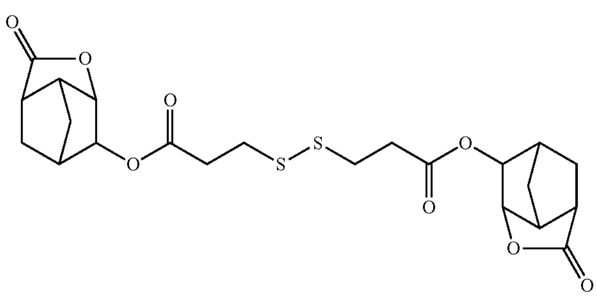
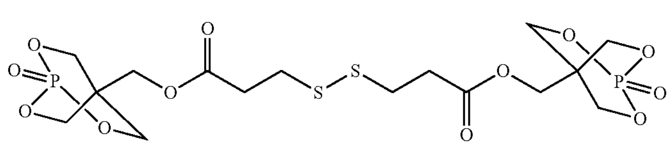
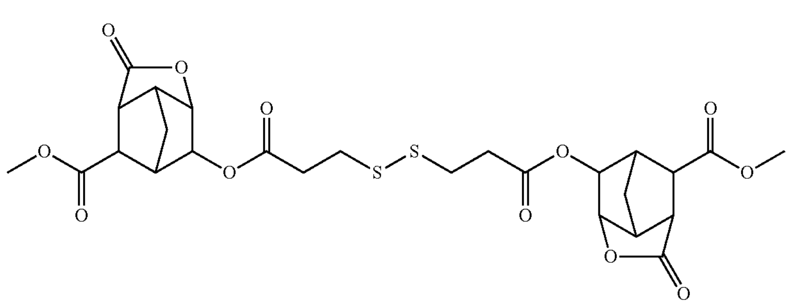

-continued

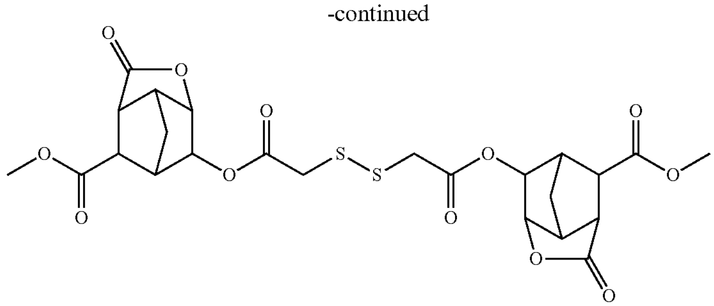

(Compound Represented by the Formula (C2))

The compound represented by the following formula (C2) corresponds to a compound represented by the following formula (C), in which Rc in the formula (C) is a group represented by the above formula (c2).

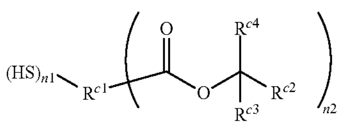

(C2)

(In the formula (C2), $R^{c1}$ is an organic group having a valence of (n1+n2), the $R^{c1}$ is bonded to a carbonyl group by a C—C bond and bonded to a mercapto group by a C—S bond, and the $R^{c2}$ and $R^3$ are each independently a hydrogen atom or a monovalent organic group, $R^{c4}$ is a hydrocarbon group, a carbon atom to which $R^{c2}$, $R^{c3}$ and $R^{c4}$ are bonded is a tertiary carbon atom, and $R^{c3}$ and $R^{c4}$ may be bonded to each other to form a ring, and n1 is an integer of 1 or more and 4 or less, and n2 is an integer of 1 or more and 4 or less, in a proviso that at least one of $R^{c2}$ and $R^{c3}$ is a monovalent organic group having an aliphatic ring CA including one or more divalent groups selected from an ether bond, a sulfide bond, and a carbonyl group in the ring structure, a monovalent organic group having an aliphatic ring CH substituted with a hydroxyl group or a hydroxyl group-containing group, a monovalent organic group having an aliphatic ring CL including a divalent group represented by —CO—O— in the ring structure, a monovalent organic group having an aliphatic ring CS including a divalent group represented by —$SO_2$— in the ring structure, or a monovalent organic group having an aliphatic ring CP including a trivalent group represented by the following formula in the ring structure:

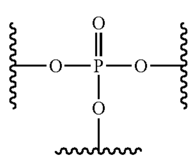 [SMILES: *OP(=O)(O*)O*]

or $R^{c2}$ and $R^{c3}$ are bonded to each other to form an aliphatic ring CA, an aliphatic ring CH, an aliphatic ring CL, an aliphatic ring CS, or an aliphatic ring CP.)

In the formula (C2), $R^{c1}$ is the same as $R^{c1}$ in the above formula (C1), and is an organic group having a valence of (n1+n2). The organic group having a valence of (n1+n2) as $R^{c1}$ may include a hetero atom. However, in a mercapto compound represented by the formula (C2), $R^{c1}$ is bonded to a carbonyl group by a C—C bond, and bonded to a mercapto group by a C—S bond. In other words, each atomic bonding of the organic group as $R^{c1}$ is bonded to a carbon atom in the organic group. Furthermore, the divalent organic group may have an unsaturated bond.

As to $R^{c1}$, a "hetero atom that may be included in an organic group," "examples of the substituents including a hetero atom," "specific examples of the bond including a hetero atom that may be included in an organic group having a valence of (n1+n2)," "description of preferable hydrocarbon group," and the like, are the same as in the description of $R^{c1}$ in the above formula (C1).

In the formula (C2), $R^{c2}$ and $R^{c3}$ are each independently a hydrogen atom or a monovalent organic group, and $R^{c4}$ is a hydrocarbon group. $R^{c3}$ and $R^{c4}$ may be bonded to each other to form a ring. Furthermore, a carbon atom to which $R^{c2}$, $R^{c3}$ and $R^{c4}$ are bonded is a tertiary carbon atom. Therefore, a group represented by the following formula (C2-1) in the formula (C2):

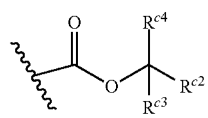

(C2-1)

(In the formula (C2-1), $R^{c2}$, $R^{c3}$ and $R^{c4}$ are the same as those in the formula (C2).)

is decomposed by an acid generated by acid generator (A) through exposure to form a carboxy group.

In the formula (C2), at least one of $R^{c2}$ and $R^{c3}$ is a monovalent organic group having an aliphatic ring CA including one or more divalent groups selected from an ether bond, a sulfide bond, and a carbonyl group in a ring structure, a monovalent organic group having an aliphatic ring CH substituted with a hydroxyl group or a hydroxyl group-containing group, a monovalent organic group having an aliphatic ring CL including a divalent group represented by —CO—O— in a ring structure, a monovalent organic group having an aliphatic ring CS including a divalent group represented by —$SO_2$— in a ring structure, or a monovalent organic group having an aliphatic ring CP including a trivalent group represented by the following formula, in a ring structure:

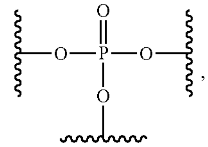

or $R^{c2}$ and $R^{c3}$ are bonded to each other to form an aliphatic ring CA, an aliphatic ring CH, an aliphatic ring CL, an aliphatic ring CS, or an aliphatic ring CP.

When at least one of $R^{c2}$ and $R^{c3}$ is a monovalent organic group having an aliphatic ring CA including one or more divalent groups selected from an ether bond, a sulfide bond, and a carbonyl group in a ring structure, suitable examples of the monovalent organic group having an aliphatic ring CA include groups in which one hydrogen atom is removed from aliphatic rings represented by the following formulae (c2-A1) to (c2-A6). Furthermore, when $R^{c2}$ and $R^{c3}$ are bonded to each other to form an aliphatic ring CA, examples of the divalent cyclic group formed of $R^{c2}$ and $R^{c3}$ include divalent cyclic groups in which two hydrogen atoms bonded to the same carbon atom are removed from aliphatic rings represented by the following formulae (c2-A1) to (c2-A6). However, as mentioned above, in the formula (C2), a carbon atom to which $R^{c2}$, $R^{c3}$, and $R^{c4}$ are bonded is a tertiary carbon atom. Therefore, when the divalent cyclic group formed of $R^{c2}$ and $R^{c3}$ is a divalent cyclic group in which two hydrogen atoms bonded to the same carbon atom are removed from aliphatic rings represented by the following formulae (c2-A1) to (c2-A6), the divalent cyclic group is not a divalent cyclic group in which two hydrogen atoms bonded to the same carbon atom in a position neighboring an oxygen atom or a sulfur atom from the aliphatic ring represented by the following formulae (c2-A1) to (c2-A6).

(c2-A1)

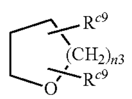

(c2-A2)

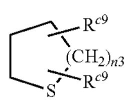

(c2-A3)

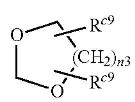

(c2-A4)

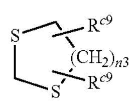

(c2-A5)

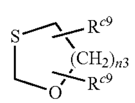

(c2-A6)

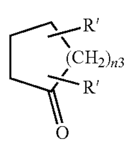

In the formulae (c2-A1) to (c2-A6), $R^{c9}$ represents each independently a hydrogen atom, an alkyl group, an alkoxy group, a halogenated alkyl group, —COOR$^{c10}$, —OC(═O)R$^{10}$, or a cyano group, and $R^{c10}$ represents a hydrogen atom or an alkyl group; n3 is an integer of 0 or more and 2 or less. Note here that $R^{c9}$ is similar to R' in the formulae (b-L1) to (b-L7), and $R^{c10}$ is similar to R' in the formulae (b-L1) to (b-L7).

When at least one of $R^{c2}$ and $R^{c3}$ is the above-mentioned monovalent organic group having an aliphatic ring CA, suitable examples of the monovalent organic group include a group in which one hydrogen atom is removed from the following aliphatic ring. When a divalent cyclic group formed of $R^{c2}$ and $R^{c3}$ is a divalent cyclic group including the above-mentioned aliphatic ring CA, suitable examples of the divalent cyclic group include a divalent cyclic group in which two hydrogen atoms bonded to the same carbon atom are removed from the following aliphatic ring.

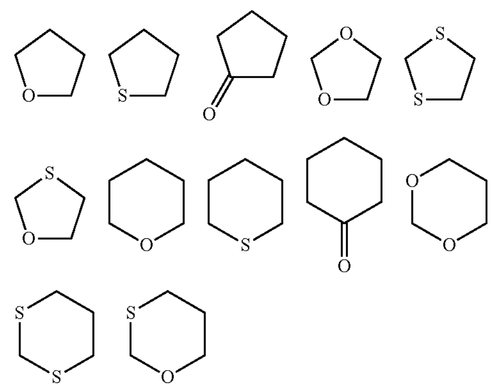

When at least one of $R^{c2}$ and $R^{c3}$ is the above-mentioned monovalent organic group having an aliphatic ring CA, suitable examples of the monovalent organic group include the following group.

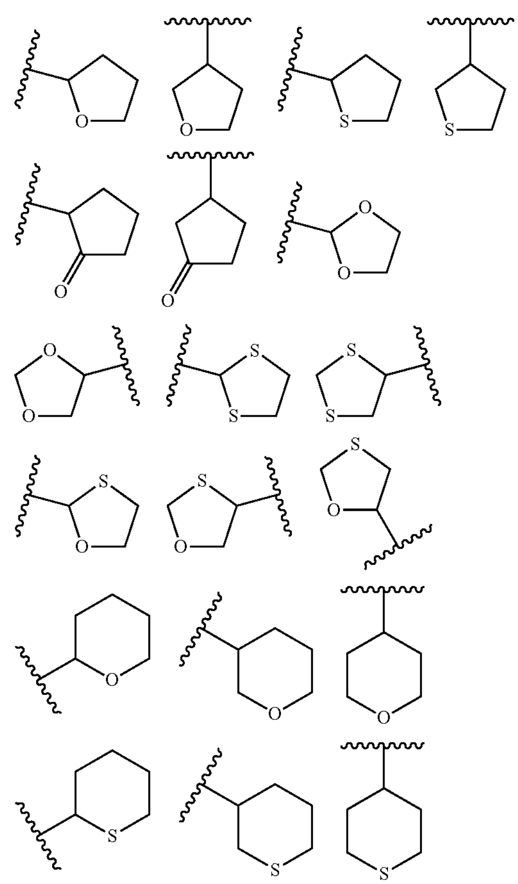

-continued

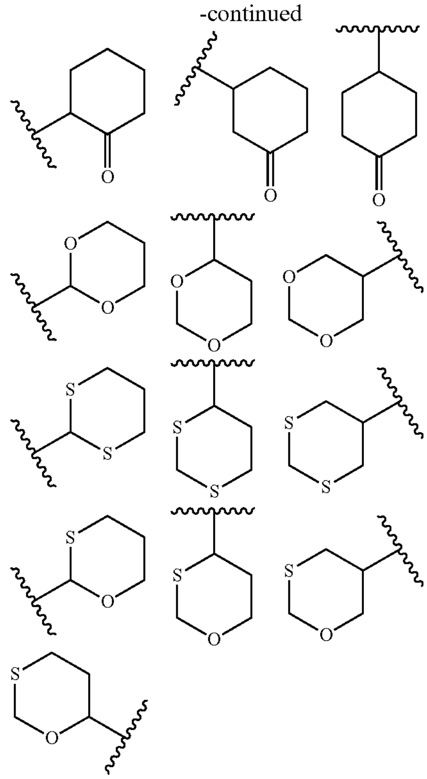

When the divalent cyclic group formed of $R^{c2}$ and $R^{c3}$ is a divalent cyclic group including the above-mentioned aliphatic ring CA, suitable examples of the divalent cyclic group include the following group.

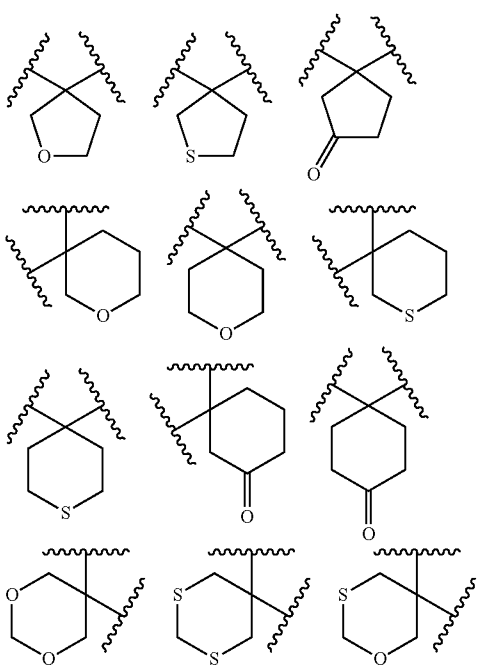

When at least one of $R^{c2}$ and $R^{c3}$ is a monovalent organic group having an aliphatic ring CH substituted with a hydroxyl group or a hydroxyl group-containing group, suitable examples of a monovalent organic group having an aliphatic ring CH include monovalent cyclic groups in which one hydrogen atom is removed from an aliphatic hydrocarbon ring such as monocycloalkanes such as cyclopentane, cyclohexane, cycloheptane, and cyclooctane, and adamantane, norbornane, isobornane, tricyclodecane, and tetracyclododecane; a monovalent organic group having an aliphatic ring CA; a monovalent organic group having an aliphatic ring CL; a monovalent organic group having an aliphatic ring CS; and a group in which at least one of hydrogen atoms of a monovalent aliphatic cyclic group such as a monovalent organic group having an aliphatic ring CP is substituted with a hydroxyl group or a hydroxyl group-containing group.

The hydroxyl group-containing group is not particularly limited, but a hydroxy alkyl group, or a hydroxy phenyl group is preferable. The number of carbon atoms in the hydroxy alkyl group is, for example, preferably 1 or more and 6 or less, and more preferably 1 or more and 3 or less. Suitable specific examples of the hydroxyalkyl group include a hydroxymethyl group, a 2-hydroxyethyl group, a 1-hydroxyethyl group, a 3-hydroxypropyl group, a 2-hydroxypropyl group, and a 2-hydroxypropane-2-yl group, and the like.

The number of hydroxyl groups included in the monovalent organic group having an aliphatic ring CH is not particularly limited. Typically, the number of hydroxyl groups is preferably 1 or more and 4 or less, preferably 1 or 2, and particularly preferably 1.

When at least one of $R^{c2}$ and $R^{c3}$ is the above-mentioned monovalent organic group having an aliphatic ring CL, suitable examples of the monovalent organic group having an aliphatic ring CL include groups in which one hydrogen atom is removed from an aliphatic ring represented by the following formulae (c2-L1) to (c2-L7) included in the above-mentioned formulae (b-L1) to (b-L7). Furthermore, when $R^{c2}$ and $R^{c3}$ are bonded to each other to form an aliphatic ring CL, examples of the divalent cyclic group formed of $R^{c2}$ and $R^{c3}$ include a divalent cyclic group in which two hydrogen atoms bonded to the same carbon atom are removed from the aliphatic ring represented by the following formulae (c2-L1) to (c2-L7). However, as mentioned above, in the formula (C2), a carbon atom to which $R^{c2}$, $R^{c3}$ and $R^{c4}$ are bonded is a tertiary carbon atom. Therefore, when the divalent cyclic group formed of $R^{c2}$ and $R^{c3}$ represents a divalent cyclic group in which two hydrogen atoms bonded to the same carbon atom are removed from the aliphatic ring represented by the following formulae (c2-L1) to (c2-L7), the divalent cyclic group is not a divalent cyclic group in which two hydrogen atoms bonded to the same carbon atom in a position neighboring an oxygen atom are removed from the aliphatic ring represented by the following formulae (c2-L1) to (c2-L7).

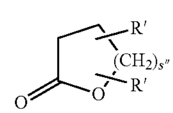

(c2-L1)

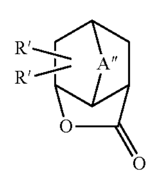

(c2-L2)

-continued (c2-L3)

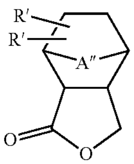

(c2-L4)

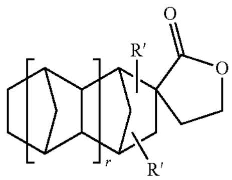

(c2-L5)

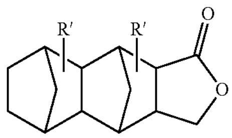

(c2-L6)

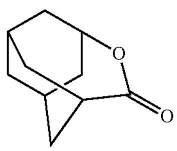

(c2-L7)

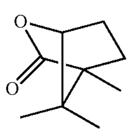

(In the formulae (c2-L1) to (c2-L7), R', s", A", and r are the same as those described in the formulae (b-L1) to (b-L7).)

Furthermore, a group in which one hydrogen atom is removed from an aliphatic ring represented by the following formula (c2-L8) is also preferable as the above-mentioned monovalent organic group having an aliphatic ring CL as $R^{c2}$ and $R^{c3}$. In addition, a divalent cyclic group in which two hydrogen atoms bonded to the same carbon atom are removed from the aliphatic ring represented by the following formula (c2-L8) is also preferable as the divalent cyclic group including the aliphatic ring CL formed by bonding $R^{c2}$ and $R^{c3}$ to each other.

(c2-L8)

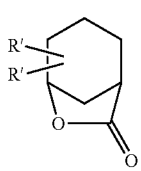

(In the formula (c2-L8), R' is the same as that in the formulae (b-L1) to (b-L7).)

When at least one of $R^{c2}$ and $R^{c3}$ is the above-mentioned monovalent organic group having an aliphatic ring CL, suitable examples of the monovalent organic group include a group in which one hydrogen atom is removed from the following aliphatic ring. When a divalent cyclic group formed of $R^{c2}$ and $R^{c3}$ is a divalent cyclic group including the above-mentioned aliphatic ring CL, suitable examples of the divalent cyclic group include a divalent cyclic group in which two hydrogen atoms bonded to the same carbon atom are removed from the following aliphatic ring.

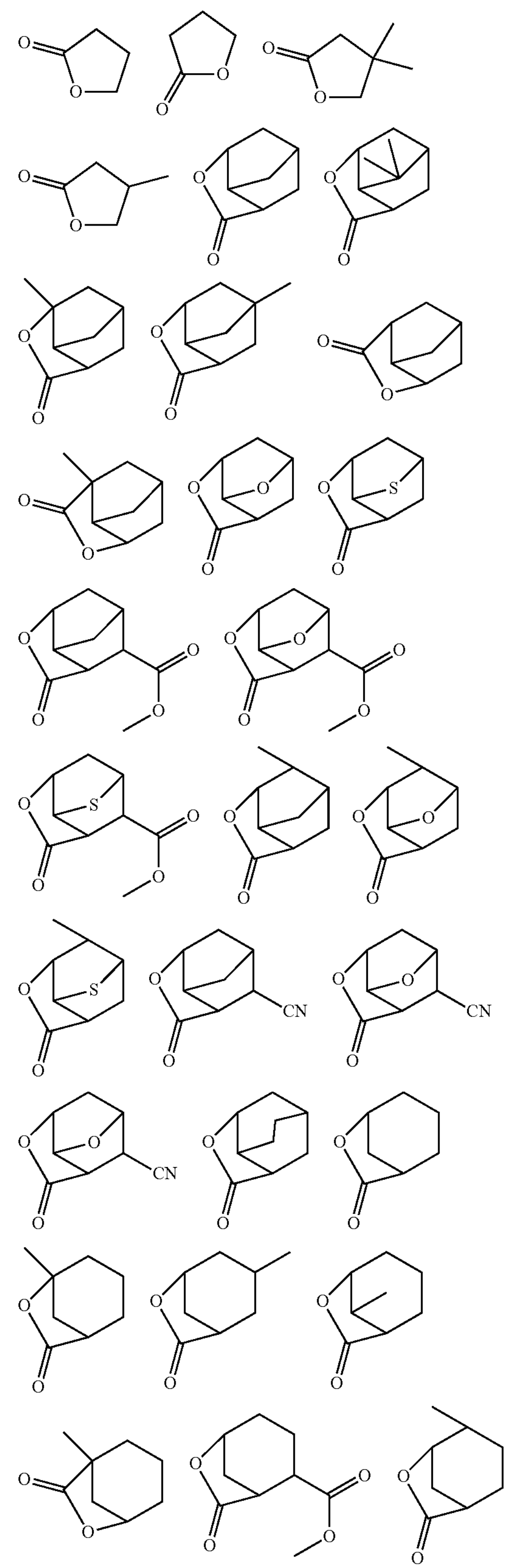

-continued

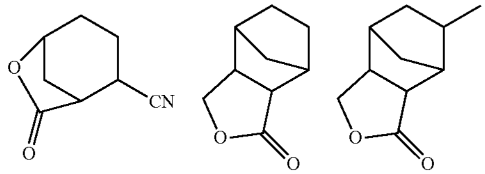

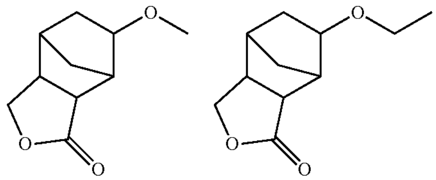

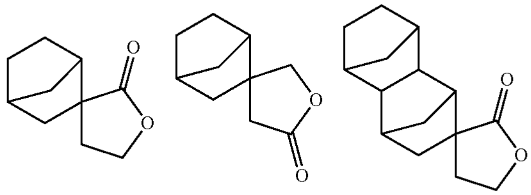

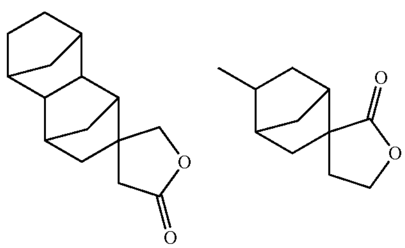

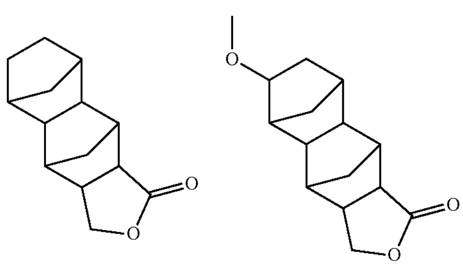

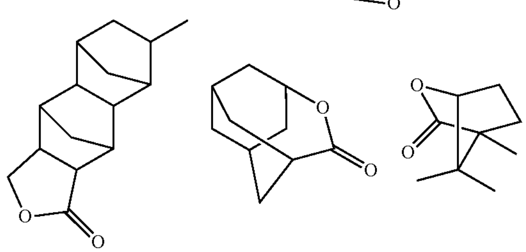

When at least one of $R^{c2}$ and $R^{c3}$ is the above-mentioned monovalent organic group having an aliphatic ring CL, suitable specific examples of the monovalent organic group are similar to the suitable examples of the monovalent organic group having an aliphatic ring CL corresponding to the compound represented by the formula (C1).

When a divalent cyclic group formed of $R^{c2}$ and $R^{c3}$ is a divalent cyclic group including the above-mentioned aliphatic ring CL, suitable specific examples of the divalent cyclic group include the following groups.

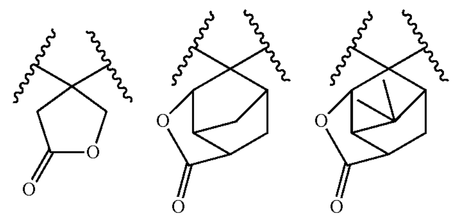

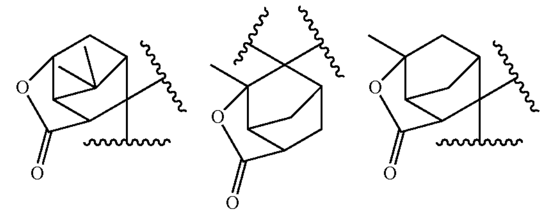

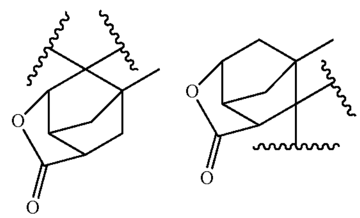

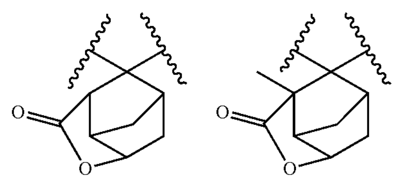

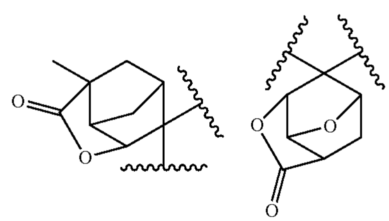

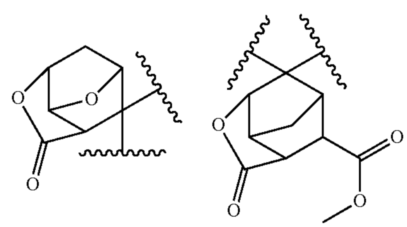

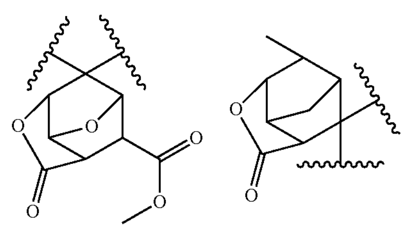

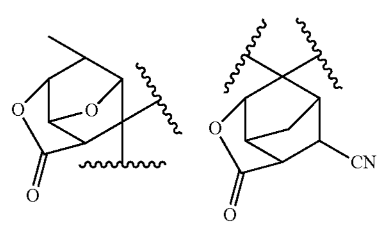

-continued
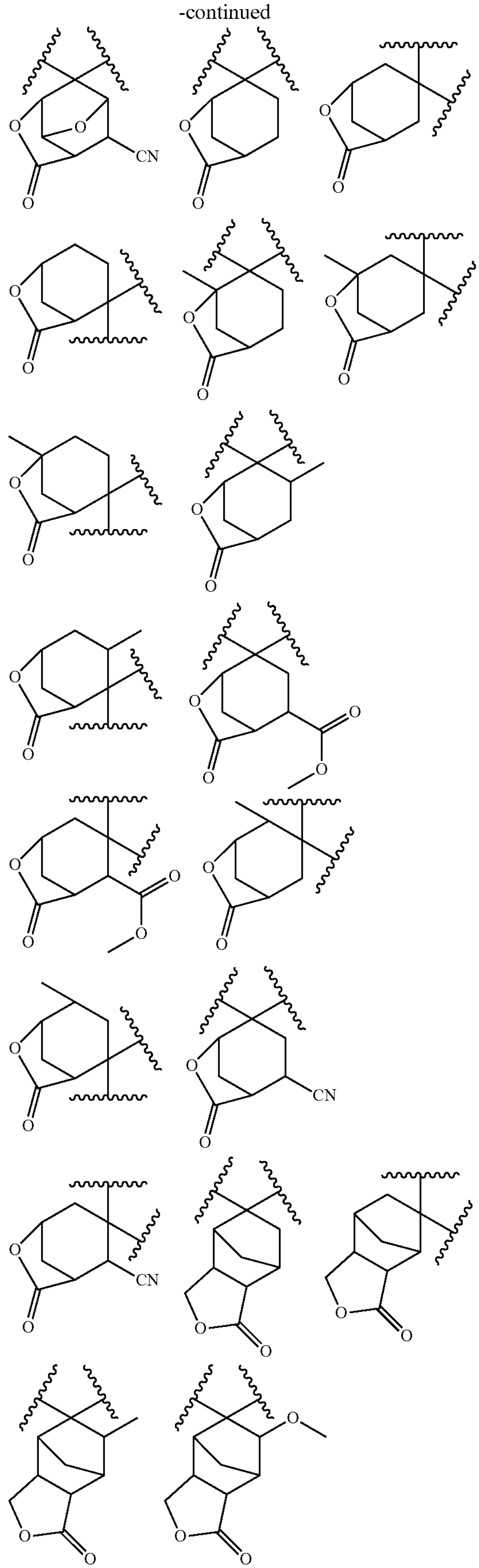
-continued
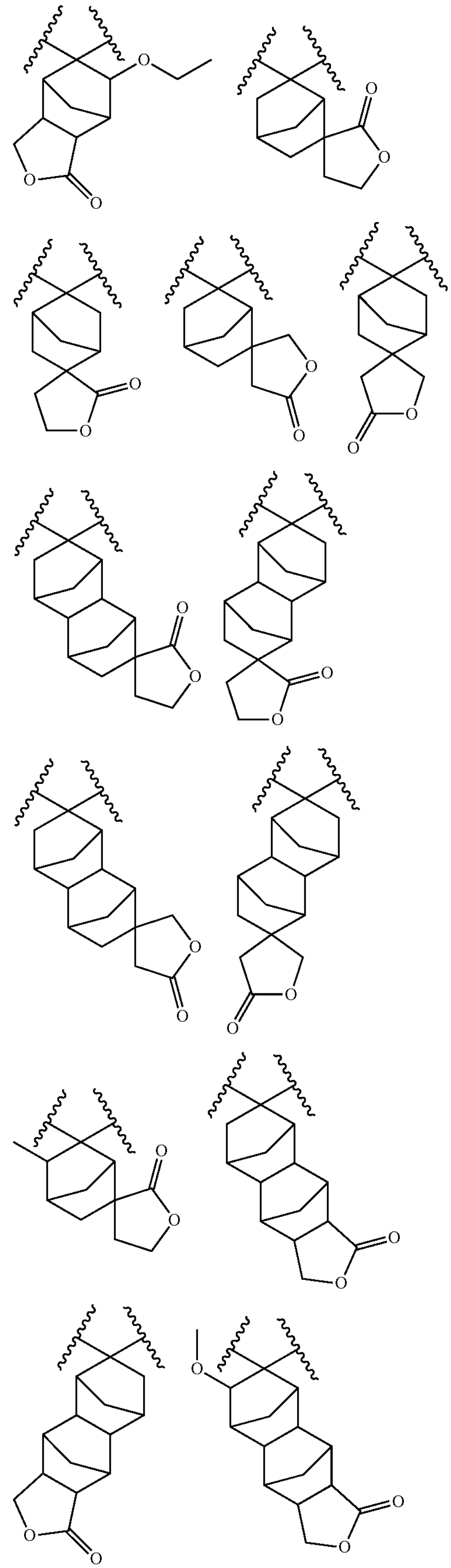

-continued

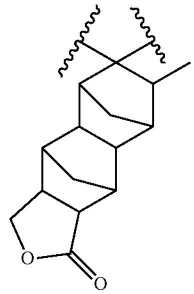
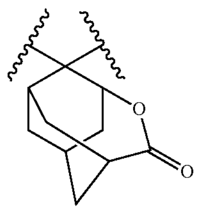

When at least one of $R^{c2}$ and $R^{c3}$ is the above-mentioned monovalent organic group having an aliphatic ring CS, suitable examples of the monovalent organic group having an aliphatic ring CS include groups represented by the above-mentioned formulae (3-1) to (3-4). Furthermore, when $R^{c2}$ and $R^{c3}$ are bonded to each other to form an aliphatic ring CS, examples of the divalent cyclic group formed of $R^{c2}$ and $R^{c3}$ include a group in which one hydrogen atom is removed from carbon atoms bonded to the atomic bonding in the groups represented by the above-mentioned formulae (3-1) to (3-4). However, as mentioned above, in the formula (C2), a carbon atom to which $R^{c2}$, $R^{c3}$ and $R^{c4}$ are bonded is a tertiary carbon atom. Therefore, a divalent group of the aliphatic ring CS formed by bonding $R^{c2}$ and $R^{c3}$ to each other is limited to a group that satisfies this condition.

When at least one of $R^{c2}$ and $R^{c3}$ is monovalent organic group having the above aliphatic ring CS, suitable specific examples of the monovalent organic group having the aliphatic ring CS are the same as those of the suitable examples of the monovalent organic group having an aliphatic ring CS corresponding to the compounds represented by the formula (C1).

When a divalent cyclic group formed of $R^{c2}$ and $R^{c3}$ is a divalent cyclic group including the above-mentioned aliphatic ring CS, suitable examples of the divalent cyclic group include the following groups.

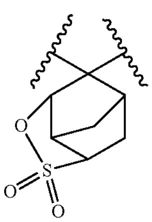
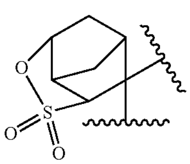
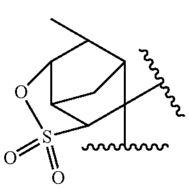
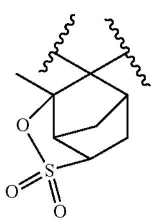
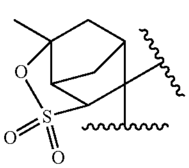
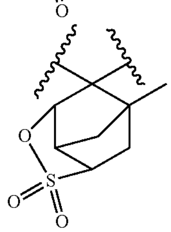

-continued

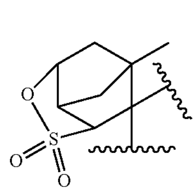
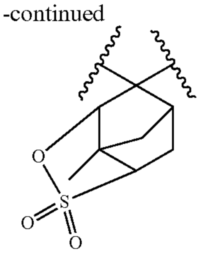
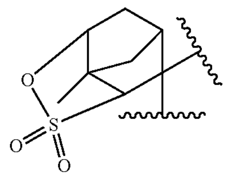
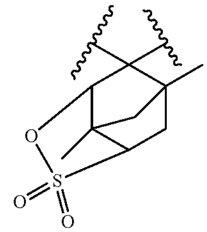
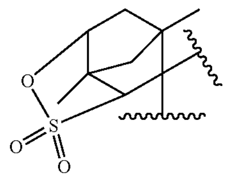
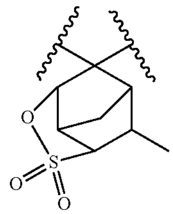
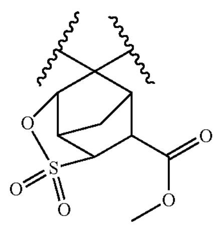
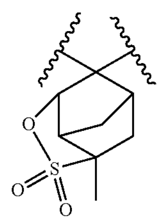
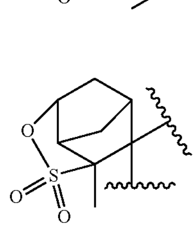
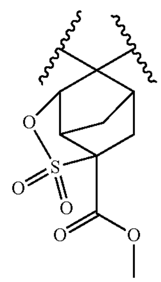
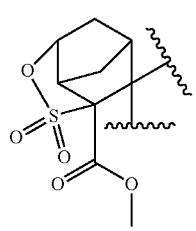
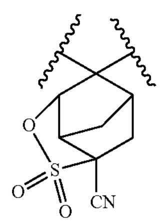
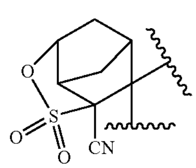
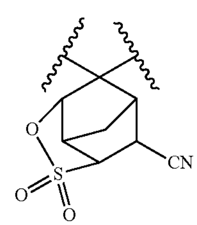

-continued

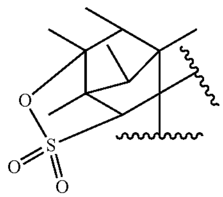
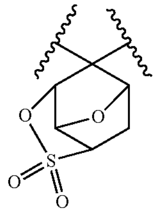
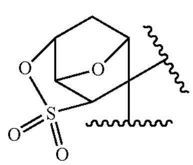
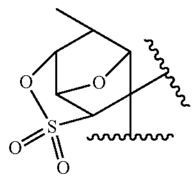
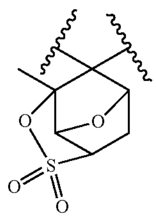
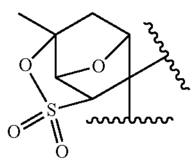
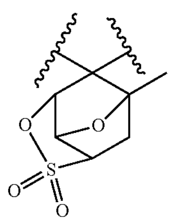
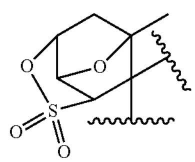
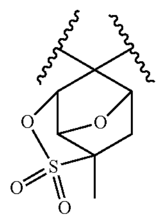
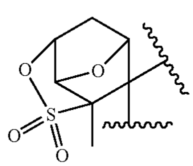
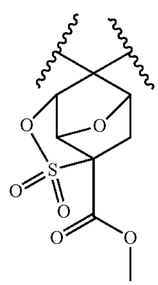
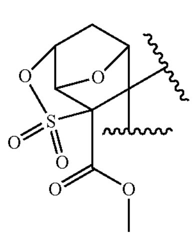
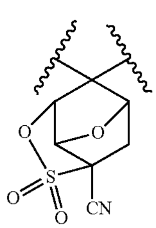
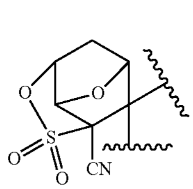
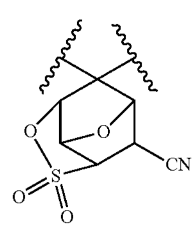

-continued

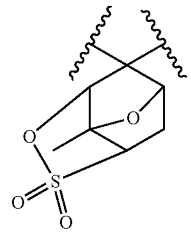
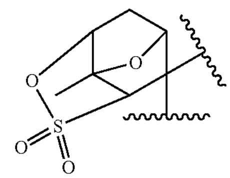
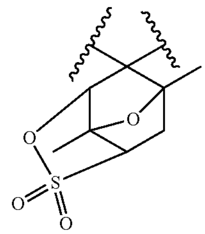
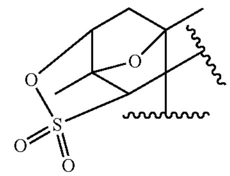
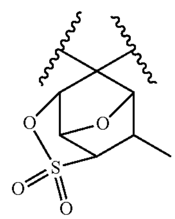
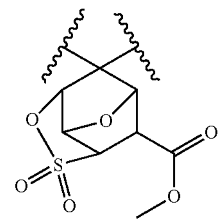
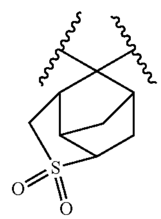
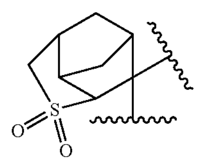
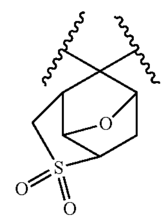
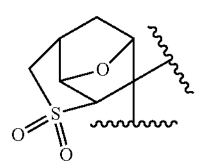
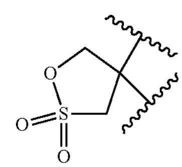
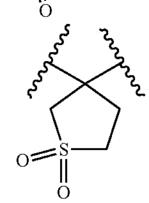
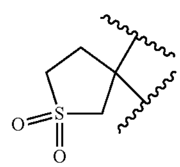

When at least one of $R^{c2}$ and $R^{c3}$ is the above-mentioned monovalent organic group having an aliphatic ring CP, suitable examples of the monovalent organic group having the aliphatic ring CP include groups represented by the above-mentioned formula (C-P1) that is similar to those described as to the compound represented by the formula (C1). Furthermore, when the above-mentioned divalent cyclic group including the aliphatic ring CP is formed of $R^{c2}$ and $R^{c3}$, the divalent cyclic group is not particularly limited as long as it satisfies the predetermined condition as mentioned above for the aliphatic ring CP.

In the formula (C2), $R^{c4}$ is a hydrocarbon group. The number of carbon atoms in the hydrocarbon group is not particularly limited, but it is preferably 1 or more and 20 or less, more preferably 1 or more and 10 or less, further preferably 1 or more and 8 or less, and particularly preferably 1 or more and 6 or less. Examples of the hydrocarbon group include an alkyl group, a cycloalkyl group, an alkenyl group, a cycloalkenyl group, an aryl group, an aralkyl group, a cycloalkyl alkyl group, and the like.

The alkylene group moiety in the alkyl group and the alkenyl group, and the aralkyl group, and the cycloalkyl alkyl group may be linear or branched.

Suitable specific examples of the alkyl group as $R^{c4}$ include a methyl group, an ethyl group, a propyl group, an isopropyl group, an n-butyl group, an isobutyl group, a sec-butyl group, a tert-butyl group, an n-pentyl group, an isopentyl group, a neopentyl group, an n-hexyl group, and the like. Suitable specific examples of the cycloalkyl group as $R^{c4}$ include a cyclopropyl group, a cyclobutyl group, a cyclopentyl group, and a cyclohexyl group. Suitable specific examples of the alkenyl group as $R^{c4}$ include a vinyl group, an allyl group (2-propenyl group), a 3-butenyl group, a 4-pentenyl group, a 5-hexenyl group, and the like. Suitable specific examples of the cycloalkenyl group as $R^{c4}$ include a cyclopropenyl group, a cyclobutenyl group, a cyclopentenyl group, and a cyclohexenyl group. Suitable specific examples of the aryl group as $R^{c4}$ include a phenyl group and a naphthyl group. Suitable specific examples of the aralkyl group as $R^{c4}$ include a benzyl group, a phenethyl group, and a 3-phenyl propyl group, a naphthalene 1-yl methyl group, and a naphthalene 2-yl methyl group. Suitable specific examples of the cycloalkyl alkyl group as $R^{c4}$ include a cyclopentyl methyl group, a 2-cyclopentyl ethyl group, a 3-cyclopentyl propyl group, a cyclohexyl methyl group, a 2-cyclohexyl methyl group, and a 3-cyclohexyl propyl group.

In the formula (C2), $R^{c3}$ and $R^{c4}$ may be bonded to each other to form a ring. A ring formed by bonding $R^{c3}$ and $R^{c4}$ is not particularly limited as long as a carbon atom to which $R^{c2}$, $R^{c3}$ and $R^{c4}$ are bonded is a tertiary carbon atom. When $R^{c3}$ and $R^{c4}$ are bonded to each other to form a cyclic group, the cyclic group is preferably a cycloalkylidene group. Suitable examples of the cycloalkylidene group include a cyclopentylidene group, a cyclobutylidene group, a cyclopentylidene group, and a cyclohexylidyne group. Among them, a cyclopentylidene group and a cyclohexylidyne group are preferable.

A method of manufacturing a mercapto compound represented by the formula (C2) is not particularly limited, but it can be synthesized, for example, according to the following scheme 3. Specifically, firstly, similar to the scheme 1 as to the above-mentioned mercapto compound represented by the formula (C1), a mercapto compound in the carboxylic acid compound having the mercapto group represented by the following formula (C1-a) is selectively protected by a protecting group $X^c$ to obtain a carboxylic acid compound represented by the following formula (C1-b). Note here that since an ester bond in the compound represented by the formula (C2) is cleaved by an acid, as the protecting group $X^c$, a group that can be deprotected under conditions other than acid condition is employed. Examples of mercapto groups protected by the protecting group $X^c$ include groups having structures represented by the above-mentioned formulae (X-1) to (X-3), similar to the above-mentioned protected mercapto group described as to the mercapto compound represented by the formula (C1).

Subsequently, an ester compound represented by the formula (C2-d) is obtained from a carboxylic acid compound represented by the formula (C1-b) and alcohol represented by the following formula (C2-c). An esterification method is not particularly limited. Suitable esterification method is similar to the esterification method mentioned in the description in the compound represented by the above-mentioned formula (C1). Specific examples of the esterification method include a method of allowing a carbodiimide compound as a condensing agent to act in the presence of a small amount of N,N-dimethyl-4-aminopyridine, and condensing the carboxylic acid compound represented by the formula (C1-b) and alcohol represented by the formula (C2-c) to each other. Furthermore, the carboxylic acid compound represented by the formula (C1-b) may be reacted with halogenating agents such as thionyl chloride and phosphorus trichloride to generate carboxylic acid halide, followed by reacting the carboxylic acid halide with alcohol represented by the formula (C2-c).

In the obtained ester compound represented by the formula (C2-d), by deprotecting the protecting group $X^c$, the mercapto compound represented by the formula (C2) is obtained. A deprotection method is not particularly limited, and it can be appropriately selected depending on types of the protecting group $X^c$.

<Scheme 3>

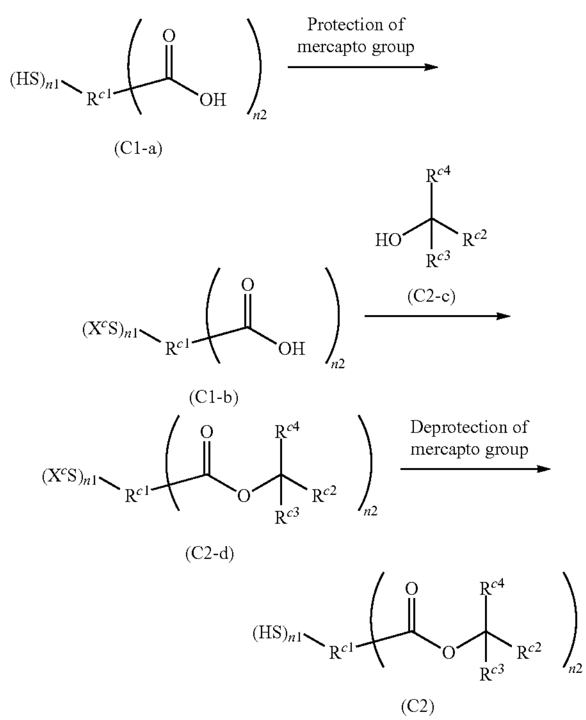

In the mercapto compound represented by the formula (C2), when n1 is 1, the mercapto compound represented by the formula (C2) can be favorably manufactured also by the method described in the scheme 4. Herein, $R^{c11}$ is a hydrogen atom or a monovalent organic group, preferably a hydrogen atom, or an alkyl group having 1 or more and 5 or less carbon atoms, and preferably a hydrogen atom, or a methyl group.

In the method described in the scheme 4, by a Michael addition reaction between α, β-unsaturated carboxylic acid ester represented by the following formula (C2-e) and thioacetic acid, carboxylic acid ester represented by the formula (C2-f) is obtained. Next, a compound represented by the formula (C2-f) is reacted with a base such as an ammonia aqueous solution to carry out deacetylation. Thus, a mercapto compound represented by the formula (C2-g) is obtained. The compound represented by the formula (C2-g) is a compound represented by the formula (C2) wherein n1 is 1, n2 is 1, and $R^{c1}$ is a compound that is a divalent group represented by —$CH_2$—$CH(R^{c11})$—.

<Scheme 4>

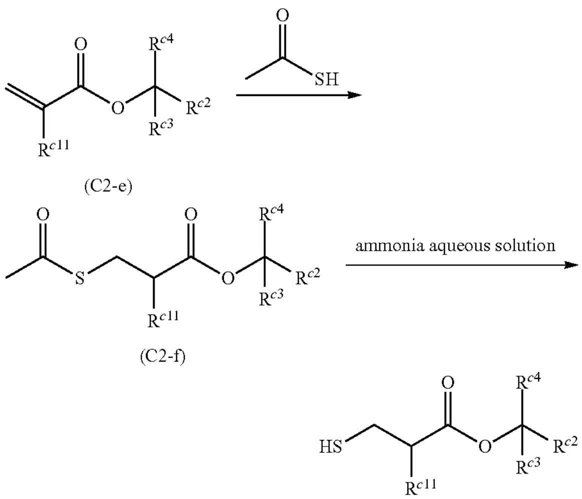

(C2-e)

(C2-f)

(C2-g)

Note here that in the formulae (C1-a), (C1-b), and (C2-c) to (C2-g) shown in the schemes 3 and 4, $R^{c1}$, $R^{c2}$, $R^{c3}$, $R^{c4}$, n1, and n2 are the same as those in the formula (C2).

(Mercapto Compound Represented by Formula (C3))

A compound represented by the following formula (C3) corresponds to a compound represented by the above formula (C), wherein in the formula (C), $R^c$ is a group represented by the above formula (c3).

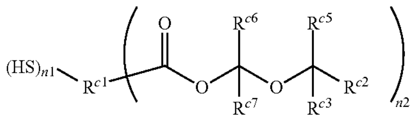

(C3)

(in the formula (C3), $R^{c1}$, $R^{c2}$, $R^{c3}$, n1, and n2 are the same as those in the formula (C2), $R^{c5}$, $R^{c6}$, and $R^{c7}$ are each independently a hydrogen atom, or an alkyl group, $R^{c5}$ and $R^{c6}$ may be bonded to each other to form a ring, in a proviso that at least one of $R^{c2}$ and $R^{c3}$ is a monovalent organic group having an aliphatic ring CA, a monovalent organic group having an aliphatic ring CH, a monovalent organic group having an aliphatic ring CL, a monovalent organic group having an aliphatic ring CS, or a monovalent organic group having an aliphatic ring CP, or $R^{c2}$ and $R^{c3}$ are bonded to each other to form an aliphatic ring CA, an aliphatic ring CH, an aliphatic ring CL, an aliphatic ring CS, or an aliphatic ring CP).

In the formula (C3), $R^{c1}$, $R^{c2}$, $R^{c3}$, n1, and n2 are the same as those in the above formula (C2). $R^{c5}$, $R^{c6}$, and $R^{c7}$ are each independently a hydrogen atom, or an alkyl group. When $R^{c5}$, $R^{c6}$, and $R^{c7}$ are an alkyl group, the alkyl group may be linear or branched, and is preferably linear. In a case where $R^{c5}$, $R^{c6}$, and $R^{c7}$ are an alkyl group, the number of carbon atoms is not particularly limited, but is preferably 1 or more and 6 or less, more preferably 1 or more and 4 or less, further preferably 1 or 2, and particularly preferably 1. Suitable examples of the alkyl group as $R^{c5}$, $R^{c6}$, and $R^{c7}$ include a methyl group, an ethyl group, a propyl group, an isopropyl group, an n-butyl group, an isobutyl group, a sec-butyl group, a tert-butyl group, an n-pentyl group, an isopentyl group, a neopentyl group, an n-hexyl group, and the like. Among them, a methyl group and an ethyl group are preferable, and a methyl group is more preferable.

In the formula (C3), as a divalent group represented by —$CR^{c6}R^{c7}$—, a methylene group, and ethane-1,1-diyl group are preferable. A mercapto compound represented by the formula (C3) includes a group represented by —$CR^{c6}R^{c7}$—O—$CR^{c2}R^{c3}R^{c5}$, which has the same structure as in the acid-dissociable dissolution-inhibiting group represented by the formula (b2) mentioned above for the resin (B), in the structure thereof. The group represented by —$CR^{c6}R^{c7}$—O—$CR^{c2}R^{c3}R^{c5}$ shows acid dissociation property similar to that of a group represented by formula (b2). Therefore, a group represented by —CO—O—$CR^{c6}R^{c7}$—O—$CR^{c2}R^{c3}R^{c5}$ in the mercapto compound represented by formula (C3) is discomposed by an acid generated by the acid generator (A) through exposure so as to generate a carboxy group.

Furthermore, in the formula (C3), $R^{c5}$ and $R^{c6}$ may be bonded to each other to form a ring. The ring formed in this case is preferably the above-mentioned aliphatic ring CA. In the group represented by —$CR^{c6}R^{c7}$—O—$CR^{c2}R^{c3}R^{c5}$ in the formula (C3), when $R^{c5}$ and $R^{c6}$ are bonded to each other to form an aliphatic ring CA, suitable examples of the group represented by —$CR^{c6}R^{c7}$—O—$CR^{c2}R^{c3}R^{c5}$ preferably include the following groups. In the following groups, it is preferable that all of $R^{c2}$, $R^{c3}$, and $R^{c7}$ are a hydrogen atom.

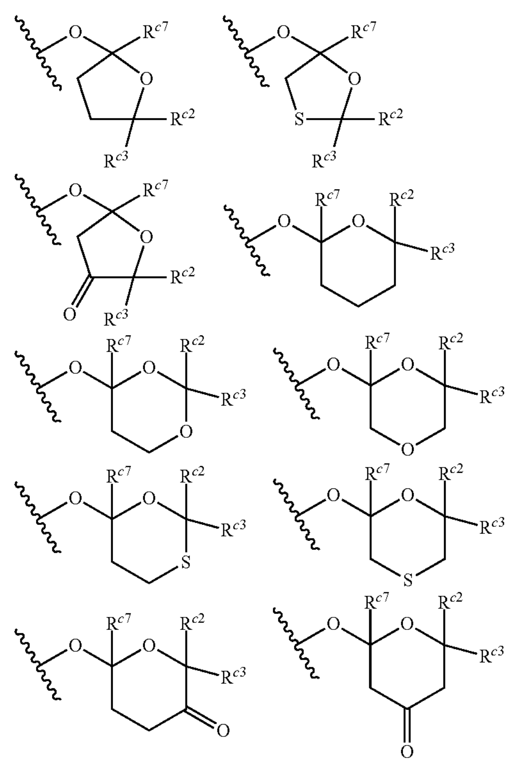

As the mercapto compound represented by formula (C2) or (C3) described above, compounds in the following formulae are preferable. Note here that in the following formulae, $R^y$ is a group represented by —$CR^{c2}R^{c3}R^{c4}$, or a group represented by —$CR^{c6}R^{c7}$—O—$CR^{c2}R^{c3}R^{c5}$.

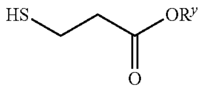
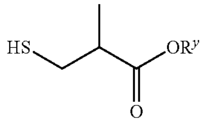
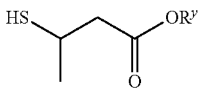
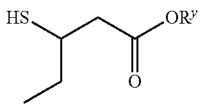
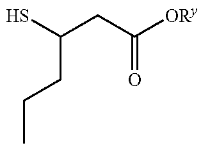
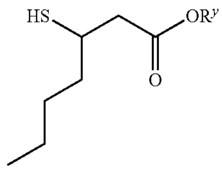
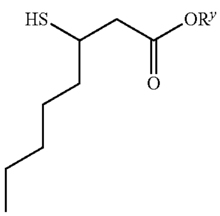
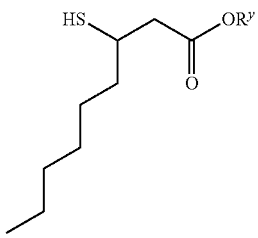
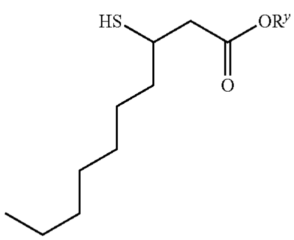
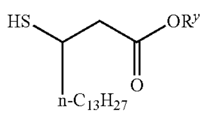
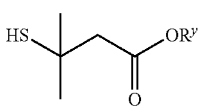
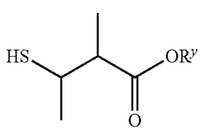
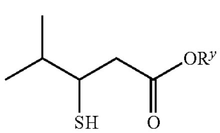
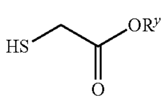
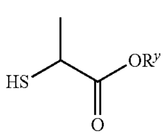
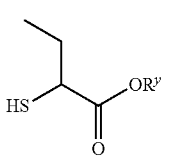
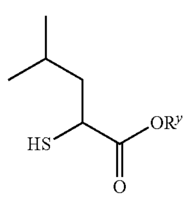
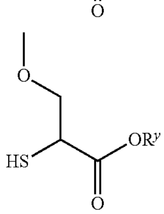
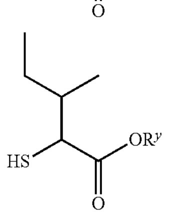
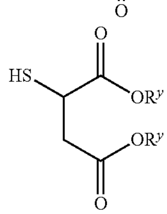
Suitable specific examples of the mercapto compound represented by formula (C2) or (C3) are shown below.
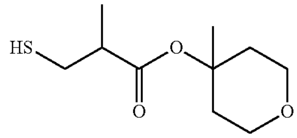
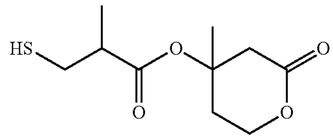
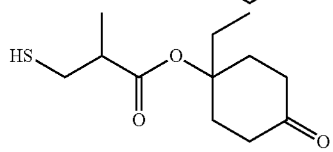
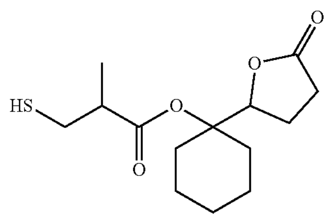
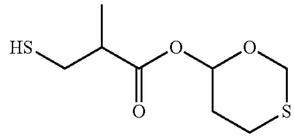
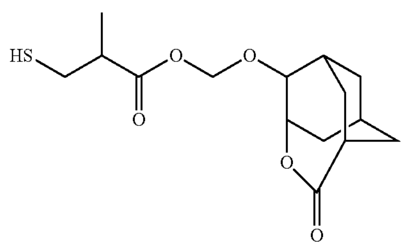
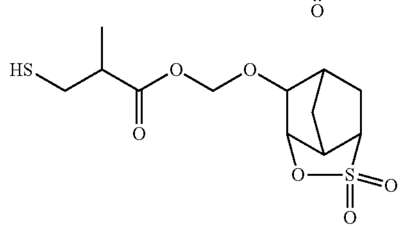
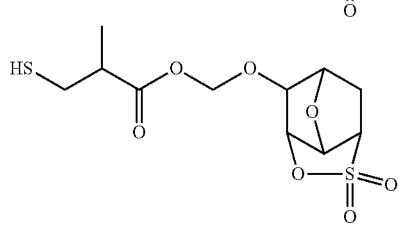
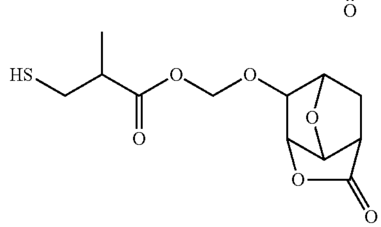

-continued

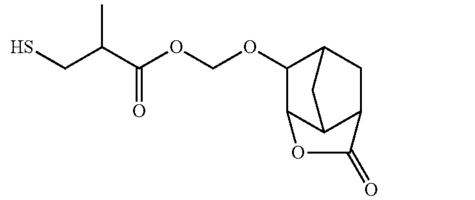

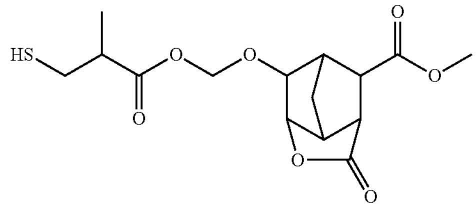

The above-described mercapto compound represented by formula (C3) can be manufactured by methods described as the scheme 3 and the scheme 4, which describes the method of manufacturing the mercapto compound represented by the formula (C2) with raw material compounds appropriately changed.

(Compound Represented by Formula (C4))

A compound represented by following formula (C4) corresponds to a compound represented by the above formula (C) in which Rc in the formula (C) is a group represented by the above formula (C4).

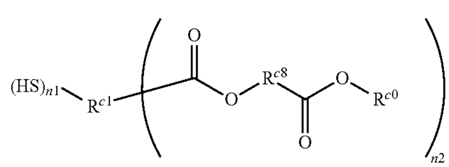

(C4)

(in the formula (C4), $R^{c1}$, n1, and n2 are the same as those in the formula (C1), $R^{c8}$ is a divalent organic group, $R^{c8}$ is bonded to a carbonyl group by a C—C bond, and bonded to an oxygen atom by a C—O bond, and $R^{c0}$ is an acid dissociable group).

Note here that it is preferable that the bonding O—$R^{c8}$ in the formula (C4) is not cleaved by an acid generated by the acid generator (A) through exposure.

In the formula (C4), $R^{c1}$ is the same as $R^{c1}$ in the above formula (C1), and is an organic group having a valence of (n1+n2). An organic group having a valence of (n1+n2) as $R^{c1}$ may include a hetero atom. However, in the mercapto compound represented by the formula (C4), the $R^{c1}$ is bonded to a carbonyl group by a C—C bond, and bonded to a mercapto group by a C—S bond. In other words, each atomic bonding of the organic group as $R^{c1}$ is bonded to carbon atom in the organic group, respectively. Furthermore, the divalent organic group may have an unsaturated bond.

As to the $R^{c1}$ in the formula (C4), a "hetero atom that may be included in an organic group," "examples of the substituents including a hetero atom," "specific examples of the bond including a hetero atom that may be included in an organic group having a valence of (n1+n2)," "description of preferable hydrocarbon group," and the like, are the same as in the description as to $R^{c1}$ in the above formula (C1)

In the formula (C4), $R^{c8}$ is a divalent organic group. Furthermore, the $R^{c8}$ is bonded to a carbonyl group by a C—C bond, and bonded to an oxygen atom by a C—O bond.

In the formula (C4), the divalent organic group as $R^{c8}$ may be the same group as $R^{c1}$. In view of easiness in obtaining a more excellent effect of suppressing footing, preferable examples of $R^{c8}$ include a divalent organic group LG having a cyclic group including a divalent group represented by —CO—O— in the ring structure, a divalent organic group SG having a cyclic group including a divalent group represented by —$SO_2$— in the ring structure, or an alkylene group.

In the formula (C4), when $R^{c8}$ is a divalent organic group LG having a cyclic group including a divalent group represented by —CO—O— in the ring structure, suitable examples of the divalent organic group LG include groups in which two hydrogen atoms are removed from the aliphatic ring represented by the above-mentioned formulae (c2-L1) to (c2-L7) including in the above-mentioned formulae (b-L1) to (b-L7), similar to the suitable examples of the divalent cyclic group in the description for the compound represented by the above formula (C2).

Furthermore, a group in which two hydrogen atoms are removed from the aliphatic ring represented by the above-mentioned formula (c2-L8) is also preferable as the divalent organic group LG.

In the formula (C4), when the $R^{c8}$ is a divalent organic group LG, suitable examples of the divalent organic group LG include groups similar to the groups shown as the suitable examples of the divalent cyclic groups including the aliphatic ring CL in the description of the compound represented by the above formula (C2).

Suitable specific examples of the divalent organic group CL include divalent groups represented by the following formulae.

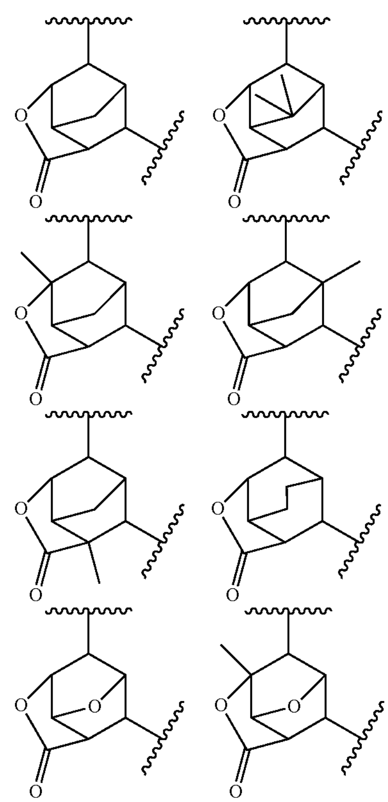

-continued
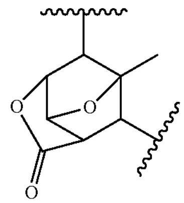
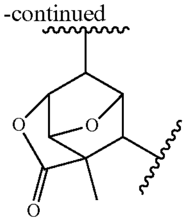
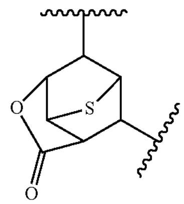
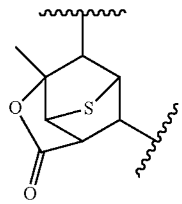
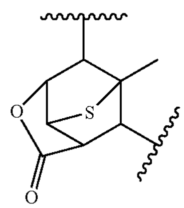
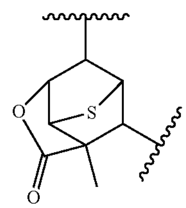
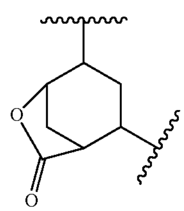
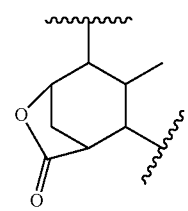
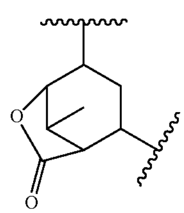
Divalent groups represented by the following formulae are also preferable as the divalent organic group LG.
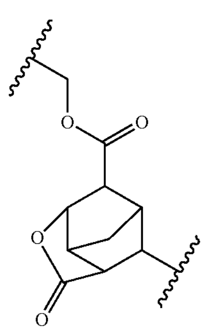
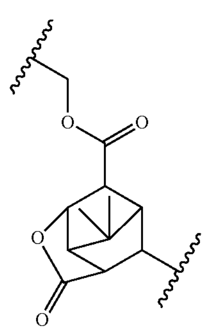
-continued
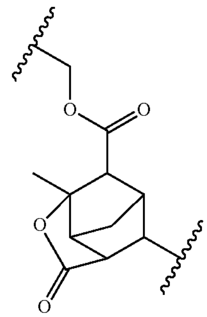
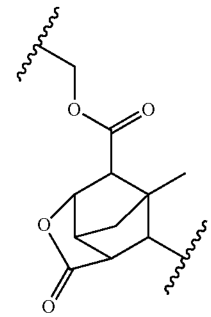
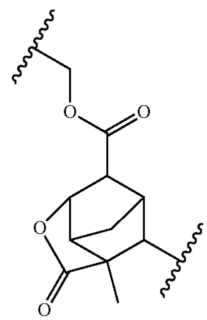
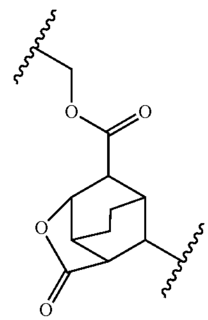
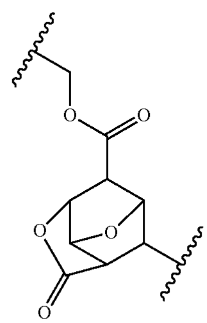
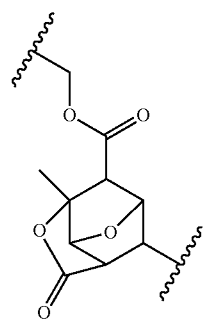
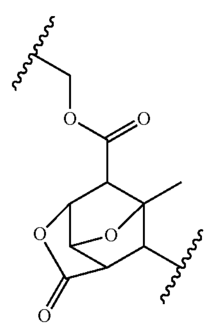
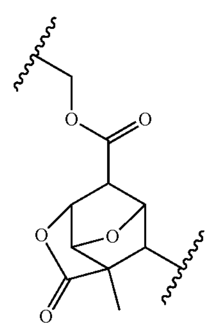
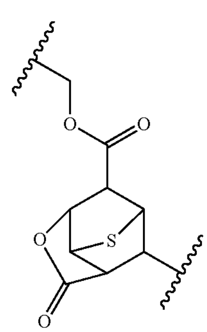
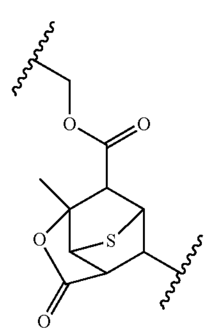

-continued

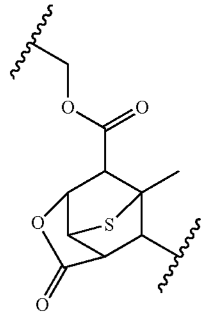

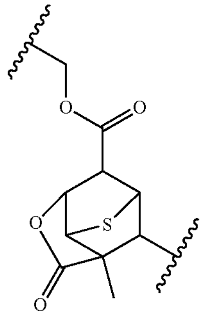

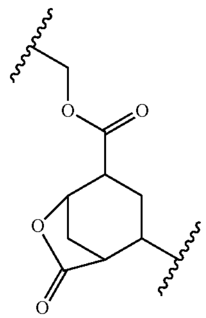

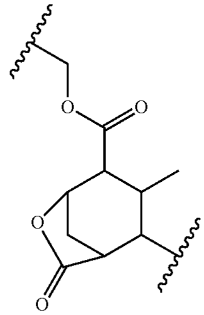

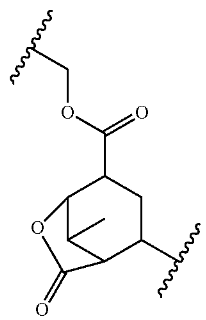

In the formula (C4), when the $R^{c8}$ is a divalent organic group SG having a cyclic group including a divalent group represented by —$SO_2$— in the ring structure, suitable examples of the divalent organic group SG include a divalent group in which one hydrogen atom is removed from the groups represented by the above-mentioned formulae (3-1) to (3-4).

When the $R^{c8}$ is a divalent organic group SG, suitable examples of the divalent organic group SG include groups in which two hydrogen atoms are removed from the following aliphatic ring.

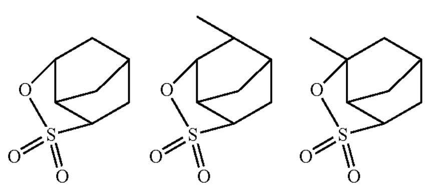

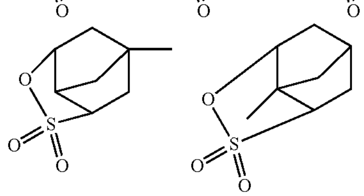

-continued

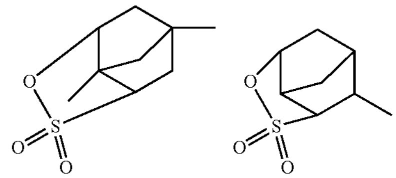

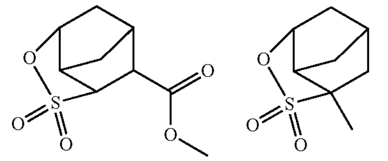

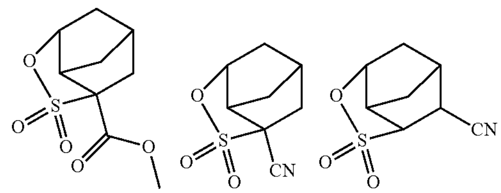

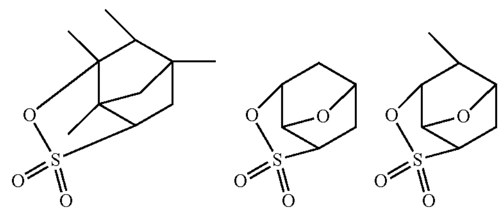

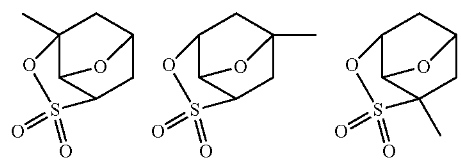

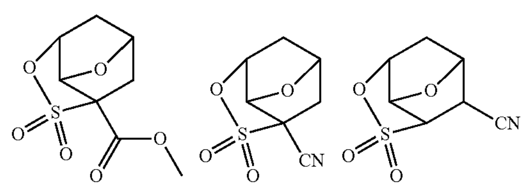

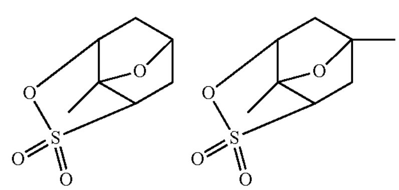

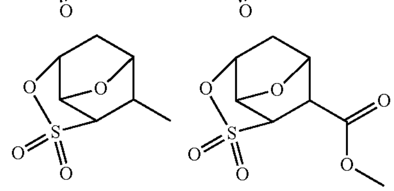

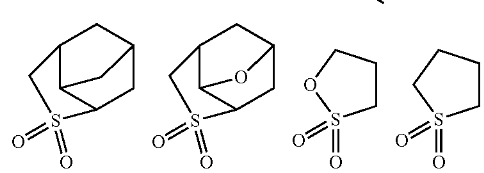

Suitable specific examples of the divalent organic group SG include divalent groups represented by the following formulae.

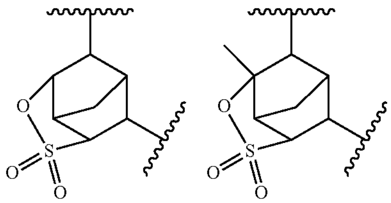
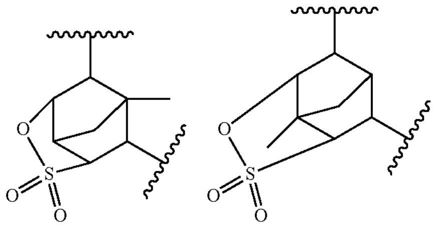
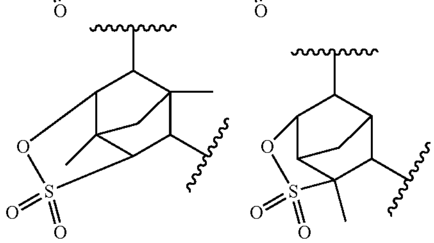
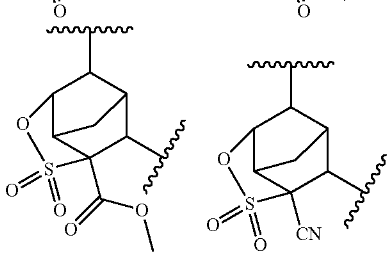
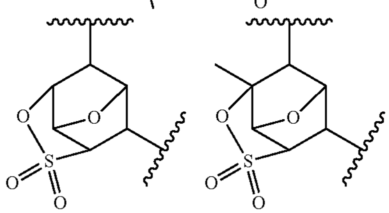
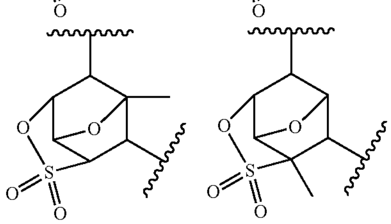
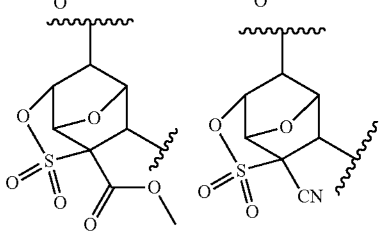
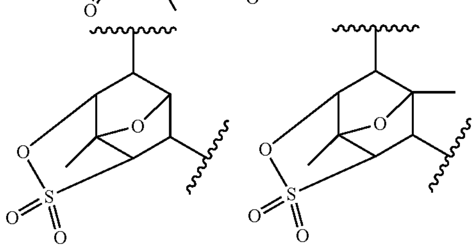
-continued
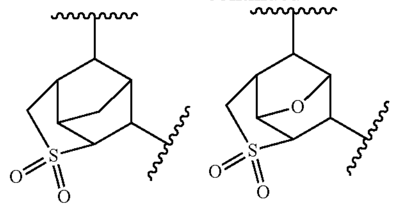
Furthermore, divalent groups represented by the following formulae are also preferable as the divalent organic group SG.
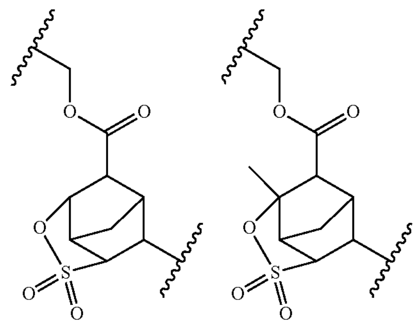
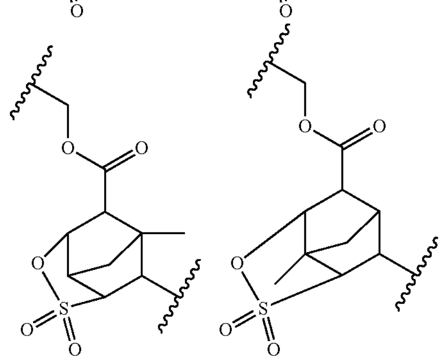
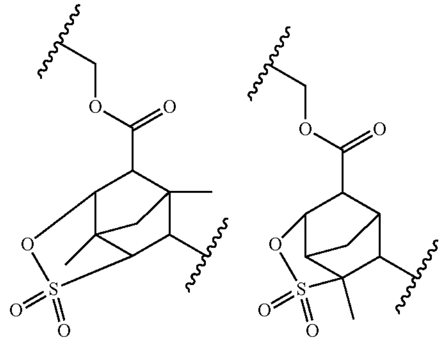
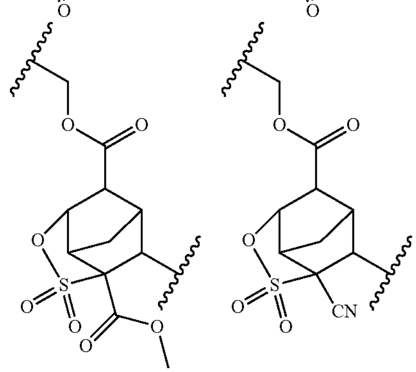

-continued

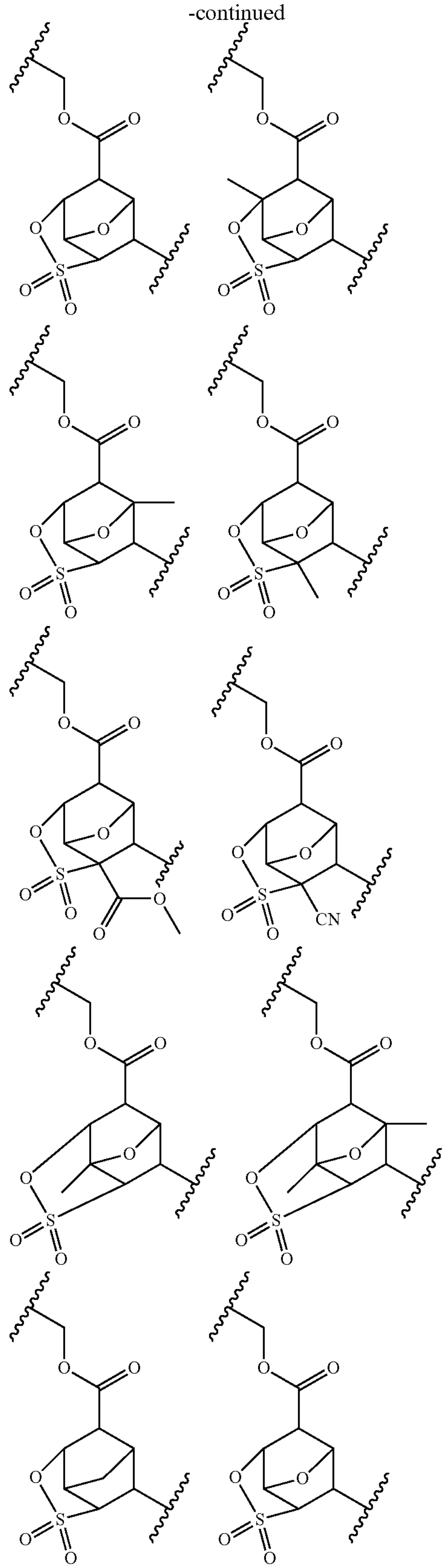

In the formula (C4), $R^{c0}$ is an acid dissociable group. The acid dissociable group may be similar to the acid-dissociable dissolution-inhibiting group described as to the resin (B).

Suitable examples of the acid dissociable group as $R^{c0}$ include groups of the following formulae.

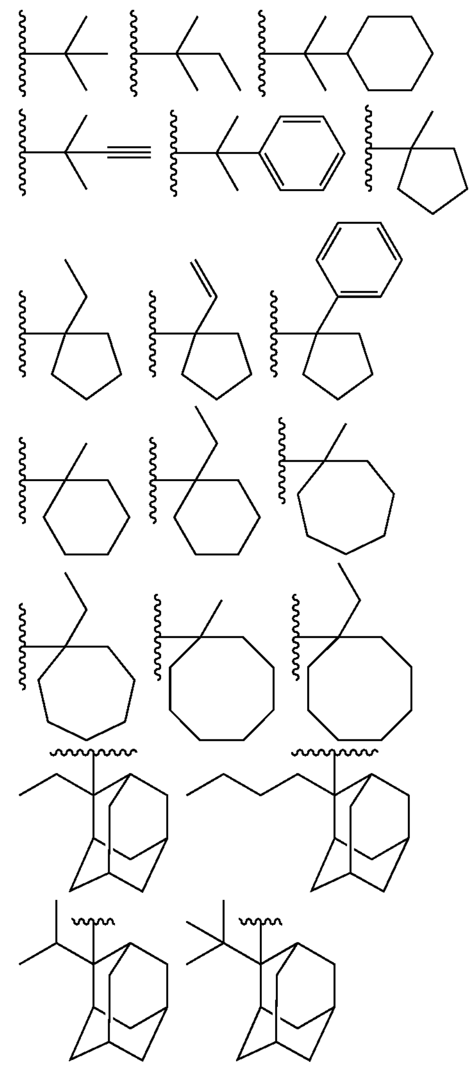

A method of manufacturing a mercapto compound represented by the formula (C4) is not particularly limited, but, for example, it can be synthesized according to the following scheme 5. Specifically, firstly, a mercapto compound in the carboxylic acid compound having the mercapto group represented by the following formula (C1-a) is selectively protected by a protecting group $X^c$ to obtain a carboxylic acid compound represented by the following formula (C1-b). Note here that in the compound represented by the formula (C4), since the bond O—$R^{c0}$ is cleaved by acid, as the protecting group $X^c$, a group that can be deprotected under conditions other than acid condition is employed. Examples of a mercapto group protected by such a protecting group $X^c$ include, for example, groups having structures represented by the above formulae (X-1) to (X-3) similar to the above-mentioned protected mercapto group described in the description of the compound represented by the formula (C1).

Subsequently, an ester compound represented by the formula (C4-d) is obtained from a carboxylic acid compound represented by the formula (C1-b) and alcohol represented by the following formula (C4-c). An esterification method is not particularly limited. A suitable esterification method is similar to the esterification method mentioned in the description in the above-mentioned compound represented by the formula (C1). Specific examples of the esterification method include a method of allowing a carbodiimide compound as a condensing agent to act in the presence of a small amount of N,N-dimethyl-4-aminopyridine, and condensing the carboxylic acid compound represented by the formula (C1-b) and alcohol represented by the formula (C4-c). Furthermore, the carboxylic acid compound represented by the formula (C1-b) may be reacted with halogenating agents such as thionyl chloride and phosphorus trichloride to generate carboxylic acid halide, followed by reacting the carboxylic acid halide with alcohol represented by the formula (C4-c).

In the obtained ester compound represented by the formula (C4-d), by deprotecting the protecting group $X^c$, the mercapto compound represented by the formula (C4) is obtained. A deprotection method is not particularly limited, and it can be appropriately selected depending on types of the protecting group $X^c$.

<Scheme 5>

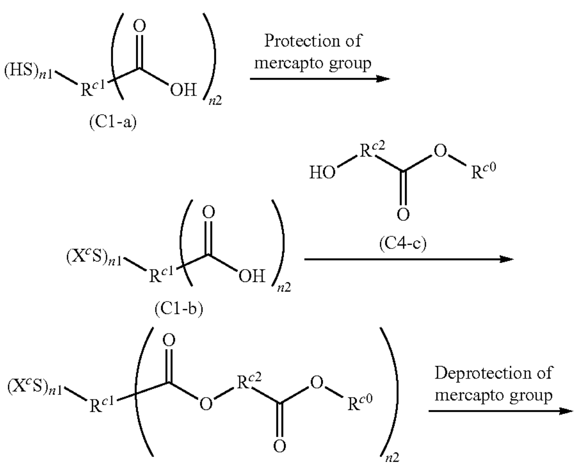

-continued

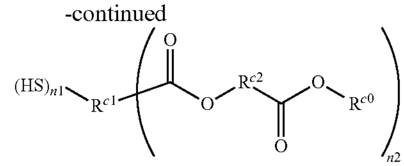

(C4)

In the mercapto compound represented by the formula (C4), when n1 is 1, the compound represented by the formula (C4) can be favorably synthesized also by, for example, the following scheme 6, similar to the compound represented by the formula (C1) mentioned above. In the method described in the scheme 6, a symmetrical polycarboxylic acid compound represented by the following formula (C1-e) and having a disulfide bond in the middle thereof is used as a raw material. Firstly, a polycarboxylic acid compound represented by the formula (C1-e) is reacted with alcohol represented by the formula (C4-c) to obtain an ester compound represented by the formula (C4-f). This esterification reaction is carried out similar to the reaction between a carboxylic acid compound represented by the formula (C1-b) and alcohol represented by the formula (C4-c) in the scheme 5.

Next, by cleaving a disulfide bond in the ester compound represented by the formula (C4-f), a mercapto compound represented by the formula (c4-g) is generated as a compound represented by the formula (C4) in which n1 is 1. A method of cleaving a disulfide bond is not particularly limited.

Suitable methods include a method of reacting the ester compound represented by the formula (C4-f) with a base such as triethylamine and dithiothreitol. Furthermore, a disulfide bond may be cleaved by reduction with tris(2-carboxyethyl)phosphine hydrochloride.

Note here that in the formulae (C1-a) to (C1-b) and (C4-c) to (C4-g) shown in the schemes 5 and 6, $R^{c1}$, $R^{c8}$, $R^{c0}$, n1, and n2 are the same as those in the formula (C4).

<Scheme 6>

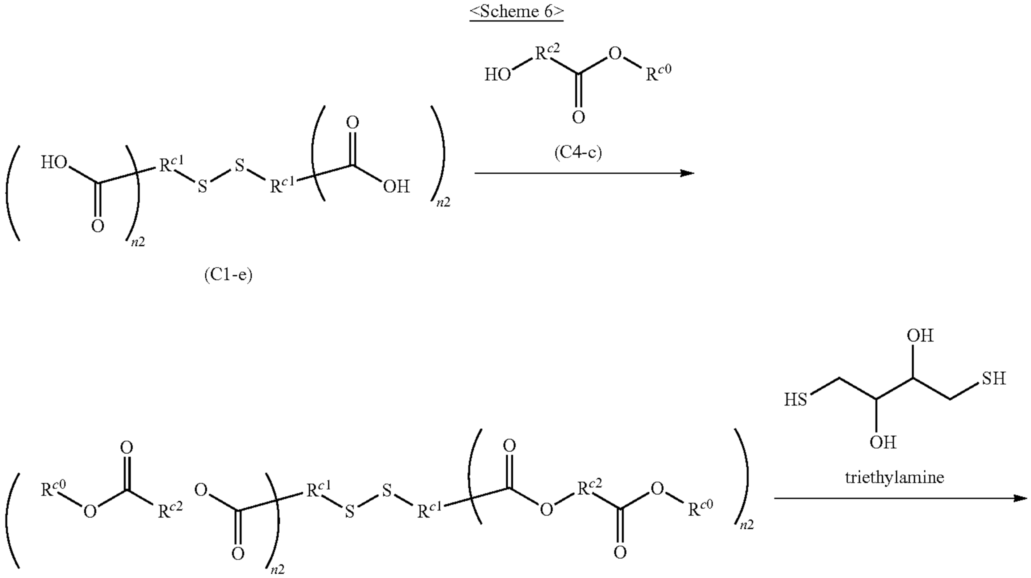

-continued

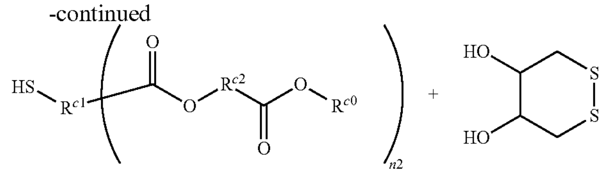

(C4-g)

As the above-described mercapto compound represented by the formula (C4), compounds of the following formulae are preferable. Note here that in the following formula, $R^z$ is a group represented by —$R^{c8}$—CO—O—$R^{c0}$.

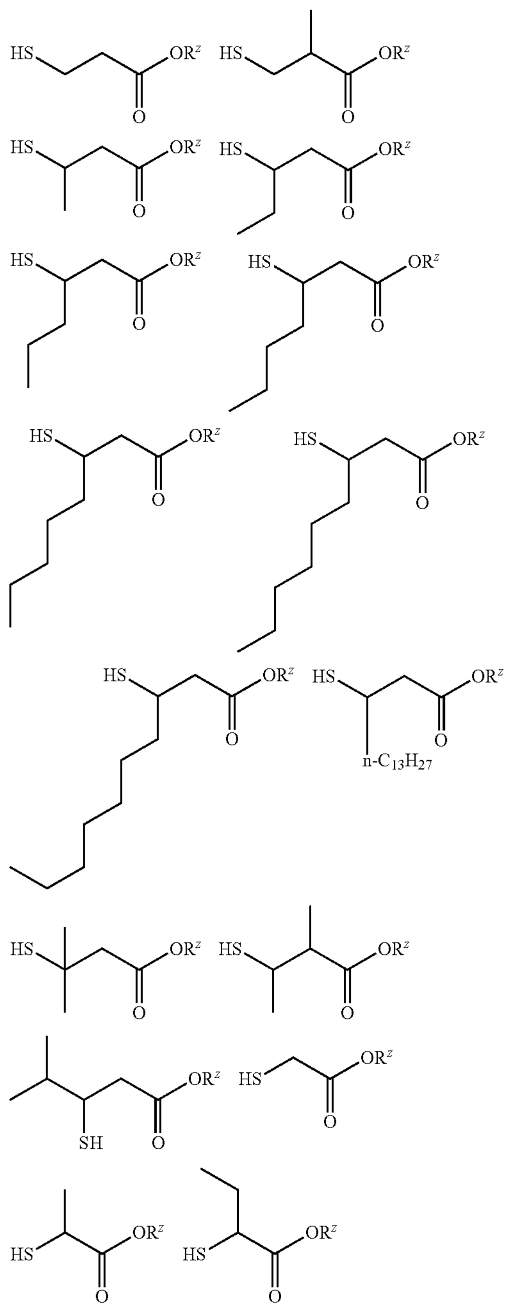

-continued

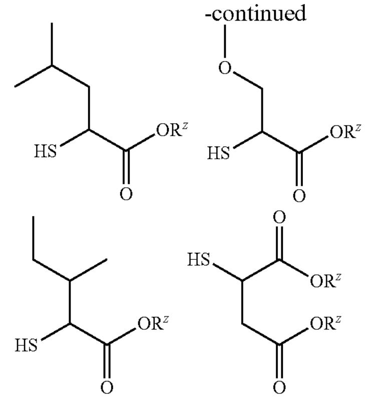

Specific suitable examples of the mercapto compound represented by the formula (C4) are shown below.

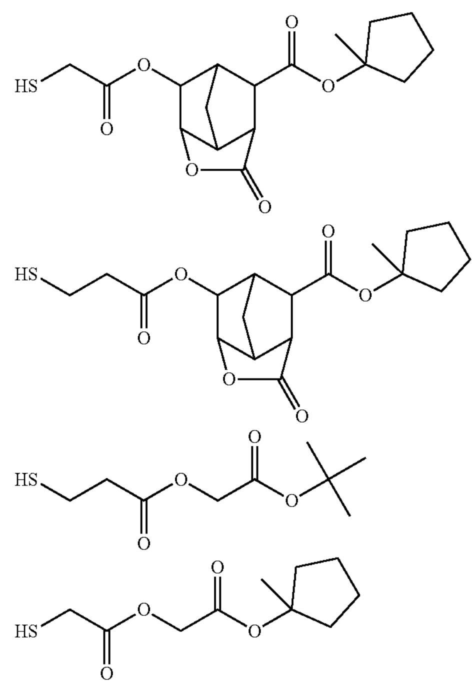

In the photosensitive resin composition, as the mercapto compound (C), one or more compounds selected from the group consisting of the above-mentioned compound represented by the formula (C1), compound represented by the formula (C2), compound represented by the formula (C3), and compound represented by the formula (C4) may be used singly or in combination of two or more thereof. When two or more of a plurality of compounds are used as the mercapto compound (C), the plurality of compounds may be the compound represented by the same formula or different formulae among the formula (C1), formula (C2), formula (C3), and formula (C4). In the aspect in which a plurality of types is used in combination, the combination is not particularly limited and can be used in arbitrary combinations. The mercapto compound (C) is preferably used in a range of 0.01 parts by mass or more and 5 parts by mass or less relative to the total mass of 100 parts by mass of the above resin (B) and the alkali soluble resin (D) described below, and particularly preferably in a range of 0.05 parts by mass or more and 2 parts by mass or less. When the addition amount of the mercapto compound (C) is 0.01 parts by mass or more, an effect of suppressing footing is achieved, and when the addition amount is 5 parts by mass or less, a good plated article can be formed. Note here that as mentioned above, when a plurality of types of the mercapto compounds (C) is used, it is preferable that the total amount of the plurality of types is in the range mentioned above.

When pattern formation is carried out by using a positive-type photosensitive resin composition including an acid generator (A) which generates acid upon exposure to an irradiated active ray or radiation, and a resin (B) the solubility of which in alkali increases under the action of acid, it is considered that acids generated from the acid generator (A) at the time of exposure are deactivated in the vicinity of the surface of the substrate. In particular, in the vicinity of the interface between an exposed portion and unexposed portion, in which the acid concentration is low, the footing tends to occur due to the influence of deactivation of acids on the surface of the substrate. In this respect, when the photosensitive resin composition includes a mercapto compound, deactivation of acids on the surface of the substrate is easily suppressed. As a result, the footing is easily suppressed.

Specifically, the mercapto compound (C) represented by the formula (C) includes a mercapto group and groups having high polarity represented by formulae (c1) to formula (c4) as $R^c$ in the molecule. Therefore, in the vicinity of interface between the substrate surface and the coated film, the mercapto compound (C) is easily oriented such that the mercapto group is positioned at a substrate surface side and, a group having high polarity is positioned at a coated film side. This is because the resin (B) and the like included in the photosensitive resin composition usually has high polarity to some extent. As a result of the above orientation of the mercapto compound (C), the mercapto compound (C) is homogeneously distributed to the substrate surface efficiently. As a result, deactivation of acid in the vicinity of the substrate surface is efficiently suppressed, and thereby the footing is suppressed.

In more detail, when the mercapto compound (C) is the compound represented by the formula (C1), the mercapto compound (C) includes a mercapto group, and a cyclic group having high polarity including an aliphatic ring CL, an aliphatic ring CS, or an aliphatic ring CP, in the molecule thereof. When the mercapto compound (C) is the compound represented by the formula (C2) or the formula (C3), the mercapto compound (C) includes a mercapto group, and an aliphatic cyclic group having high polarity including an aliphatic ring CA, an aliphatic ring CH, an aliphatic ring CL, an aliphatic ring CS, or an aliphatic ring CP in the molecule thereof. When the mercapto compound (C) is the compound represented by the formula (C4), the mercapto compound (C) includes a mercapto group, and a group having high polarity represented by —$R^{c2}$—CO—O—$R^{c0}$, in the molecule thereof. Therefore, in the vicinity of interface between the substrate surface and the coated film, the mercapto compound (C) represented by the formula (C1), (C2), (C3), or (C4) is easily oriented such that the mercapto group is positioned at a substrate surface side and, a cyclic group having high polarity is positioned at a coated film side. This is because the resin (B) and the like included in the photosensitive resin composition usually has high polarity to some extent. As a result of the above orientation of the mercapto compound (C), the mercapto compound (C) is homogeneously distributed to the substrate surface efficiently. As a result, deactivation of acid in the vicinity of the substrate surface is efficiently suppressed, and thereby the footing is suppressed.

Furthermore, the mercapto compound (C) itself is not easily dissolved in alkali developing solution. When the photosensitive resin composition includes the mercapto compound (C), residue may be generated at the time of development depending on the used amount of the mercapto compound (C). When residues are generated after development, due to attachment and deposition of residues onto the substrate surface, deterioration of a pattern shape as in the footing may occur. In this point, when the mercapto compound (C) is a compound represented by the formula (C2), (C3), or (C4), the mercapto compound (C) has an acid dissociable group in the molecule thereof. Therefore, in the coated film made of a photosensitive resin composition, in an exposed section, an acid dissociable group is eliminated in the mercapto compound (C), and the mercapto compound (C) is solubilized in an alkali developing solution. As a result, when the photosensitive resin composition includes the mercapto compound (C) as the compound represented by formula (C2), (C3), or (C4), regardless of the use amount of the mercapto compound (C), deterioration of a pattern shape due to the generation of residues after development does not easily occur.

For the above-mentioned reasons, it is considered that use of a photosensitive resin composition having the above predetermined structure remarkably suppresses the occurrence of footing.

<Alkali-Soluble Resin (D)>

It is preferred that the photosensitive resin composition further contains an alkali-soluble resin (D) in order to improve crack resistance. The alkali-soluble resin as referred to herein may be determined as follows. A solution of the resin having a resin concentration of 20% by mass (solvent: propylene glycol monomethyl ether acetate) is used to form a resin film having a thickness of 1 μm on a substrate, and immersed in an aqueous 2.38% by mass TMAH solution for 1 min. When the resin was dissolved in an amount of 0.01 μm or more, the resin is defined as being alkali soluble. The alkali-soluble resin (D) is preferably at least one selected from the group consisting of novolak resin (D1), polyhydroxystyrene resin (D2), and acrylic resin (D3).

[Novolak Resin (D1)]

A novolak resin is prepared by addition condensation of, for example, aromatic compounds having a phenolic hydroxy group (hereinafter, merely referred to as "phenols") and aldehydes in the presence of an acid catalyst.

Examples of the above phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethyl phenol, 3,4,5-trimethyl phenol, p-phenylphenol, resorcinol, hydroquinone, hydroquinone monomethyl ether, pyrogallol, phloroglycinol, hydroxydiphenyl, bisphenol A, gallic acid, gallic acid ester, α-naphthol, β-naphthol, and the like. Examples of the above aldehydes include formaldehyde, furfural, benzaldehyde, nitrobenzaldehyde, acetaldehyde, and the like. The catalyst used in the addition condensation reaction is not particularly limited, and examples thereof include hydrochloric acid, nitric acid, sulfuric acid, formic acid, oxalic acid, acetic acid, etc., for acid catalyst.

The flexibility of the novolak resins can be enhanced more when o-cresol is used, a hydrogen atom of a hydroxyl group in the resins is substituted with other substituents, or bulky aldehydes are used.

The mass average molecular weight of novolac resin (D1) is not particularly limited as long as the purpose of the present invention is not impaired, but the mass average molecular weight is preferably 1,000 or more and 50,000 or less.

[Polyhydroxystyrene Resin (D2)]

The hydroxystyrene compound to constitute the polyhydroxystyrene resin (D2) is exemplified by p-hydroxystyrene, α-methylhydroxystyrene, α-ethylhydroxystyrene, and the like. Furthermore, the polyhydroxystyrene resin (D2) is preferably prepared to give a copolymer with a styrene resin. The styrene compound to constitute the styrene resin is exemplified by styrene, chlorostyrene, chloromethylstyrene, vinyltoluene, α-methylstyrene, and the like.

The mass average molecular weight of the polyhydroxystyrene resin (D2) is not particularly limited as long as the purpose of the present invention is not impaired, but the mass average molecular weight is preferably 1,000 or more and 50,000 or less.

[Acrylic Resin (D3)]

It is preferable that the acrylic resin (D3) includes a constituent unit derived from a polymerizable compound having an ether bond and a constituent unit derived from a polymerizable compound having a carboxyl group.

Examples of the above polymerizable compound having an ether bond include (meth)acrylic acid derivatives having an ether bond and an ester bond such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, tetrahydrofurfuryl (meth)acrylate, and the like. The above polymerizable compound having an ether bond is preferably, 2-methoxyethyl acrylate, and methoxytriethylene glycol acrylate. These polymerizable compounds may be used alone, or in combinations of two or more.

Examples of the above polymerizable compound having a carboxy group include monocarboxylic acids such as acrylic acid, methacrylic acid and crotonic acid; dicarboxylic acids such as maleic acid, fumaric acid and itaconic acid; compounds having a carboxy group and an ester bond such as 2-methacryloyloxyethyl succinic acid, 2-methacryloyloxyethyl maleic acid, 2-methacryloyloxyethyl phthalic acid, 2-methacryloyloxyethyl hexahydrophthalic acid and the like. The above polymerizable compound having a carboxy group is preferably, acrylic acid and methacrylic acid. These polymerizable compounds may be used alone, or in combinations of two or more thereof.

The mass average molecular weight of the acrylic resin (D3) is not particularly limited as long as the purpose of the present invention is not impaired, but the mass average molecular weight is preferably 50,000 or more and 800,000 or less.

The content of the alkali-soluble resin (D) is such that when the total amount of the above resin (B) and the alkali-soluble resin (D) is taken as 100 parts by mass, the content is preferably 0 parts by mass or more and 80 parts by mass or less, and more preferably 0 parts by mass or more and 60 parts by mass or less. By setting the content of the alkali-soluble resin (D) to the range described above, there is a tendency for resistance to cracking to increase, and film loss at the time of development can be prevented.

<Acid Diffusion Control Agent (E)>

In order to improve the configuration of resist pattern used as a template, the post-exposure delay stability of photosensitive resin film and the like, it is preferable that the photosensitive resin composition further contains an acid diffusion control agent (E). The acid diffusion control agent (E) is preferably a nitrogen-containing compound (E1), and an organic carboxylic acid, or an oxo acid of phosphorus or a derivative thereof (E2) may be further included as needed.

[Nitrogen-Containing Compound (E1)]

Examples of the nitrogen-containing compound (E1) include trimethylamine, diethylamine, triethylamine, di-n-propylamine, tri-n-propylamine, tri-n-pentylamine, tribenzylamine, diethanolamine, triethanolamine, n-hexylamine, n-heptylamine, n-octylamine, n-nonylamine, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrrolidone, N-methylpyrrolidone, methylurea, 1,1-dimethylurea, 1,3-dimethylurea, 1,1,3,3,-tetramethylurea, 1,3-diphenylurea, imidazole, benzimidazole, 4-methylimidazole, 8-oxyquinoline, acridine, purine, pyrrolidine, piperidine, 2,4,6-tri (2-pyridyl)-S-triazine, morpholine, 4-methylmorpholine, piperazine, 1,4-dimethylpiperazine, 1,4-diazabicyclo[2.2.2]octane, pyridine and the like. These may be used alone, or in combinations of two or more thereof.

Furthermore, commercially available hindered amine compounds such as Adeka Stab LA-52, Adeka Stab LA-57, Adeka Stab LA-63P, Adeka Stab LA-68, Adeka Stab LA-72, Adeka Stab LA-77Y, Adeka Stab LA-77G, Adeka Stab LA-81, Adeka Stab LA-82, Adeka Stab LA-87 (all manufactured by ADEKA), and the like, and pyridine whose 2,6-position has been substituted with a substituent such as a hydrocarbon group such as 2,6-diphenyl pyridine and 2,6-di-tert-butyl pyridine can be used as the nitrogen-containing compound (E1).

The nitrogen-containing compound (E1) may be used in an amount typically in the range of 0 parts by mass or more and 5 parts by mass or less, and particularly preferably in the range of 0 parts by mass or more and 3 parts by mass or less, with respect to 100 parts by mass of total mass of the above resin (B) and the above alkali-soluble resin (D).

[Organic Carboxylic Acid or Oxo Acid of Phosphorus or Derivative Thereof (E2)]

Among the organic carboxylic acid, or the oxo acid of phosphorus or the derivative thereof (E2), specific preferred examples of the organic carboxylic acid include malonic acid, citric acid, malic acid, succinic acid, benzoic acid, salicylic acid and the like, and salicylic acid is particularly preferred.

Examples of the oxo acid of phosphorus or derivatives thereof include phosphoric acid and derivatives such as esters thereof such as phosphoric acid, phosphoric acid di-n-butyl ester, and phosphoric acid diphenyl ester; phosphonic acid and derivatives such as esters thereof such as phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives such as esters thereof such as phosphinic acid and phenylphosphinic acid; and the like. Among these, phosphonic acid is particularly preferred. These may be used alone, or in combinations of two or more thereof.

The organic carboxylic acid or oxo acid of phosphorus or derivative thereof (E2) may be used in an amount usually in the range of 0 parts by mass or more and 5 parts by mass or less, and particularly preferably in the range of 0 parts by mass and 3 parts by mass or less, with respect to 100 parts by mass of total mass of the above resin (B) and the above alkali-soluble resin (D).

Moreover, in order to form a salt to allow for stabilization, the organic carboxylic acid, or the oxo acid of phosphorous or the derivative thereof (E2) is preferably used in an amount equivalent to that of the above nitrogen-containing compound (E1).

<Organic Solvent (S)>

The photosensitive resin composition contains an organic solvent (S). There is no particular limitation on the types of the organic solvent (S) as long as the objects of the present invention are not impaired, and an organic solvent appropriately selected from those conventionally used for positive-type photosensitive resin compositions can be used.

Specific examples of the organic solvent (S) include ketones such as acetone, methyl ethyl ketone, cyclohexanone, methyl isoamyl ketone, and 2-heptanone; polyhydric alcohols and derivatives thereof, like monomethyl ethers, monoethyl ethers, monopropyl ethers, monobutyl ethers and monophenyl ethers, such as ethylene glycol, ethylene glycol monoacetate, diethylene glycol, diethylene glycol monoacetate, propylene glycol, propylene glycol monoacetate, dipropylene glycol and dipropylene glycol monoacetate; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, methyl pyruvate, ethylethoxy acetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanate, 3-methoxybutyl acetate and 3-methyl-3-methoxybutyl acetate; aromatic hydrocarbons such as toluene and xylene; and the like. These may be used alone, or as a mixture of two or more thereof.

There is no particular limitation on the content of the organic solvent (S) as long as the objects of the present invention are not impaired. In a case where a photosensitive resin composition is used for a thick-film application such that a photosensitive resin layer obtained by the spin coating method and the like has a film thickness of 10 μm or more, the organic solvent (S) is preferably used in a range where the solid content concentration of the photosensitive resin composition is 30% by mass or more and 55% by mass or less.

<Other Components>

The photosensitive resin composition may further contain a polyvinyl resin for improving plasticity. Specific examples of the polyvinyl resin include polyvinyl chloride, polystyrene, polyhydroxystyrene, polyvinyl acetate, polyvinylbenzoic acid, polyvinyl methyl ether, polyvinyl ethyl ether, polyvinyl alcohol, polyvinyl pyrrolidone, polyvinyl phenol, and copolymers thereof, and the like. The polyvinyl resin is preferably polyvinyl methyl ether in view of lower glass transition temperatures.

Further, the photosensitive resin composition may also contain an adhesive auxiliary agent in order to improve the adhesiveness between a template formed with the photosensitive resin composition and a metal substrate.

Also, the photosensitive resin composition may further contain a surfactant for improving coating characteristics, defoaming characteristics, leveling characteristics, and the like. As the surfactant, for example, a fluorine-based surfactant or a silicone-based surfactant is preferably used. Specific examples of the fluorine-based surfactant include commercially available fluorine-based surfactants such as BM-1000 and BM-1100 (both manufactured by B.M-Chemie Co., Ltd.), Megafac F142D, Megafac F172, Megafac F173 and Megafac F183 (all manufactured by Dainippon Ink And Chemicals, Incorporated), Flolade FC-135, Flolade FC-170C, Flolade FC-430 and Flolade FC-431 (all manufactured by Sumitomo 3M Ltd.), Surflon S-112, Surflon S-113, Surflon S-131, Surflon S-141 and Surflon S-145 (all manufactured by Asahi Glass Co., Ltd.), SH-28PA, SH-190, SH-193, SZ-6032 and SF-8428 (all manufactured by Toray Silicone Co., Ltd.) and the like, but not limited thereto. As the silicone-based surfactant, an unmodified silicone-based surfactant, a polyether modified silicone-based surfactant, a polyester modified silicone-based surfactant, an alkyl modified silicone-based surfactant, an aralkyl modified silicone-based surfactant, a reactive silicone-based surfactant, and the like, can be preferably used. As the silicone-based surfactant, commercially available silicone-based surfactant can be used. Specific examples of the commercially available silicone-based surfactant include Paintad M (manufactured by Dow Corning Toray Co., Ltd.), Topica K1000, Topica K2000, and Topica K5000 (all manufactured by Takachiho Industry Co., Ltd.), XL-121 (polyether modified silicone-based surfactant, manufactured by Clariant Co.), BYK-310 (polyester modified silicone-based surfactant, manufactured by BYK), and the like.

Additionally, in order to finely adjust the solubility in a developing solution, the photosensitive resin composition may further contain an acid, an acid anhydride, or a solvent having a high boiling point.

Specific examples of the acid and acid anhydride include monocarboxylic acids such as acetic acid, propionic acid, n-butyric acid, isobutyric acid, n-valeric acid, isovaleric acid, benzoic acid, and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, and syringic acid; polyvalent carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, butanetetracarboxylic acid, trimellitic acid, pyromellitic acid, cyclopentanetetracarboxylic acid, butanetetracarboxylic acid, and 1,2,5,8-naphthalenetetracarboxylic acid; acid anhydrides such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, Himic anhydride, 1,2,3,4-butanetetracarboxylic anhydride, cyclopentanetetracarboxylic dianhydride, phthalic anhydride, pyromellitic anhydride, trimellitic anhydride, benzophenonetetracarboxylic anhydride, ethylene glycol bis anhydrous trimellitate, and glycerin tris anhydrous trimellitate; and the like.

Furthermore, specific examples of the solvent having a high boiling point include N-methylformamide, N,N-dimethylformamide, N-methylformanilide, N-methylacetamide, N,N-dimethlyacetamide, N-methylpyrrolidone, dimethyl sulfoxide, benzyl ethyl ether, dihexyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and the like.

Moreover, the photosensitive resin composition may further contain a sensitizer for improving the sensitivity.

<Method of Preparing Chemically Amplified Positive-Type Photosensitive Resin Composition>

A chemically amplified positive-type photosensitive resin composition is prepared by mixing and stirring the above components by the common method. Machines which can be used for mixing and stirring the above components include dissolvers, homogenizers, 3-roll mills and the like. After uniformly mixing the above components, the resulting mixture may be filtered through a mesh, a membrane filter and the like.

<<Photosensitive Dry Film>>

A photosensitive dry film includes a substrate film, and a photosensitive resin layer formed on the surface of the substrate film. The photosensitive resin layer is made of the above-mentioned photosensitive resin compositions.

As the substrate film, a film having optical transparency is preferable. Specifically, a polyethylene terephthalate (PET) film, a polypropylene (PP) film, a polyethylene (PE) film, and the like. In view of excellent balance between the optical transparency and the breaking strength, a polyethylene terephthalate (PET) film is preferable.

The above-mentioned photosensitive resin composition is applied on the substrate film to form a photosensitive resin layer, and thereby a photosensitive dry film is manufactured. When the photosensitive resin layer is formed on the substrate film, a photosensitive resin composition is applied and dried on the substrate film using an applicator, a bar coater, a wire bar coater, a roller coater, a curtain flow coater, and the like, so that a film thickness after drying is preferably 0.5 μm or more and 300 μm or less, more preferably 1 μm or more and 300 μm or less, and particularly preferably 3 μm or more and 100 μm or less.

The photosensitive dry film may have a protective film on the photosensitive resin layer. Examples of the protective film include a polyethylene terephthalate (PET) film, a polypropylene (PP) film, a polyethylene (PE) film, and the like.

<<Patterned Resist Film, and Method of Manufacturing Substrate with Template>>

A method of forming a patterned resist film on a metal surface of a substrate having the metal surface using the above-described photosensitive resin composition is not particularly limited. Such a patterned resist film is suitably used as a temperate for forming a plated article. A suitable method includes a manufacturing method of a patterned resist film that includes:

layering a photosensitive resin layer on a metal surface of a substrate having the metal surface, the layer including the photosensitive resin composition, exposing the photosensitive resin layer through irradiation with an active ray or radiation, and developing the exposed photosensitive resin layer.

A method of manufacturing a substrate with a template for forming a plated article is the same as the method of manufacturing a patterned resist film except that a template is formed for forming a plated article by development in the developing.

There is no particular limitation for the substrate on which a photosensitive resin layer is laminated, and conventionally known substrates can be used. Examples include substrates for electronic part, substrates having a predetermined wire pattern formed thereon, and the like. Substrates having a metal surface are used as the above substrate. As metal species constituting a metal surface, copper, gold and aluminum are preferred, and copper is more preferred.

The photosensitive resin layer is laminated on the substrate, for example, as follows. In other words, a liquid photosensitive resin composition is coated onto a substrate, and the coating is heated to remove the solvent and thus to form a photosensitive resin layer having a desired thickness. The thickness of the photosensitive resin layer is not particularly limited as long as it is possible to form a resist pattern serving as a template which has a desired thickness. The thickness of the photosensitive resin layer is not particularly limited, but is preferably 0.5 μm or more, more preferably 0.5 μm or more and 300 μm or less, and particularly preferably 1 μm or more and 150 μm or less, and most preferably 3 μm or more and 100 μm or less.

As a method of applying a photosensitive resin composition onto a substrate, methods such as the spin coating method, the slit coat method, the roll coat method, the screen printing method and the applicator method can be employed. Pre-baking is preferably performed on a photosensitive resin layer. The conditions of pre-baking may differ depending on the components in a photosensitive resin composition, the blending ratio, the thickness of a coating film and the like. They are usually about 2 minutes or more and 120 minutes or less at 70° C. or more and 200° C. or less, and preferably 80° C. or more and 150° C. or less.

The photosensitive resin layer formed as described above is selectively irradiated (exposed) with an active ray or radiation, for example, an ultraviolet radiation or visible light with a wavelength of 300 nm or more and 500 nm or less through a mask having a predetermined pattern.

Low pressure mercury lamps, high pressure mercury lamps, super high pressure mercury lamps, metal halide lamps, argon gas lasers, etc., can be used for the light source of the radiation. The radiation may include micro waves, infrared rays, visible lights, ultraviolet rays, X-rays, γ-rays, electron beams, proton beams, neutron beams, ion beams, etc. The irradiation dose of the radiation may vary depending on the constituent of the photosensitive resin composition, the film thickness of the photosensitive resin layer, and the like. For example, when an ultra high-pressure mercury lamp is used, the dose may be 100 $mJ/cm^2$ or more and 10,000 $mJ/cm^2$ or less. The radiation includes a light ray to activate the acid generator (A) in order to generate an acid.

After the exposure, the diffusion of acid is promoted by heating the photosensitive resin layer using a known method to change the alkali solubility of the photosensitive resin layer at an exposed portion in the photosensitive resin film.

Subsequently, the exposed photosensitive resin layer is developed in accordance with a conventionally known method, and an unnecessary portion is dissolved and removed to form a predetermined resist pattern, or a template for forming a plated article. At this time, as the developing solution, an alkaline aqueous solution is used.

As the developing solution, an aqueous solution of an alkali such as, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene or 1,5-diazabicyclo[4.3.0]-5-nonane can be used. Also, an aqueous solution prepared by adding an adequate amount of a water-soluble organic solvent such as methanol or ethanol, or a surfactant to the above aqueous solution of the alkali can be used as the developing solution.

The developing time may vary depending on the constituent of the photosensitive resin composition, the film thickness of the photosensitive resin layer, and the like. Usually, the developing time is 1 minute or more and 30 minutes or less. The method of the development may be any one of a liquid-filling method, a dipping method, a paddle method, a spray developing method, and the like.

After development, it is washed with running water for 30 seconds or more and 90 seconds or less, and then dried with an air gun, an oven, and the like. In this manner, it is possible to form a resist pattern which has been patterned in a predetermined pattern on a metal surface of a substrate having a metal surface. Furthermore, in this manner, it is possible to manufacture a substrate with a template having a resist pattern serving as a template on a metal surface of a substrate having a metal surface.

<<Method of Manufacturing Plated Article>>

A conductor such as a metal may be embedded, by plating, into a nonresist portion (a portion removed with a developing solution) in the template formed by the above method on the substrate to form a plated article, for example, like a contacting terminal such as a bump or a metal post. Note that there is no particular limitation on the method of plate processing, and various conventionally known methods can be used. As a plating liquid, in particular, a solder plating liquid, a copper plating liquid, a gold plating liquid and a nickel plating liquid are suitably used. Finally, the remaining template is removed with a stripping liquid and the like in accordance with a conventional method.

According to the above-mentioned method, a resist pattern serving as a template is formed while suppressing the occurrence of "footing" in which the width of the bottom (the side proximate to the surface of a support) becomes narrower than that of the top (the side proximate to the surface of a resist layer) in a nonresist portion. By using a substrate having the thus manufactured template and in which footing is suppressed, a plated article having excellent adhesiveness to the substrate can be manufactured.

EXAMPLES

Below, the present invention will be described in more detail with reference to Examples, but the present invention shall not be limited to these Examples.

Preparation Example 1

(Synthesis of Mercapto Compound C1-p2)

In Preparation Example 1, a mercapto compound C1-p2 having the following structure was synthesized.

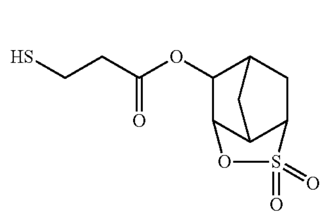 [SMILES: O=C(CCS)OC1C2CC3C1OS(=O)(=O)C3C2]

Into a flask, 12.0 g of 3,3'-dithiopropionic acid, and 120 g of dichloromethane were added. The content of the flask was stirred under nitrogen atmosphere. Subsequently, 2.79 g of N,N-dimethyl-4-aminopyridine, 24.1 g of carbodiimide compound, and 20.6 g of alcohol compound represented by the following formula were added to the flask, and the content of the flask was stirred for 10 hours.

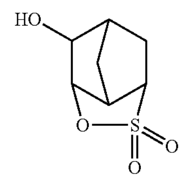 [SMILES: O=S1(=O)OC2C(O)C3CC2C1C3]

Then, the reaction solution was washed with 60.0 g of pure water five times, and subsequently, the reaction solution was concentrated to obtain 29.0 g of intermediate product represented by the following formula.

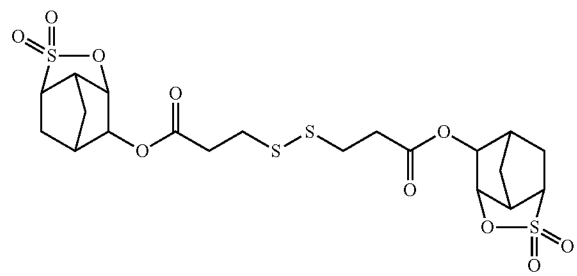 [SMILES: O=C(CCSSCCC(=O)OC1C2CC3C1OS(=O)(=O)C3C2)OC1C2CC3C1OS(=O)(=O)C3C2]

Into the flask, 25.1 g of the above-mentioned intermediate product and 251 g of dichloromethane were added. The content of the flask was stirred under nitrogen atmosphere.

Subsequently, 6.90 g of triethylamine and 9.90 g of dithiothreitol were added into the flask, and the content of the flask was stirred at room temperature for five hours. Then, the reaction solution was diluted with 127 g of dichloromethane. The diluted reaction solution was washed with 127 g of 1% by mass hydrochloric acid aqueous solution, and then washed with 127 g of pure water five times. The washed reaction solution was concentrated to obtain 45.0 g of mercapto compound C1-p2.

$^1$H-NMR (600 MHz, CDCl3): δ4.80-4.70 (d, 2H), 3.60-3.49 (m, 2H), 2.80 (m, 2H), 2.65 (m, 2H), 2.60 (s, 1H), 2.20-1.90 (m, 3H), 1.80-1.45 (m, 2H)

Preparation Example 2

(Synthesis of Mercapto Compound C1-p1)

In Preparation Example 2, the following mercapto compound C1-p1 was synthesized.

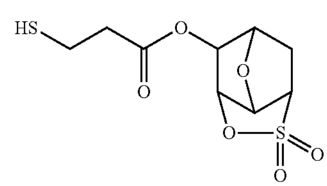 [SMILES: O=C(CCS)OC1C2CC3C(O2)C1OS3(=O)=O]

Into a flask, 10.0 g of 3-acetyl thiopropionic acid, and 100 g of dichloromethane were added. The content of the flask was stirred under nitrogen atmosphere. Subsequently, 1.65 g of N,N-dimethyl-4-aminopyridine, 14.3 g of carbodiimide compound, and 12.3 g of alcohol compound represented by the following formula were added into the flask, and the content of the flask was stirred for 10 hours.

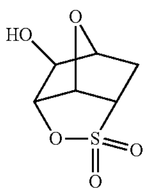

Then, the reaction solution was washed with 50.0 g of pure water five times, and subsequently, the reaction solution was concentrated to obtain 16.0 g of intermediate product represented by the following formula.

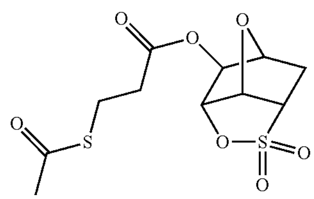 [SMILES: CC(=O)SCCC(=O)OC1C2CC3C(O2)C1OS3(=O)=O]

Into the flask, 15.0 g of the above-mentioned intermediate product and 50 g of methanol were added. The content of the flask was stirred under nitrogen atmosphere. Subsequently, 10 g of 10% hydrochloric acid aqueous solution was added into the flask, and the content of the flask was stirred at room temperature for five hours. Then, the reaction solution was extracted with 100 g of ethyl acetate twice, and the organic phase was washed with 50 g of pure water three times and concentrated to obtain 10.5 g of mercapto compound C1-p1.

$^1$H-NMR (600 MHz, DMSO-d6): δ5.70 (t, 1H), 5.00 (d, 1H), 4.86 (s, 1H), 4.78 (d, 1H), 4.17 (m, 1H), 2.67 (m, 4H), 2.50 (m, 1H), 2.39-2.21 (m, 2H)

Preparation Examples 3 to 9

The following mercapto compounds C1-p3 to C1-p9 were obtained in the same manner as in Preparation Example 1.

C1-p1

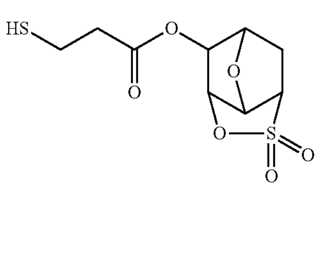

C1-p2

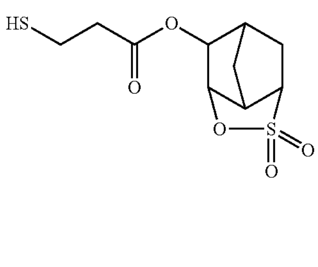

-continued

C1-p3

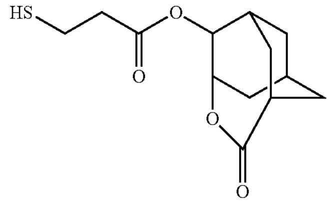

C1-p4

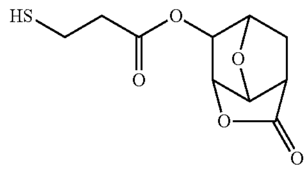

C1-p5

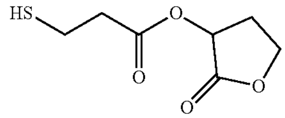

C1-p6

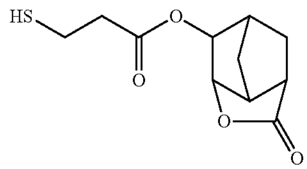

C1-p7

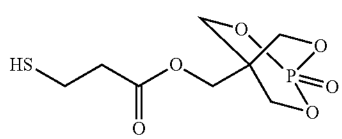

C1-p8

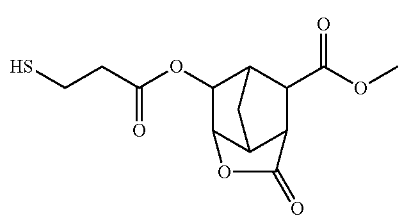

C1-p9

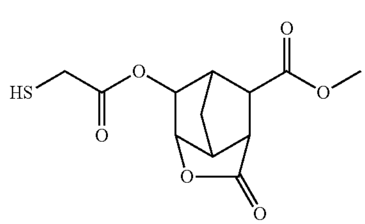

Preparation Example 10

(Synthesis of Mercapto Compound C2-p1)

In Preparation Example 10, a mercapto compound C2-p1 having the following structure was synthesized.

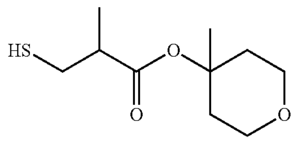

Into a flask, 9.21 g of methacrylic acid ester shown in the following reaction formula, and 91.9 g of tetrahydrofuran (THF) were added. The content of the flask was stirred under nitrogen atmosphere. Subsequently, 7.68 g of thioacetic acid lithium was added into the flask, and then the content of the flask was stirred at 60° C. Then, n-heptane was added into the flask, followed by washing the organic phase with 91.9 g of pure water five times repeatedly. Then, the solvent was removed by evaporation from the organic phase to obtain 10.8 g of precursor C2-pr1.

Into the flask, 9.49 g of the precursor C2-pr1, 94.9 g of methanol, and 25.5 g of 10% by mass aqueous ammonia were added. The content of the flask was stirred at room temperature for 10 hours. Subsequently, 11.9 g of acetic acid was added to the reaction solution, and then, 94.9 g of dichloromethane and 94.9 g of pure water were added into the flask. The content of the flask was stirred, and then allowed to stand for separation, and the organic phase was collected. The collected organic phase was washed with 94.9 g of 1% by mass aqueous ammonia once, and subsequently washed with 94.9 g of pure water five times, and the solvent was removed by evaporation from the organic phase to obtain 7.87 g of mercapto compound C2-p1.

$^1$H-NMR (600 MHz, DMSO-d6): δ3.70-3.51 (m, 4H), 3.00-2.15 (m, 3H), 2.05 (t, 2H), 1.75 (t, 2H), 1.53 (s, 3H), 1.25-1.05 (m, 3H)

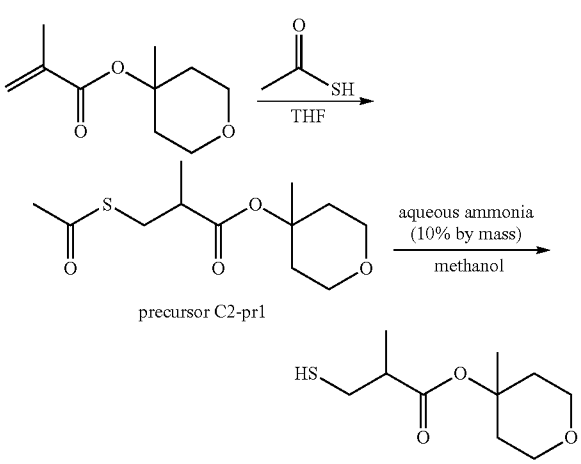

Preparation Example 11

(Synthesis of Mercapto Compound C3-p1)

In Preparation Example 2, a mercapto compound C3-p1 having the following structure was synthesized.

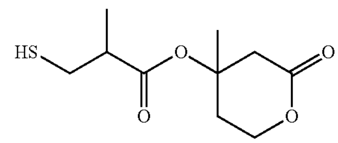

A mercapto compound C3-p1 was obtained in the same manner as in Preparation Example 10 except that methacrylic acid ester as a raw material was changed to the following methacrylic acid ester.

$^1$H-NMR (600 MHz, DMSO-d6): δ4.49-4.31 (m, 2H), 3.11 (d, 1H), 3.00-2.60 (m, 2H), 2.57 (d, 2H), 2.22 (m, 1H), 2.08 (t, 1H), 1.90 (s, 3H), 1.25-1.05 (m, 3H)

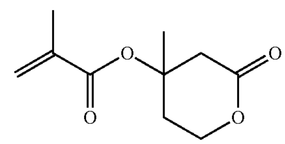

Preparation Example 12

(Synthesis of Mercapto Compound C4-p1)

In Preparation Example 12, a mercapto compound C4-p1 having the following structure was synthesized.

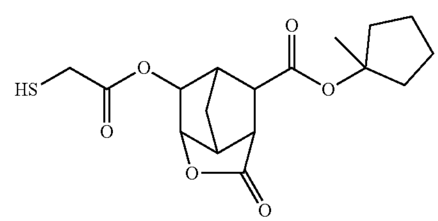 [SMILES: CC1(OC(=O)C2C3CC4C(OC(=O)C42)C3OC(=O)CS)CCCC1]

Into a flask that had been cooled to −20° C. under nitrogen atmosphere, 45.5 mL of 1.13 M LDA (lithium diisopropylamide)/hexane solution was added. Subsequently, 50 g of THF (tetrahydrofuran) solution dissolving 5.12 g of 1-methyl hexanol was dropped into the flask. The content of the flask was stirred at −20° C. for 30 minutes, and then 80 g of THF solution dissolving 8.00 g of carboxylic acid anhydride of the following formula was dropped into the flask. After dropping, while the temperature of the content of the flask was increased to room temperature, the content was stirred for four hours. After stirring, 60 g of water was added so as to stop the reaction. The water phase was collected by a separation operation, and the collected water phase was washed with 60 g of t-butyl methyl ether three times. To the washed water phase, 10% hydrochloric acid aqueous solution was added until pH became 1, followed by extracting with 60 g of methylene chloride three times. The methylene chloride phase was washed in water, and then a methylene chloride phase solvent was removed by evaporation. The obtained crude product was reprecipitated with methylene chloride and heptane to obtain 9.32 g of ester compound.

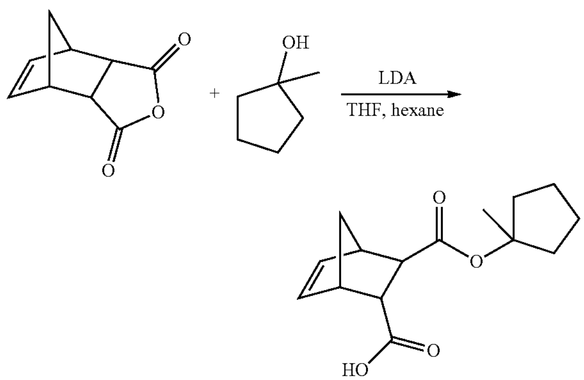

Into a flask, 9.00 g of the ester compound obtained by the above-mentioned reaction, 90.0 g of ethyl acetate (AcOEt), 27.0 g of acetone, and 99.6 g of 8% by mass sodium hydrogen carbonate aqueous solution were added, and the content of the flask was stirred under nitrogen atmosphere. Subsequently, 72 g of aqueous solution dissolving 14.6 g of oxone was added into the flask, and the content of the flask was stirred at room temperature for 1.5 hours. Then, 5.97 g of sodium sulfite was added to stop the reaction. After extraction with 60 g of ethyl acetate was carried out twice, the obtained organic phase was washed in water, and subsequently, a solvent was removed by evaporation from the organic phase to obtain 10.00 g of alcohol compound shown in the following formula.

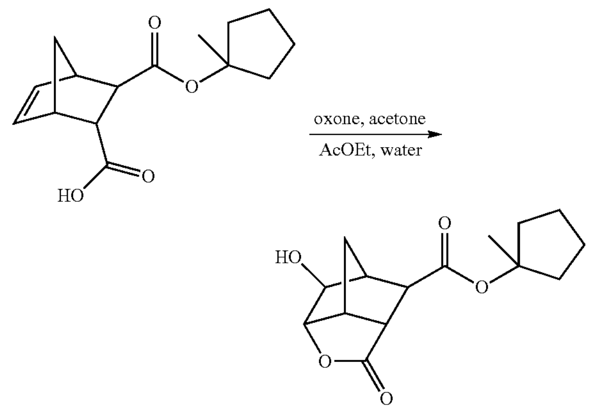

Into the flask, 1.01 g of dithioglycolic acid, 4.00 g of alcohol compound obtained by the above-mentioned reaction, and 40.0 g of dichloromethane were added, and the content of the flask was stirred under nitrogen atmosphere. Subsequently, 0.135 g of N,N-dimethyl-4-aminopyridine (DMAP), and 2.657 g of carbodiimide compound (WSC) were added into the flask, and the content of the flask was stirred at room temperature for four hours. Then, the organic phase was washed with 40 g of 1% hydrochloric acid aqueous solution, followed by washing the organic phase in water. Then, the solvent was removed by evaporation from the organic phase to obtain 4.38 g of disulfide compound shown in the reaction formula.

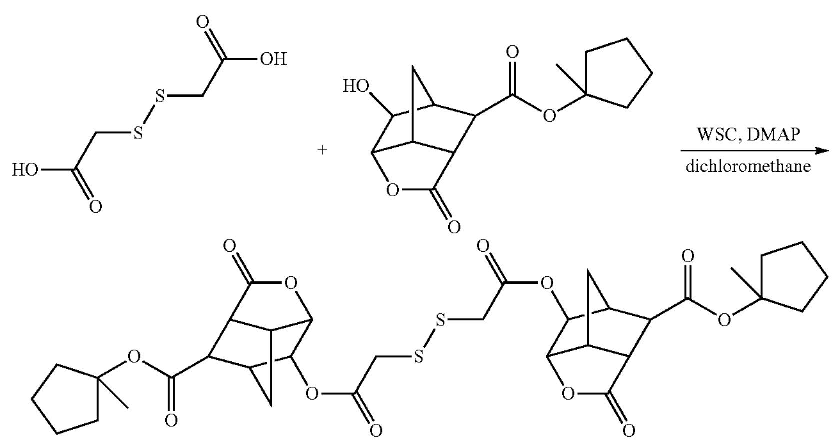

Into the flask, 4.38 g of the disulfide compound obtained in the above-mentioned reaction, and 43.1 g of tetrahydrofuran (THF) were added. The content of the flask was stirred under nitrogen atmosphere. Subsequently, 0.831 g of tris(2-carboxyethyl)phosphine hydrochloride (TCEP-HCl) was added into the flask, and the content of the flask was stirred at room temperature for 15 hours. Then, 20 g of ethyl acetate was added, and the organic phase was washed in water to obtain 3.86 g of mercapto compound C4-p1.

$^1$H-NMR ($CDCl_3$, 400 MHz) δ5.28 (s, 1H), 4.65 (d, 1H), 3.32 (t, 1H), 3.25 (d, 2H), 2.99 (dd, 1H), 2.80 (m, 2H) 2.20 (m, 2H), 2.00 (d, 1H), 1.76-1.50 (m, 8H), 1.57 (s, 3H)

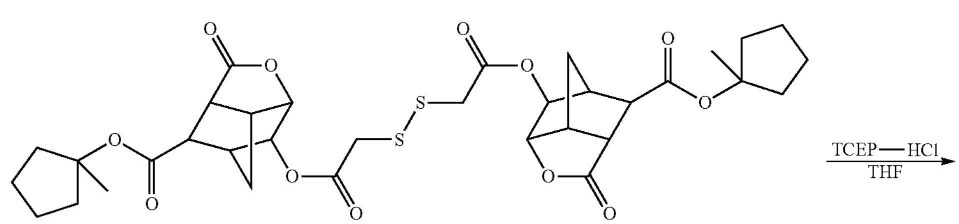

-continued

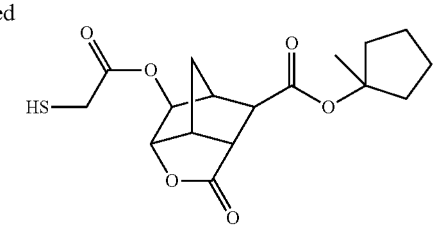

Preparation Example 14

(Synthesis of Mercapto Compound C4-p2)

In Preparation Example 14, a mercapto compound C4-p2 having the following structure was synthesized.

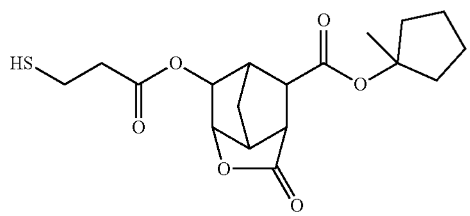 [SMILES: CC1(OC(=O)C2C3CC4C(OC(=O)C42)C3OC(=O)CCS)CCCC1]

A mercapto compound C4-p2 in the amount of 3.98 g was obtained in the same manner as in Preparation Example 3 except that 1.01 g of dithioglycolic acid was changed to 1.17 g of 3,3'-dithiopropionic acid.

$^1$H-NMR (DMSO-d6, 400 MHz) δ5.19 (s, 1H), 4.60 (d, 1H), 3.20 (t, 1H), 3.12 (dd, 1H), 2.81 (dd, 1H), 2.71-2.61 (m, 5H), 2.47 (t, 1H), 2.20-2.00 (m, 2H), 1.88 (d, 1H), 1.75-1.50 (m, 7H), 1.50 (s, 3H)

Preparation Example 15

(Synthesis of Mercapto Compound C4-p3)

In Preparation Example 12, a mercapto compound C4-p3 having the following structure was synthesized.

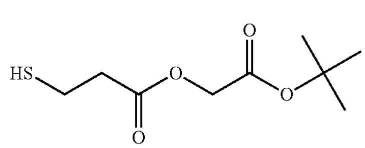

Into a flask, 2.00 g of 3,3'-dithiopropionic acid, 20.0 g of tetrahydrofuran, and 2.67 g of triethylamine (TEA) were added, and the content of the flask was stirred under nitrogen atmosphere. Subsequently, 3.61 g of chloroacetic acid tert-butyl ester was added into the flask, and the content of the flask was stirred at room temperature for 16 hours. Then, 40.0 g of ethyl acetate was added thereto, and the organic phase was washed with 40 g of 1% hydrochloric acid. Following thereto, the organic phase was washed in water and a solvent was removed by evaporation to obtain 3.88 g of disulfide compound shown in the following reaction formula.

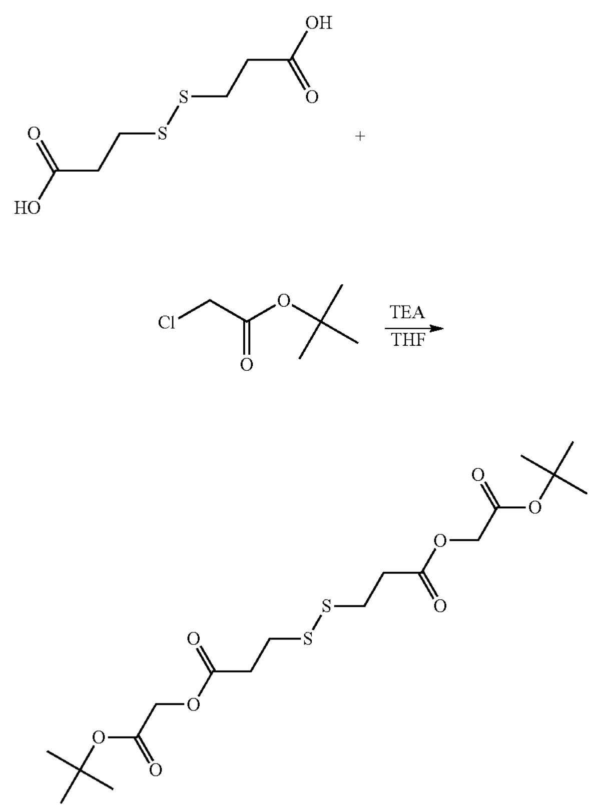

Into the flask, 3.88 g of the disulfide compound obtained in the above-mentioned reaction, and 38.8 g of dichloromethane were added. The content of the flask was stirred under nitrogen atmosphere. Subsequently, 0.895 g of triethylamine and 2.73 g of dithiothreitol were added into the flask, followed by stirring at room temperature for 5 hours. Then, washing with 38.0 g of 1% by mass hydrochloric acid aqueous solution was carried out, and then washing with 38.0 g of pure water was carried out five times. The washed reaction solution was concentrated to obtain 3.21 g of mercapto compound C4-p3.

$^1$H-NMR ($CDCl_3$, 600 MHz) δ4.60 (s, 1H), 2.86 (m, 2H), 2.75 (t, 2H), 1.75 (t, 1H)

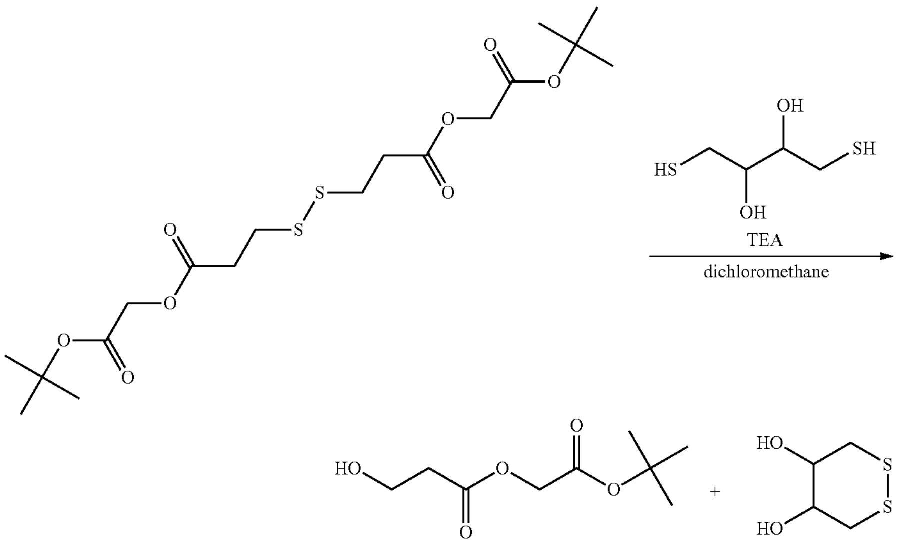

Preparation Example 15

(Synthesis of Mercapto Compound C4-p4)

In Preparation Example 15, a mercapto compound C4-p4 having the following structure was synthesized.

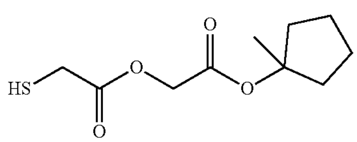

Into a flask, 10.14 g of chloroacetic acid chloride, 6.00 g of 1-methyl cyclopentanol, and 60.0 g of tetrahydrofuran (THF) were added. The content of the flask was stirred under nitrogen atmosphere. Subsequently, 9.72 g of triethylamine (TEA) was added into the flask, followed by stirring at 5° C. for eight hours. Then, the reaction solution was diluted with 120 g of ethyl acetate, washed with 120.0 g of 1% by mass hydrochloric acid aqueous solution, and then washed with 120.0 g of pure water five times. The washed reaction solution was concentrated to obtain 6.42 g of ester compound in the following reaction formula.

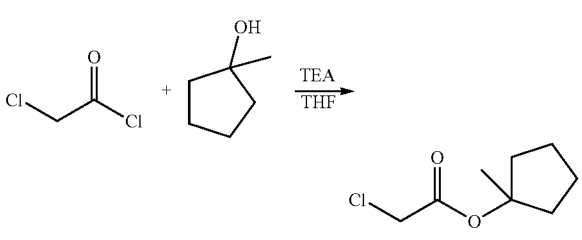

A mercapto compound C4-p4 in the amount of 3.71 g was obtained in the same manner as in Preparation Example 3 except that 3.61 g of chloroacetic acid tert-butyl ester was changed to 4.59 g of the ester compound shown in the above reaction formula.

$^1$H-NMR ($CDCl_3$, 600 MHz) δ4.60 (s, 1H), 2.86 (m, 2H), 2.75 (t, 2H), 2.20-2.00 (m, 2H), 1.75-1.49 (m, 7H), 1.51 (s, 3H)

Examples 1 to 60, and Comparative Examples 1 to 6

In the Examples and Comparative Examples, the following compounds were used as the acid generator (A).

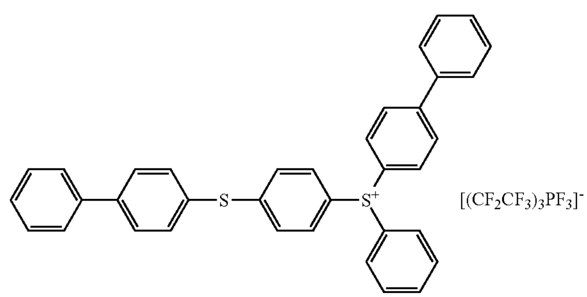 [SMILES: c1ccc(-c2ccc(Sc3ccc([S+](c4ccccc4)c4ccc(-c5ccccc5)cc4)cc3)cc2)cc1]

In the Examples and Comparative Examples, following resins B1 and B2 were used as the resin the solubility of which in alkali increases under the action of acid (resin (B)). The number at the lower right of the parentheses in each constituent unit in the following structural formula represents the content (% by mass) of the constituent unit in each resin.

Resin B1

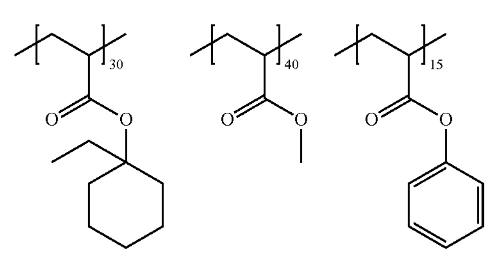

-continued

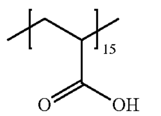

Resin B2

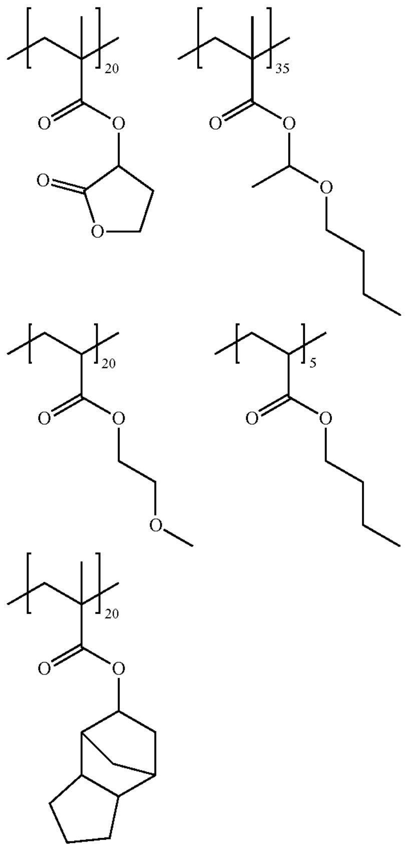

As the mercapto compound (C), the above-mentioned mercapto compounds C1-p1 to C1-p9, C3-p1, C4-p1, or C4-p1 to C4-p4 were used. In Comparative Examples, 3-mercapto propionic acid was used as the mercapto compound C-p10, and 3-mercapto ethyl propionate ester was used as mercapto compound C-p11.

As the alkali-soluble resin (D), the following resins D1 and D2 were used.

D1: polyhydroxystyrene resin (copolymer of p-hydroxystyrene:styrene=85:15 (mass ratio), mass average molecular weight (Mw): 2500, dispersivity (Mw/Mn): 2.4)

D2: novolak resin (m-cresol single condensation product (mass average molecular weight (Mw) 8000)

The resin (B), the mercapto compound (C), and the alkali soluble resin (D) in types and amounts described in Tables 1 to 5, as well as 2.0 parts by mass of acid generator (A), and 0.02 parts by mass of tripentyl amine were dissolved in methoxy butyl acetate such that the solid content concentration became 53% by mass to obtain photosensitive resin compositions of Examples and Comparative Examples. Note here that the use amount of the mercapto compound (C) described in Tables 1 to 5 is 0.02 parts by mass, 0.05 parts by mass, or 0.10 parts by mass.

The footing was evaluated according to the following method using resultant photosensitive resin composition. These evaluation results are shown in Tables 1 to 5.

[Evaluation of Footing]

The photosensitive resin compositions from Examples and Comparative Examples were each applied on a copper substrate with a diameter of 8 inches to form a photosensitive resin layer having a thickness of 55 μm. Then, the photosensitive resin layers were pre-baked for 5 minutes at 100° C. After the pre-baking, using a mask having a square pattern with a diameter of 30 μm and an exposure device Prisma GHI (Ultratech Inc.), pattern exposure was performed with the ghi line at an exposure level greater by 1.2 times than the minimum exposure level capable of forming a pattern having a predetermined size. Subsequently, the substrate was mounted on a hot plate to perform post-exposure baking (PEB) at 140° C. for three minutes. Then, a 2.38% by weight aqueous solution of tetramethylammonium hydroxide (a developing solution, NMD-3, Tokyo Ohka Kogyo Co., Ltd.) was added dropwise to the exposed photosensitive resin layer, and allowed to stand for 60 seconds at 23° C. This operation was repeated the total of 4 times. Subsequently, the surface of the resist pattern was washed with running water, and blown with nitrogen to obtain a resist pattern. The cross-sectional shape of this resist pattern was observed under a scanning electron microscope to measure the amount of footing. Specifically, the amount of footing was measured as follows. FIG. 1 shows schematically illustrated cross-sections of a resist portion and a nonresist portion when measuring the amount of footing. In FIG. 1, a resist pattern having a resist portion 12 and a nonresist portion 13 (hole) is formed on a substrate 11. Firstly, an inflexion point 15 at which footing on a side wall 14 starts was determined on the side wall 14 which is the interface between the resist portion 12 and the nonresist portion 13. A perpendicular line 16 was drawn down from the inflexion point 15 toward the surface of the substrate 11, and the intersection of the perpendicular line 16 and the surface of the substrate 11 was taken as a starting point of footing 17. Further, the intersection of the curve of the side wall 14 and the surface of the substrate 11 was taken as an endpoint of footing 18. A width Wf between the starting point of footing 17 and the endpoint of footing 18 defined in this way was taken as the amount of footing. The amount of footing is a value measured for any one of the side walls 14 at any one of the nonresist portions in the resist pattern. The degree of footing was evaluated in accordance with the following criteria based on the obtained value for the amount of footing.

<Criteria for Footing Evaluation>○: 0 μm or more and 1.5 μm or less

Δ: more than 1.5 μm and 2.5 μm or less

X: more than 2.5 μm

TABLE 1

| | Resin (B) type/amount (parts by mass) | alkali-soluble resin (D) type/amount (parts by mass) | Mercapto compound (C) type/amount (parts by mass) | Footing |
|---|---|---|---|---|
| Example 1 | B1/20 | D1/20 | C1-p1/0.05 | ○ |
| Example 2 | | D2/40 | C1-p1/0.10 | ○ |
| Example 3 | | | C1-p2/0.02 | Δ |
| Example 4 | | | C1-p2/0.05 | ○ |
| Example 5 | | | C1-p2/0.10 | ○ |
| Example 6 | | | C1-p3/0.05 | ○ |
| Example 7 | | | C1-p3/0.10 | ○ |
| Example 8 | | | C1-p4/0.02 | Δ |
| Example 9 | | | C1-p4/0.05 | ○ |
| Example 10 | | | C1-p4/0.10 | ○ |
| Example 11 | | | C1-p5/0.05 | ○ |

TABLE 1-continued

| | Resin (B) type/amount (parts by mass) | alkali-soluble resin (D) type/amount (parts by mass) | Mercapto compound (C) type/amount (parts by mass) | Footing |
|---|---|---|---|---|
| Example 12 | | | C1-p5/0.10 | ○ |
| Example 13 | | | C1-p6/0.05 | ○ |
| Example 14 | | | C1-p6/0.10 | ○ |
| Example 15 | | | C1-p7/0.05 | ○ |
| Example 16 | | | C1-p7/0.10 | ○ |
| Example 17 | | | C1-p8/0.05 | ○ |
| Example 18 | | | C1-p8/0.10 | ○ |
| Example 19 | | | C1-p9/0.05 | ○ |
| Example 20 | | | C1-p9/0.10 | ○ |

TABLE 2

| | Resin (B) type/amount (parts by mass) | alkali-soluble resin (D) type/amount (parts by mass) | Mercapto compound (C) type/amount (parts by mass) | Footing |
|---|---|---|---|---|
| Example 21 | B2/100 | — | C1-p1/0.05 | ○ |
| Example 22 | | | C1-p1/0.10 | ○ |
| Example 23 | | | C1-p2/0.02 | Δ |
| Example 24 | | | C1-p2/0.05 | ○ |
| Example 25 | | | C1-p2/0.10 | ○ |
| Example 26 | | | C1-p3/0.05 | ○ |
| Example 27 | | | C1-p3/0.10 | ○ |
| Example 28 | | | C1-p4/0.02 | Δ |
| Example 29 | | | C1-p4/0.05 | ○ |
| Example 30 | | | C1-p4/0.10 | ○ |
| Example 31 | | | C1-p5/0.05 | ○ |
| Example 32 | | | C1-p5/0.10 | ○ |
| Example 33 | | | C1-p6/0.05 | ○ |
| Example 34 | | | C1-p6/0.10 | ○ |
| Example 35 | | | C1-p7/0.05 | ○ |
| Example 36 | | | C1-p7/0.10 | ○ |
| Example 37 | | | C1-p8/0.05 | ○ |
| Example 38 | | | C1-p8/0.10 | ○ |
| Example 39 | | | C1-p9/0.05 | ○ |
| Example 40 | | | C1-p9/0.10 | ○ |

TABLE 3

| | Resin (B) type/amount (parts by mass) | alkali-soluble resin (D) type/amount (parts by mass) | Mercapto compound (C) type/amount (parts by mass) | Footing |
|---|---|---|---|---|
| Example 41 | B1/20 | D1/20 | C2-p1/0.05 | ○ |
| Example 42 | | D2/40 | C2-p1/0.10 | ○ |
| Example 43 | | | C3-p1/0.05 | ○ |
| Example 44 | | | C3-p1/0.10 | ○ |
| Example 45 | B2/100 | — | C2-p1/0.05 | ○ |
| Example 46 | | | C2-p1/0.10 | ○ |
| Example 47 | | | C3-p1/0.05 | ○ |
| Example 48 | | | C3-p1/0.10 | ○ |

TABLE 4

| | Resin (B) type/amount (parts by mass) | alkali-soluble resin (D) type/amount (parts by mass) | Mercapto compound (C) type/amount (parts by mass) | Footing |
|---|---|---|---|---|
| Example 49 | B1/20 | D1/20 | C4-p1/0.05 | ○ |
| Example 50 | | D2/40 | C4-p1/0.10 | ○ |
| Example 51 | | | C4-p2/0.05 | ○ |
| Example 52 | | | C4-p2/0.10 | ○ |
| Example 53 | | | C4-p3/0.05 | ○ |
| Example 54 | | | C4-p3/0.10 | ○ |
| Example 55 | | | C4-p4/0.05 | ○ |

TABLE 4-continued

| | Resin (B) type/amount (parts by mass) | alkali-soluble resin (D) type/amount (parts by mass) | Mercapto compound (C) type/amount (parts by mass) | Footing |
|---|---|---|---|---|
| Example 56 | | | C4-p4/0.10 | ○ |
| Example 57 | B2/100 | — | C4-p1/0.05 | ○ |
| Example 58 | | | C4-p1/0.10 | ○ |
| Example 59 | | | C4-p3/0.05 | ○ |
| Example 60 | | | C4-p3/0.10 | ○ |

TABLE 5

| | Resin (B) type/amount (parts by mass) | alkali-soluble resin (D) type/amount (parts by mass) | Mercapto compound (C) type/amount (parts by mass) | Footing |
|---|---|---|---|---|
| Comparative Example 1 | B1/20 | D1/20 D2/40 | — | X |
| Comparative Example 2 | | | C-p10/0.05 | X |
| Comparative Example 3 | | | C-p11/0.05 | X |
| Comparative Example 4 | B2/100 | — | — | X |
| Comparative Example 5 | | | C-p10/0.05 | X |
| Comparative Example 6 | | | C-p11/0.05 | X |

Examples 1 to 60 show that when the resist pattern is formed with a positive-type photosensitive resin composition including the acid generator (A) which generates acid upon exposure to an irradiated active ray or radiation and the resin (B) the solubility of which in alkali increases under the action of acid as well as the mercapto compound (C) represented by the aforementioned formulae (C1), (C2), (C3), or (C4), the occurrence of footing in a resist pattern can be suppressed.

On the other hand, according to Comparative Examples 1 to 6, it is shown that when a positive-type photosensitive resin composition does not include a mercapto compound having the structure represented by Formula (C1), (C2), (C3), or (C4), or when a positive-type photosensitive resin composition includes the mercapto compound (C) having a structure other than the structure represented by Formula (C1), (C2), (C3), or (C4), it is difficult to achieve suppression of the occurrence of footing.

EXPLANATION OF REFERENCE NUMERALS

11 Substrate
12 Resist portion
13 Nonresist portion
14 Side wall
15 Inflexion point
16 Perpendicular line
17 Starting point of footing
18 Endpoint of footing

What is claimed is:

1. A chemically amplified positive-type photosensitive resin composition comprising an acid generator (A) which generates acid upon exposure to an irradiated active ray or radiation, a resin (B) the solubility of which in alkali increases under the action of acid, and a mercapto compound (C) represented by the following formula (C):

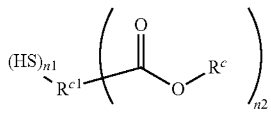
(C)

wherein in the formula (C), n1 is an integer of 1 to 4, n2 is an integer of 1 to 4, $R^{c1}$ is an organic group having a valence of (n1+n2) and the $R^{c1}$ is bonded to a carbonyl group by a C—C bond, and bonded to a mercapto group by a C—S bond, and $R^{c}$ is a monovalent organic group bonded to an oxygen atom by a C—O bond, and having any one of structures represented by the following formulae (c1) to (c4):

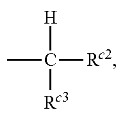
(c1)

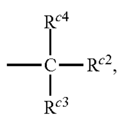
(c2)

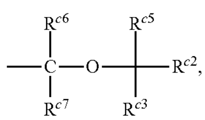
(c3)

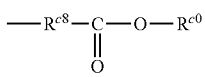
(c4)

in the group represented by the above-mentioned formula (c1), $R^{c2}$ and $R^{c3}$ are each independently a hydrogen atom or a monovalent organic group, with a proviso that at least one of $R^{c2}$ and $R^{c3}$ is a monovalent organic group having an aliphatic ring CL including a divalent group represented by —CO—O— in the ring structure, or a monovalent organic group having an aliphatic ring CS including a divalent group represented by —$SO_2$— in the ring structure, or a monovalent organic group having an aliphatic ring CP including a trivalent group represented by the following formula in the ring structure:

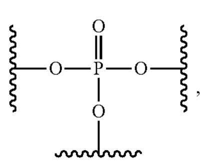

or $R^{c2}$ and $R^{c3}$ are bonded to each other to form an aliphatic ring CL, an aliphatic ring CS, or an aliphatic ring CP;

in the group represented by the above formula (c2), $R^{c2}$ and $R^{c3}$ are each independently a hydrogen atom or a monovalent organic group, $R^{c4}$ is a hydrocarbon group, a carbon atom to which $R^{c2}$, $R^{c3}$ and $R^{c4}$ are bonded is a tertiary carbon atom, and $R^{c3}$ and $R^{c4}$ may be bonded to each other to form a ring, with a proviso that at least one of $R^{c2}$ and $R^{c3}$ is a monovalent organic group having an aliphatic ring CA including one or more divalent groups selected from a group consisting of an ether bond, a sulfide bond, and a carbonyl group in the ring structure, a monovalent organic group having an aliphatic ring CH substituted with a hydroxyl group or a hydroxyl group-containing group, a monovalent organic group having an aliphatic ring CL mentioned above as to the formula (c1), a monovalent organic group having an aliphatic ring CS mentioned above as to the formula (c1), or a monovalent organic group having an aliphatic ring CP mentioned above as to the formula (c1), or $R^{c2}$ and $R^{c3}$ are bonded to each other to form an aliphatic ring CA, an aliphatic ring CH, an aliphatic ring CL, an aliphatic ring CS, or an aliphatic ring CP;

in the group represented by the above formula (c3), $R^{c2}$ and $R^{c3}$ are the same as $R^{c2}$ and $R^{c3}$ in the above formula (c2), $R^{c5}$, $R^{c6}$, and $R^{c7}$ are each independently a hydrogen atom, or an alkyl group, and $R^{c5}$ and $R^{c6}$ may be bonded to each other to form a ring, with a proviso that at least one of $R^{c2}$ and $R^{c3}$ is a monovalent organic group having an aliphatic ring CA, a monovalent organic group having an aliphatic ring CH, a monovalent organic group having an aliphatic ring CL, a monovalent organic group having an aliphatic ring CS, or a monovalent organic group having an aliphatic ring CP, or $R^{c2}$ and $R^{c3}$ are bonded to each other to form an aliphatic ring CA, an aliphatic ring CH, an aliphatic ring CL, an aliphatic ring CS, or an aliphatic ring CP;

in the group represented by the above formula (c4), $R^{c8}$ is a divalent organic group, and $R^{c8}$ is bonded to a carbonyl group by a C—C bond, and is bonded to an oxygen atom by a C—O bond, and $R^{c0}$ is an acid dissociable group.

2. The chemically amplified positive-type photosensitive resin composition according to claim 1, wherein the mercapto compound (C) is a compound represented by the following formula (C1):

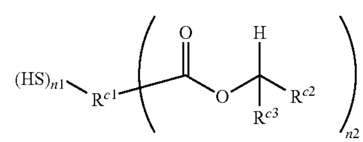
(C1)

in the formula (C1), $R^{c1}$ is an organic group having a valence of (n1+n2), and the $R^{c1}$ is bonded to a carbonyl group by a C—C bond, and bonded to a mercapto group by a C—S bond, $R^{c2}$ and $R^{c3}$ are each independently a hydrogen atom or a monovalent organic group, n1 is an integer of 1 to 4, and n2 is an integer of 1 to 4, with a proviso that at least one of $R^{c2}$ and $R^{c3}$ is a monovalent organic group having an aliphatic ring CL including a divalent group represented by —CO—O— in a ring structure, a monovalent organic group having an aliphatic ring CS including a divalent group represented by —$SO_2$— in a ring structure, or a monovalent organic group having an aliphatic ring CP including a trivalent group represented by the following formula in the ring structure:

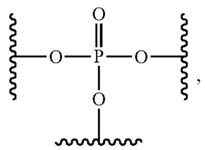 [SMILES: *OP(=O)(O*)O*]

or $R^{c2}$ and $R^{c3}$ are bonded to each other to form an aliphatic ring CL, an aliphatic ring CS, or an aliphatic ring CP.

3. The chemically amplified positive-type photosensitive resin composition according to claim 1, wherein the mercapto compound (C) is a compound represented by the following formula (C2):

(C2)

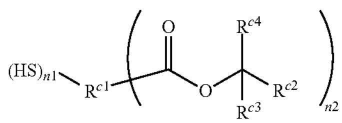

in the formula (C2), $R^{c1}$ is an organic group having a valence of (n1+n2), and the $R^{c1}$ is bonded to a carbonyl group by a C—C bond, and bonded to a mercapto group by a C—S bond, n1 is an integer of 1 to 4, and n2 is an integer of 1 to 4, $R^{c2}$ and $R^{c3}$ are each independently a hydrogen atom or a monovalent organic group, $R^{c4}$ is a hydrocarbon group, a carbon atom to which $R^{c2}$, $R^{c3}$ and $R^{c4}$ are bonded is a tertiary carbon atom, and $R^{c3}$ and $R^{c4}$ may be bonded to each other to form a ring, with a proviso that at least one of $R^{c2}$ and $R^{c3}$ is a monovalent organic group having an aliphatic ring CA including one or more divalent groups selected from an ether bond, a sulfide bond, and a carbonyl group in a ring structure, a monovalent organic group having an aliphatic ring CH substituted with a hydroxyl group or a hydroxyl group-containing group, a monovalent organic group having an aliphatic ring CL including a divalent group represented by —CO—O— in a ring structure, a monovalent organic group having an aliphatic ring CS including a divalent group represented by $—SO_2—$ in a ring structure, or a monovalent organic group having an aliphatic ring CP including a trivalent group represented by the following formula in a ring structure:

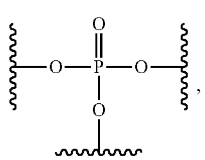

or $R^{c2}$ and $R^{c3}$ are bonded to each other to form an aliphatic ring CA, an aliphatic ring CH, an aliphatic ring CL, an aliphatic ring CS, or an aliphatic ring CP;

or a mercapto compound (C) represented by the following formula (C3):

(C3)

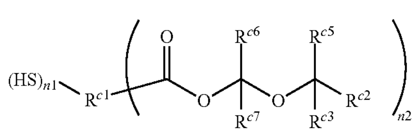

in the formula (C3), $R^{c1}$, $R^{c2}$, $R^{c3}$, n1, and n2 are the same as those in the formula (C2), $R^{c5}$, $R^{c6}$, and $R^{c7}$ are each independently a hydrogen atom, or an alkyl group, $R^{c5}$ and $R^{c6}$ may be bonded to each other to form a ring, with a proviso that at least one of $R^{c2}$ and $R^{c3}$ is a monovalent organic group having an aliphatic ring CA, a monovalent organic group having an aliphatic ring CH, a monovalent organic group having an aliphatic ring CL, a monovalent organic group having an aliphatic ring CS, or a monovalent organic group having an aliphatic ring CP, or $R^{c2}$ and $R^{c3}$ are bonded to each other to form an aliphatic ring CA, an aliphatic ring CH, an aliphatic ring CL, an aliphatic ring CS, or an aliphatic ring CP.

4. The chemically amplified positive-type photosensitive resin composition according to claim 1, wherein the mercapto compound (C) is a compound represented by the following formula (C4):

(C4)

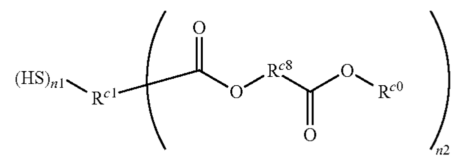

in the formula (C4), $R^{c1}$ is an organic group having a valence of (n1+n2), and the $R^{c1}$ is bonded to a carbonyl group by a C—C bond, and bonded to a mercapto group by a C—S bond, n1 is an integer of 1 to 4, and n2 is an integer of 1 to 4, $R^{c8}$ is a divalent organic group, $R^{c8}$ is bonded to a carbonyl group by a C—C bond, and bonded to an oxygen atom by a C—O bond, and $R^{c0}$ is an acid dissociable group.

5. The chemically amplified positive-type photosensitive resin composition according to claim 4, wherein $R^{c8}$ in the formula (C4) is a divalent organic group LG having a cyclic group including a divalent group represented by —CO—O— in the ring structure, a divalent organic group SG having a cyclic group including a divalent group represented by $—SO_2—$ in the ring structure, or an alkylene group.

6. The chemically amplified positive-type photosensitive resin composition according to claim 1, further comprising an alkali-soluble resin (D).

7. The chemically amplified positive-type photosensitive resin composition according to claim 6, wherein the alkali-soluble resin (D) comprises a resin selected from the group consisting of novolak resin (D1), polyhydroxystyrene resin (D2), and acrylic resin (D3).

8. A photosensitive dry film comprising a substrate film, and a photosensitive resin layer formed on a surface of the substrate film, the photosensitive resin layer comprising the chemically amplified positive-type photosensitive resin composition according to claim 1.

9. A method of manufacturing a photosensitive dry film comprising applying the chemically amplified positive-type photosensitive resin composition according to claim 1 on a substrate film to form a photosensitive resin layer.

10. A method of manufacturing a patterned resist film comprising: layering a photosensitive resin layer on a substrate having a metal surface, the layer comprising the chemically amplified positive-type photosensitive resin composition according to claim 1;

exposing the photosensitive resin layer through irradiation with an active ray or radiation in a position-selective manner; and developing the exposed photosensitive resin layer.

11. A method of manufacturing a substrate with a template comprising: layering a photosensitive resin layer on a substrate having a metal surface, the layer comprising the chemically amplified positive-type photosensitive resin composition according to claim 1;

exposing the photosensitive resin layer through irradiation with an active ray or radiation in a position-selective manner; and developing the exposed photosensitive layer to prepare a template for plated article formation.

12. A method of manufacturing a plated article comprising plating the substrate with the template manufactured by the method according to claim 11 to form the plated article in the template.

* * * * *